US012628331B2

(12) United States Patent
Choi et al.

(10) Patent No.: US 12,628,331 B2
(45) Date of Patent: May 12, 2026

(54) SEMICONDUCTOR MEMORY DEVICE HAVING STACKED WORD LINES INCLUDING SUB-GATE ELECTRODES

(71) Applicant: Samsung Electronics Co., Ltd.,
Suwon-si (KR)

(72) Inventors: Hyungeun Choi, Suwon-si (KR);
Kiseok Lee, Suwon-si (KR); Haejoon Lee, Suwon-si (KR); Seungjae Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 479 days.

(21) Appl. No.: 18/094,719

(22) Filed: Jan. 9, 2023

(65) Prior Publication Data

US 2023/0309289 A1    Sep. 28, 2023

(30) Foreign Application Priority Data

Mar. 28, 2022    (KR) ........................ 10-2022-0038356

(51) Int. Cl.
*H10B 12/00*    (2023.01)
*H10B 80/00*    (2023.01)
(52) U.S. Cl.
CPC ............. *H10B 12/30* (2023.02); *H10B 12/03* (2023.02); *H10B 12/05* (2023.02); *H10B 12/50* (2023.02); *H10B 80/00* (2023.02)
(58) Field of Classification Search
CPC ........ H10B 12/30; H10B 12/03; H10B 12/05; H10B 12/50; H10B 80/00; H10B 12/488; H10D 30/6735; G11C 7/18; G11C 8/14

USPC ......................................................... 257/296
See application file for complete search history.

(56) References Cited

U.S. PATENT DOCUMENTS

| | | | |
|---|---|---|---|
| 10,607,995 B2 | 3/2020 | Roberts et al. | |
| 10,825,815 B2 | 11/2020 | Tang et al. | |
| 10,833,101 B2 | 11/2020 | Shimomura et al. | |
| 10,861,854 B2 | 12/2020 | Kim et al. | |
| 10,910,378 B2 | 2/2021 | Lee et al. | |
| 11,094,699 B1 | 8/2021 | Brewer et al. | |
| 11,437,464 B2 | 9/2022 | Chen et al. | |
| 2015/0206895 A1* | 7/2015 | Oh .......................... | H10B 43/20 257/324 |
| 2016/0086970 A1 | 3/2016 | Peng | |

(Continued)

FOREIGN PATENT DOCUMENTS

| | | |
|---|---|---|
| KR | 1020220026654 A | 3/2022 |
| KR | 1020220031321 A | 3/2022 |
| TW | 202103296 A | 1/2021 |

*Primary Examiner* — Duy T Nguyen
(74) *Attorney, Agent, or Firm* — Muir Patent Law, PLLC

(57) ABSTRACT

A semiconductor memory device may include a lower layer including a first region and a second region, the lower layer extending in a first direction and a second direction perpendicular to the first direction, and a stack including word lines and interlayer insulating patterns, which are alternatingly stacked in a third direction perpendicular to the first direction and the second direction, the stack having a staircase structure on the second region. The word lines may extend from the first region to the second region in the first direction. Each of the word lines may include sub-gate electrodes, which extend parallel to each other in the first region, and a word line pad, which is connected in common to the sub-gate electrodes in the second region.

19 Claims, 64 Drawing Sheets

(56)  References Cited

U.S. PATENT DOCUMENTS

| | | | |
|---|---|---|---|
| 2017/0062461 A1* | 3/2017 | Takamatsu | H10B 43/27 |
| 2017/0200731 A1* | 7/2017 | Yoshimoto | H10D 1/00 |
| 2020/0212041 A1 | 7/2020 | Machkaoutsan et al. | |
| 2020/0227418 A1 | 7/2020 | Kim et al. | |
| 2021/0057419 A1 | 2/2021 | Shin et al. | |
| 2021/0159229 A1 | 5/2021 | Gomes et al. | |
| 2021/0193738 A1 | 6/2021 | Barraud et al. | |
| 2021/0202488 A1 | 7/2021 | Choi | |
| 2021/0249415 A1 | 8/2021 | Kang et al. | |
| 2021/0358942 A1 | 11/2021 | Rajashekhar et al. | |
| 2022/0059564 A1 | 2/2022 | Xu et al. | |
| 2022/0068796 A1 | 3/2022 | Guo et al. | |
| 2022/0068859 A1* | 3/2022 | Choi | H10B 12/05 |
| 2022/0068933 A1 | 3/2022 | Smythe, III et al. | |

* cited by examiner

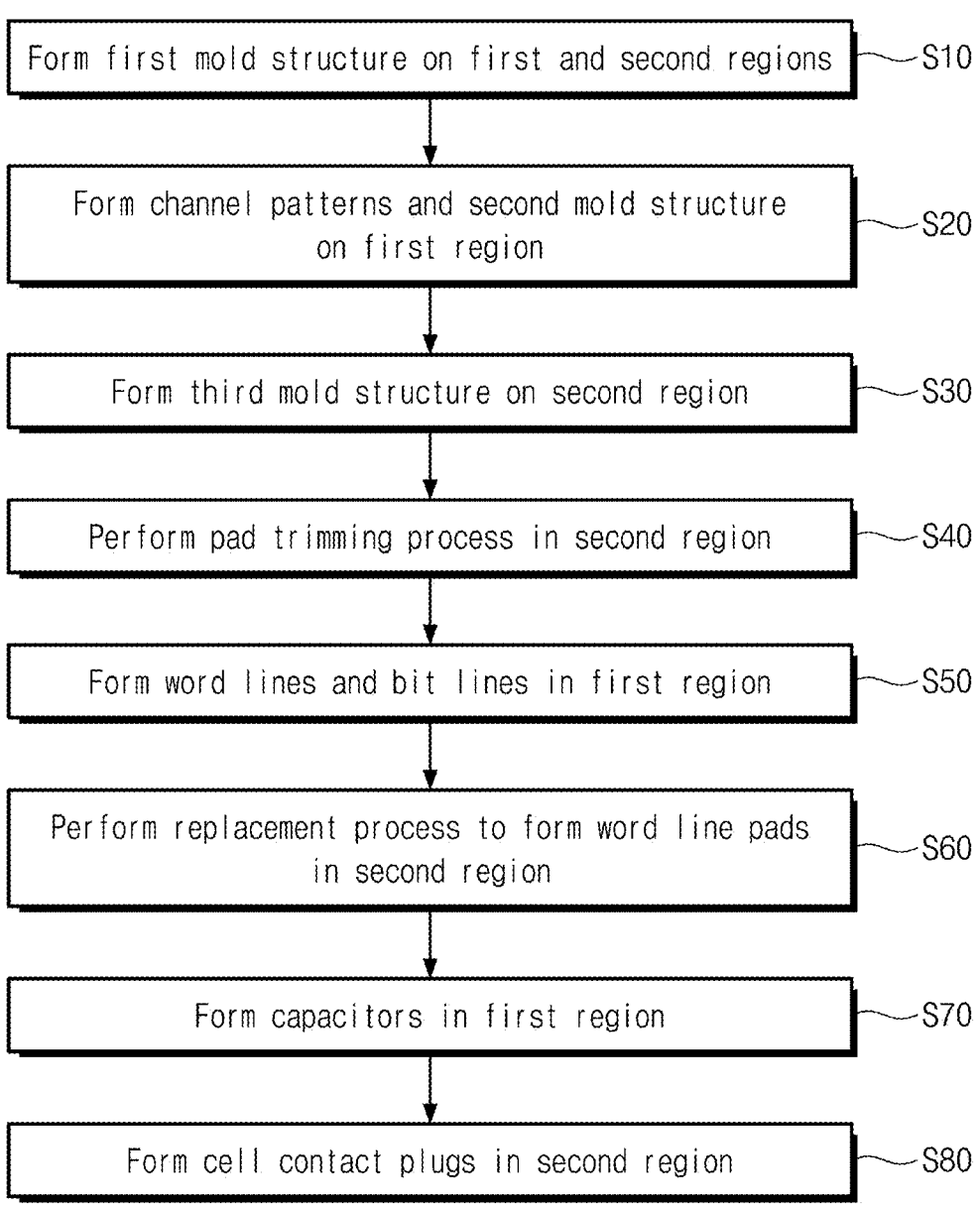

Form first mold structure on first and second regions ——S10

Form channel patterns and second mold structure on first region ——S20

Form third mold structure on second region ——S30

Perform pad trimming process in second region ——S40

Form word lines and bit lines in first region ——S50

Perform replacement process to form word line pads in second region ——S60

Form capacitors in first region ——S70

Form cell contact plugs in second region ——S80

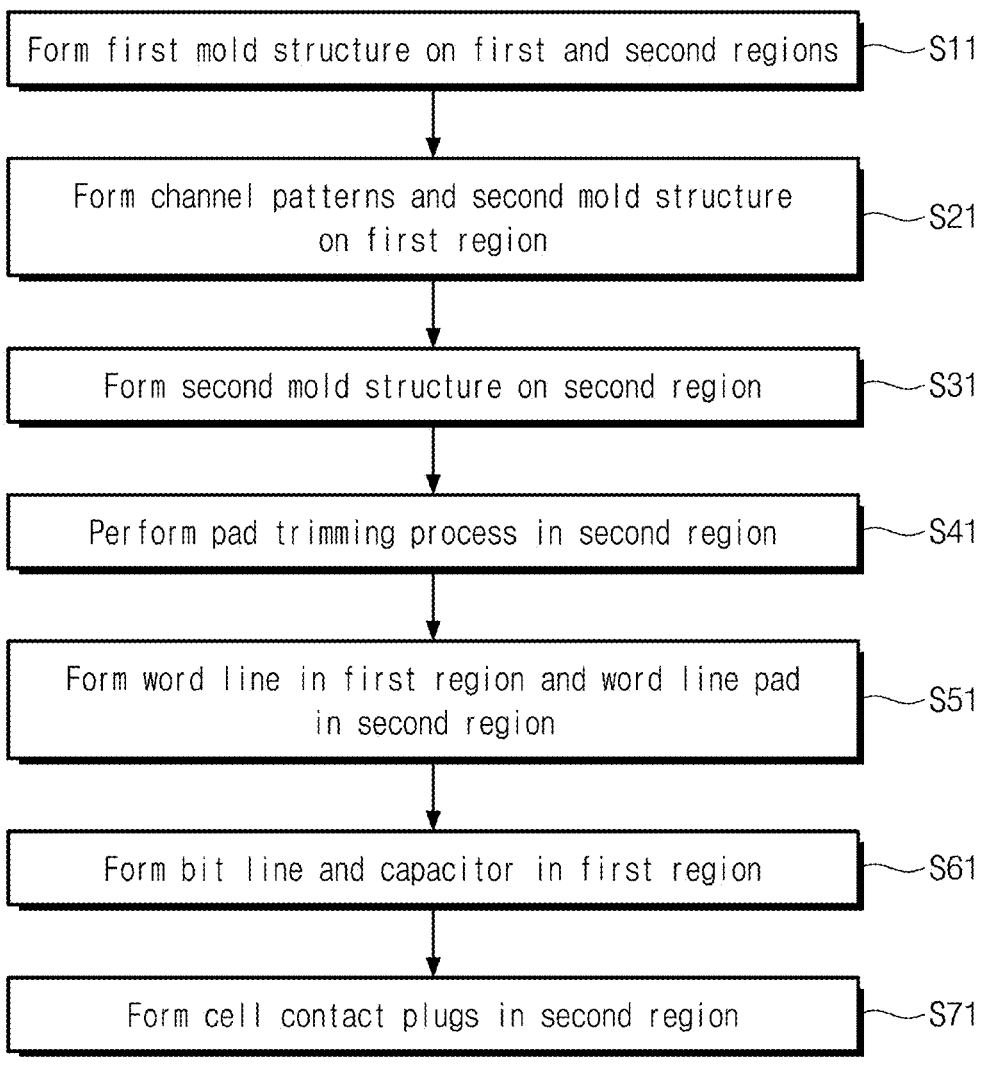

Form first mold structure on first and second regions ——S11

Form channel patterns and second mold structure
on first region ——S21

Form second mold structure on second region ——S31

Perform pad trimming process in second region ——S41

Form word line in first region and word line pad
in second region ——S51

Form bit line and capacitor in first region ——S61

Form cell contact plugs in second region ——S71

FIG. 24A
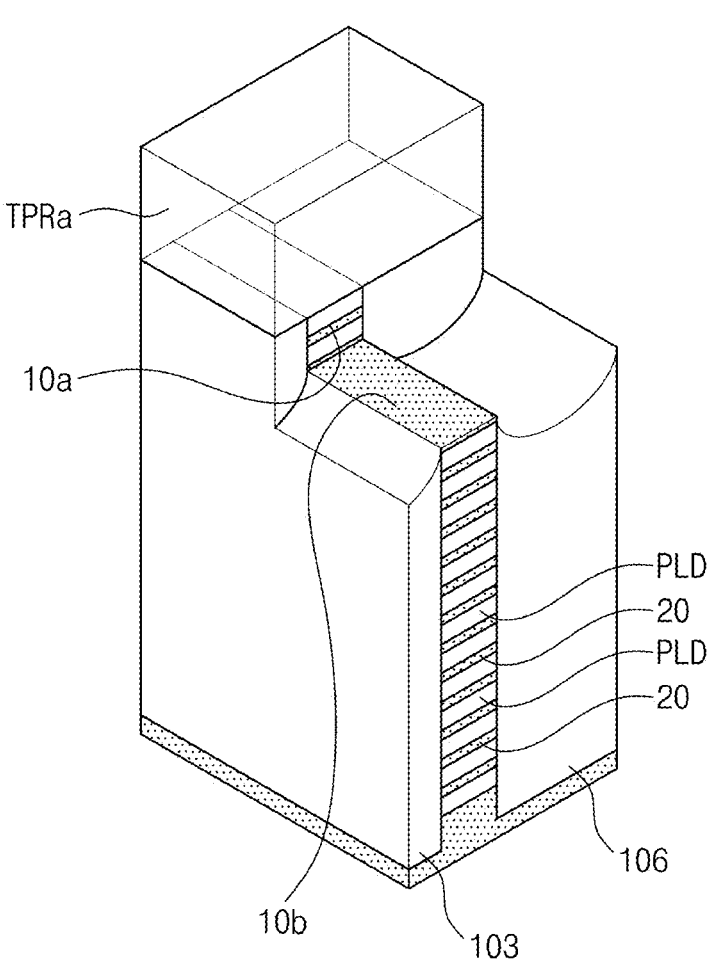
TPRa
10a
PLD
20
PLD
20
106
10b
103
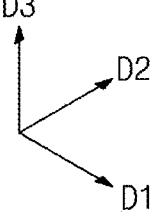
D3
D2
D1

SEMICONDUCTOR MEMORY DEVICE HAVING STACKED WORD LINES INCLUDING SUB-GATE ELECTRODES

CROSS-REFERENCE TO RELATED APPLICATIONS

This U.S. non-provisional patent application claims priority under 35 U.S.C. § 119 to Korean Patent Application No. 10-2022-0038356, filed on Mar. 28, 2022, in the Korean Intellectual Property Office, the entire contents of which are hereby incorporated by reference.

BACKGROUND

The present disclosure relates to a semiconductor device and a semiconductor memory device including the same, and in particular, to a three-dimensional semiconductor memory device with an improved reliability property and an increased integration density.

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

An embodiment of the inventive concept provides a semiconductor memory device with an improved reliability property and an increased integration density.

According to an embodiment of the inventive concept, a semiconductor memory device may include a lower layer including a first region and a second region, the lower layer extending in a first direction and a second direction perpendicular to the first direction, and a stack including word lines and interlayer insulating patterns, which are alternatingly stacked in a third direction perpendicular to the first direction and the second direction, the stack having a staircase structure on the second region. The word lines may extend from the first region to the second region in a first direction. Each of the word lines may include sub-gate electrodes, which extend parallel to each other in the first region, and a word line pad, which is connected in common to the sub-gate electrodes in the second region.

According to an embodiment of the inventive concept, a semiconductor memory device may include a lower layer including a first region and a second region, the lower layer extending in a first direction and a second direction perpendicular to the first direction, a stack including word lines and interlayer insulating patterns, which are alternatingly stacked in a third direction perpendicular to the first direction and the second direction, each of the word lines having a word line pad in the second region, and the stack having a staircase structure in the second region, channel patterns provided to cross the word lines and stacked in the third direction, a bit line extending along the third direction to cross the word lines, in the first region, the bit line connected to first end portions of the channel patterns, data storage elements provided in the first region and connected to second end portions of the channel patterns, and cell contact plugs provided in the second region and respectively coupled to the word line pads.

According to an embodiment of the inventive concept, a semiconductor memory device may include a cell array structure including a memory cell array and first bonding pads connected to the memory cell array, the memory cell array including memory cells, which are three-dimensionally arranged, and a peripheral circuit structure including peripheral circuits and second bonding pads, which are connected to the peripheral circuits and are bonded to the first bonding pads. The cell array structure may include a lower layer including a first region and a second region, the lower layer extending in a first direction and a second direction perpendicular to the first direction, a stack including word lines and interlayer insulating patterns, which are alternately stacked in a third direction perpendicular to the first direction and the second direction, each of the word lines having a word line pad in the second region, and the stack having a staircase structure in the second region, bit lines extending along the third direction to cross the word lines, and cell contact plugs provided on the second region and respectively coupled to the word line pads, the cell contact plugs connected to the first bonding pads.

According to an embodiment of the inventive concept, a method of fabricating a semiconductor memory device may include forming a first mold structure including first and second semiconductor layers, which are alternatingly stacked on a substrate including first and second regions, replacing the first mold structure in the first region with a second mold structure, the second mold structure including channel patterns formed from the first semiconductor layers, sacrificial patterns replaced from the second semiconductor layers, and interlayer insulating patterns, replacing the first mold structure in the second region with a third mold structure, the third mold structure including pad insulating patterns, which are replaced from the first semiconductor layers and the second semiconductor layers, performing a pad trimming process in the second region to form a staircase structure in the third mold structure, replacing the sacrificial patterns with word lines, in the first region, and replacing the first semiconductor layers of the third mold structure with word line pads, in the second region.

BRIEF DESCRIPTION OF THE DRAWINGS

FIG. 4 is a plan view illustrating a cell array structure of a semiconductor memory device according to an embodiment of the inventive concept.

FIG. 5B is a sectional view, which is taken along a line C-C' of FIG. 4 to illustrate a cell array structure of a semiconductor memory device according to an embodiment of the inventive concept.

FIG. 8 is a flowchart illustrating a method of fabricating a cell array structure of a semiconductor memory device, according to an embodiment of the inventive concept.

FIGS. 9A to 20A are plan views illustrating a method of fabricating a cell array structure of a semiconductor memory device, according to an embodiment of the inventive concept.

FIGS. 9B to 16B and 18B to 20B are sectional views, which are respectively taken along lines A-A' and B-B' of FIGS. 9A to 16A and 18A to 20A.

FIGS. 9C to 16C, 16D, 16E, 17B, and 18C to 20C are sectional views, which are respectively taken along lines C-C' of FIGS. 9A to 20A.

FIG. 21 is a flowchart illustrating a method of fabricating a cell array structure of a semiconductor memory device, according to an embodiment of the inventive concept.

FIGS. 24A and 24B are perspective views illustrating a structure, which is formed by a pad trimming process according to an embodiment of the inventive concept.

FIGS. 25A, 25B, 25C, 26D, 26E, 27F, and 25G are perspective views illustrating various structures of word line pads, which are disposed in a cell array structure according to an embodiment of the inventive concept.

DETAILED DESCRIPTION

Example embodiments of the inventive concepts will now be described more fully with reference to the accompanying drawings, in which example embodiments are shown.

Figure 1:
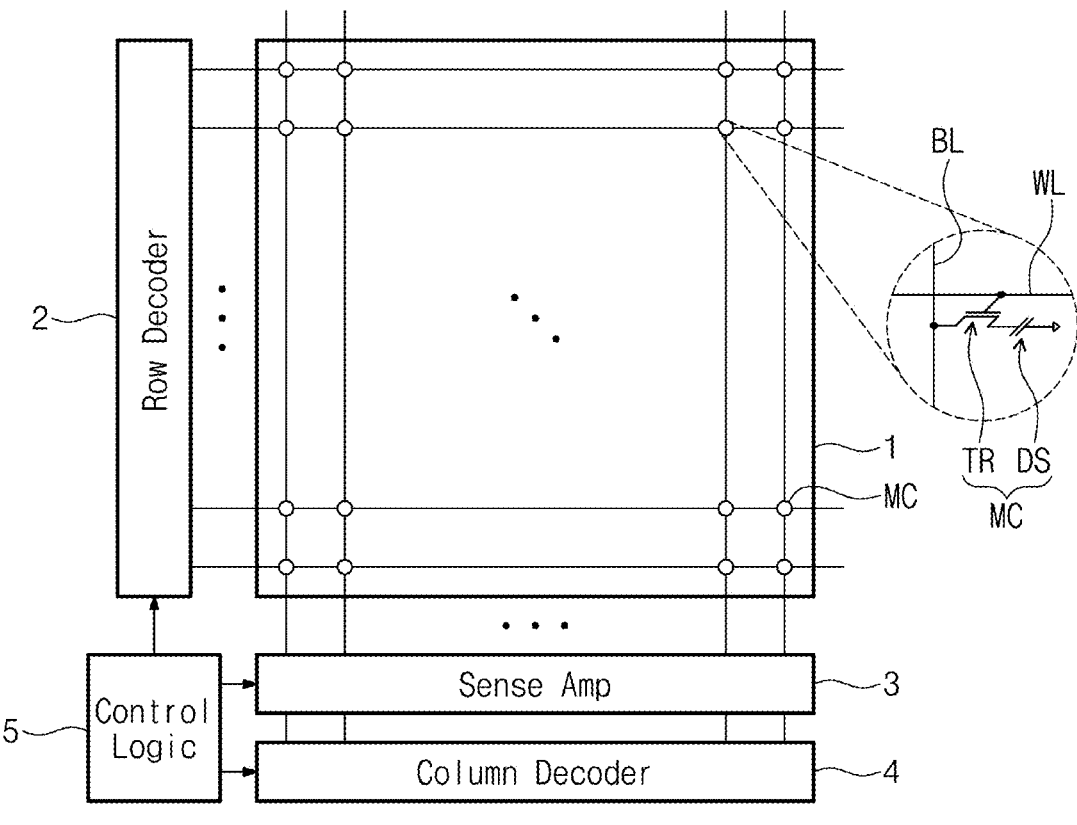
FIG. 1 is a block diagram illustrating a semiconductor memory device according to an embodiment of the inventive concept.

FIG. 1 is a block diagram illustrating a semiconductor memory device according to an embodiment of the inventive concept.

Referring to FIG. 1, a semiconductor memory device may include a memory cell array 1, a row decoder 2, a sensing amplifier 3, a column decoder 4, and a control logic 5.

The memory cell array 1 may include a plurality of memory cells MC, which are three-dimensionally arranged. Each of the memory cells MC may be disposed between and connected to a word line WL and a bit line BL, which are disposed to cross each other.

Each of the memory cells MC may include a switching device TR and a data storage element DS, which are electrically connected to each other in series. The switching device TR may be a field effect transistor FET, and the data storage element DS may be realized by a capacitor or a variable resistor. In an embodiment, the switching device TR may include a transistor including a gate electrode, which is connected to the word line WL, and drain/source terminals, which are respectively connected to the bit line BL and the data storage element DS.

The row decoder 2 may be configured to decode address information, which is input from the outside, and to select one of the word lines WL of the memory cell array 1, based on the decoded address information. The address information decoded by the row decoder 2 may be provided to a row driver (not shown), and in this case, the row driver may provide respective voltages to the selected one of the word lines WL and the unselected ones of the word lines WL, in response to the control of a control circuit.

The sensing amplifier 3 may be configured to sense, amplify, and output a difference in voltage between one of the bit lines BL, which is selected based on address information decoded by the column decoder 4, and a reference bit line.

The column decoder 4 may provide a data transmission path between the sensing amplifier 3 and an external device (e.g., a memory controller). The column decoder 4 may be configured to decode address information, which is input from the outside, and to select one of the bit lines BL, based on the decoded address information.

The control logic 5 may be configured to generate control signals, which are used to control data-writing or data-reading operations on the memory cell array 1.

Figure 2:
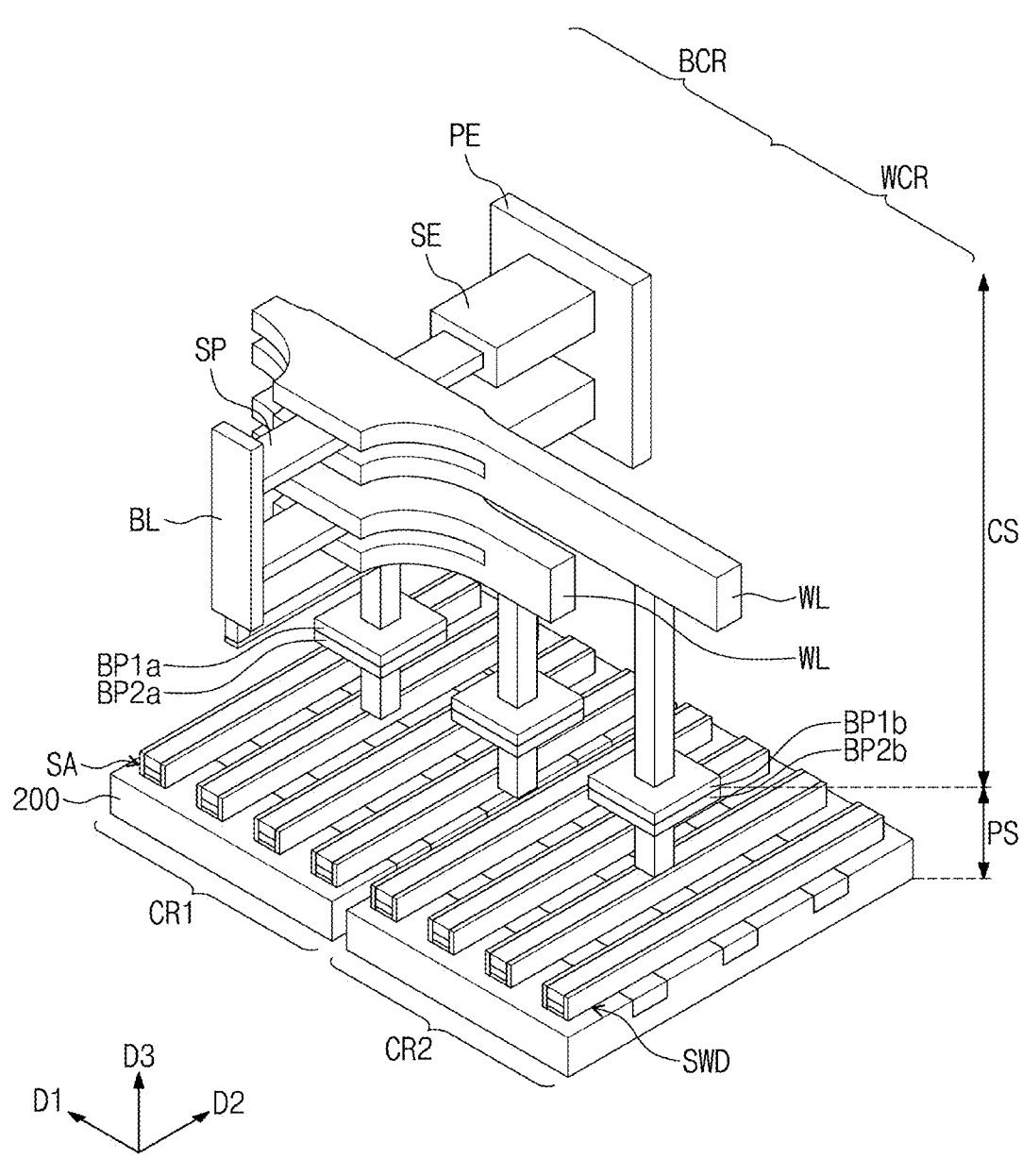
FIG. 2 is a perspective view illustrating a portion of a semiconductor memory device according to an embodiment of the inventive concept.
Figure 3:
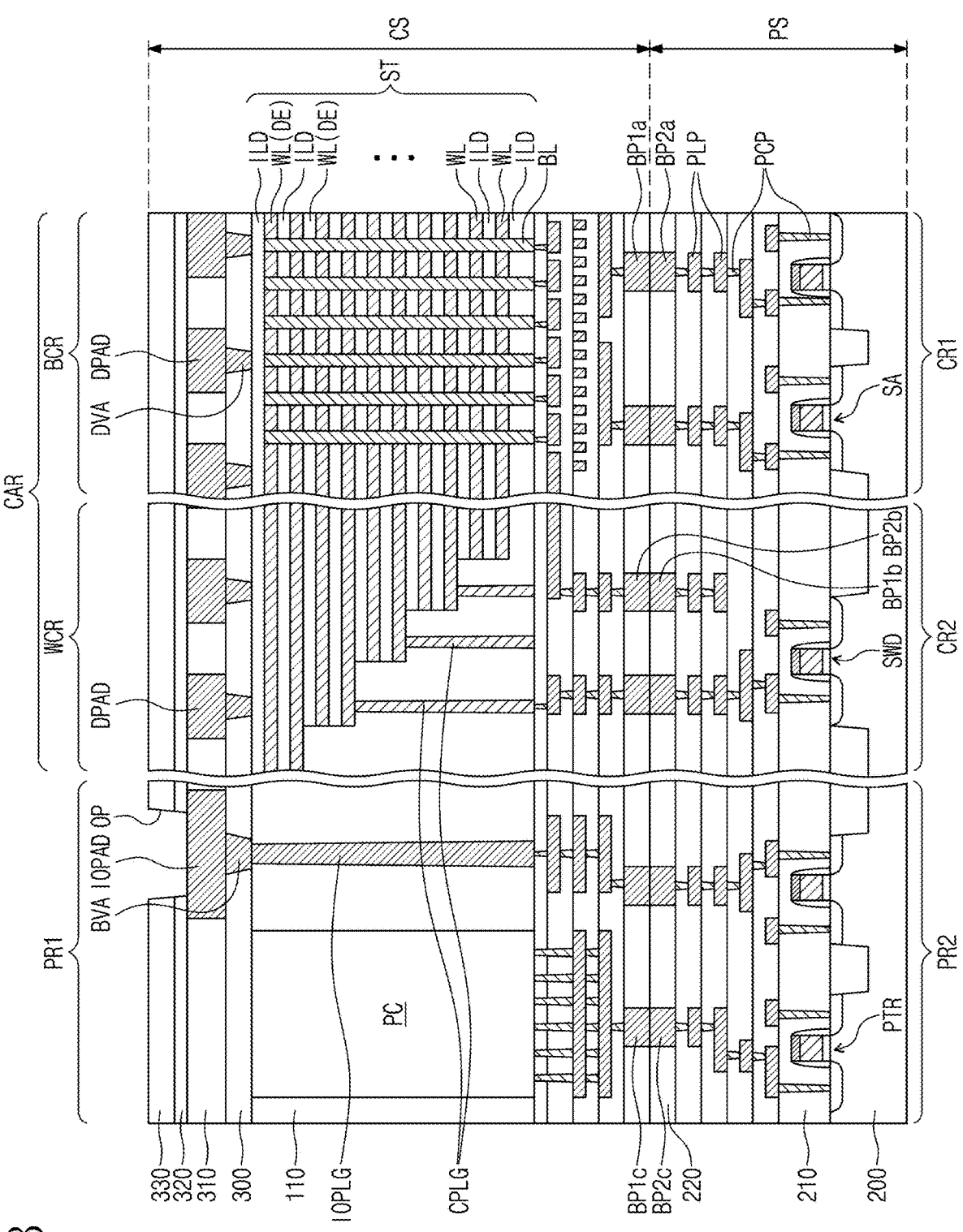
FIG. 3 is a sectional view illustrating a semiconductor memory device according to an embodiment of the inventive concept.

FIG. 2 is a perspective view illustrating a portion of a semiconductor memory device according to an embodiment of the inventive concept. FIG. 3 is a sectional view illustrating a semiconductor memory device according to an embodiment of the inventive concept.

Referring to FIGS. 2 and 3, a semiconductor memory device may include a cell array structure CS and a peripheral circuit structure PS on the cell array structure CS.

In an embodiment, the semiconductor memory device may have a chip-to-chip (C2C) structure. For the C2C structure, an upper chip including the cell array structure CS may be fabricated on a first wafer, a lower chip including the peripheral circuit structure PS may be fabricated on a second wafer different from the first wafer, and the upper chip and the lower chip may be connected to each other through a bonding method. The bonding method may mean a way of electrically connecting a bonding metal formed in an upper-most metal layer of the upper chip to a bonding metal formed in an uppermost metal layer of the lower chip. For example, in the case where the bonding metal is formed of copper (Cu), the bonding method may be a Cu-to-Cu bonding method, but in an embodiment, the bonding metal may be formed of or include aluminum (Al) or tungsten (W).

The cell array structure CS may include a lower insulating layer 300, word lines WL, bit lines BL, a power capacitor PC, an input/output contact plug IOPLG, input/output pads IOPAD, and first bonding pads BP1a, BP1b, and BP1c, and here, the lower insulating layer 300 may have a first surface and a second surface, which are opposite to each other and extend in a first direction D1 and a second direction D2 perpendicular to the first direction.

The cell array structure CS may include a cell array region CAR and a first peripheral region PR1, and the cell array region CAR may include a first region or bit line connection region BCR and a second region or word line connection region WCR.

A stack ST may be disposed on the first surface of the lower insulating layer 300. The stack ST may include interlayer insulating patterns ILD and word lines WL, which are alternately stacked. The stack ST may extend in the first direction D1, which is parallel to the first surface of the lower insulating layer 300, and may have a staircase structure on the second region WCR.

The word lines WL may extend from the first region BCR to the second region WCR, and the bit lines BL may be provided in the first region BCR. The bit lines BL may extend in a third direction D3 that is perpendicular to the first surface of the lower insulating layer 300 and the first direction D1 and second direction D2.

The word lines WL may extend in the first direction D1 that is parallel to the first surface of the lower insulating layer 300. The word lines WL may include pads PAD (e.g., "word line pads"), which are provided on the second region WCR and are connected to cell contact plugs CPLG. The word lines WL may be stacked to have a staircase structure on the second region WCR. The word line pads PAD may be located at positions which are different from each other in horizontal and vertical directions. In an embodiment, some of the word lines WL, which are adjacent to the lower insulating layer 300, may be used as dummy word lines DE.

Meanwhile, the word lines WL are described to be parallel to the first surface of the lower insulating layer 300, but the inventive concept is not limited to this example. For example, although not illustrated, the bit lines BL may extend in the first direction D1, which is parallel to the first surface of the lower insulating layer 300, and the word lines WL may extend in the third direction D3.

In an embodiment, each of the word lines WL may be provided to face opposite surfaces of a channel pattern SP and to have a double gate structure, as shown in FIG. 2. In another embodiment, each of the word lines WL may be provided to completely enclose the channel pattern SP and may have a gate-all-around structure.

A first end portion of the channel pattern SP may be connected to the bit line BL, and a second end portion of the channel pattern SP may be connected to a storage electrode SE. In an embodiment, the cell array region CAR of the cell array structure CS will be described in more detail with reference to FIGS. 4, 5A, 5B, 6, 7A, and 7B.

A planarization insulating layer 110 may be disposed on the second region WCR and the first peripheral region PR1 to cover the first surface of the lower insulating layer 300. The planarization insulating layer 110 may cover the staircase structure of the stack ST. For example, the planarization insulating layer 110 may be provided to cover the word line pads PAD.

Some of the core and peripheral circuits (e.g., 2, 3, 4, and 5 of FIG. 1) of the semiconductor memory device may be provided in the first peripheral region PR1. In an embodiment, a power capacitor PC (or a decoupling capacitor), which is used to filter a noise between operation powers to be input to the semiconductor memory device, may be provided in the first peripheral region PR1. The power capacitor PC may constitute a voltage generator which receives a power voltage input through the input/output pad IOPAD and outputs operation voltages for operating the memory cell array. In addition, the power capacitor PC may be configured to perform an operation of filtering a noise between operation powers, which are input through the input/output pad IOPAD. As an example, the power capacitor PC may be a metal-insulator-metal (MIM) capacitor including first and second electrodes and a dielectric layer therebetween.

The input/output contact plug IOPLG may be provided in the first peripheral region PR1 to penetrate the planarization insulating layer 110. The input/output contact plug IOPLG may be connected to the first bonding pads BP1a, BP1b, and BP1c through contact plugs and conductive lines.

The input/output pads IOPAD and dummy pads DPAD may be disposed on the second surface of the lower insulating layer 300. In the first peripheral region PR1, the input/output pads IOPAD may be connected to the input/output contact plug IOPLG through input/output vias BVA.

The dummy pads DPAD may be provided on the first and second regions BCR and WCR. The dummy pads DPAD may be connected to dummy vias DVA. The dummy vias DVA may be enclosed by an insulating material to be in an electrically-floated state, and the dummy pads DPAD and the dummy vias DVA may be used as pathways for supplying hydrogen in a process of fabricating a semiconductor memory device. The input/output pads IOPAD and the dummy pads DPAD may be formed of or include at least one of metallic materials (e.g., aluminum).

A protection layer 310 may be disposed on the second surface of the lower insulating layer 300 to cover the input/output pads IOPAD and the dummy pads DPAD. The protection layer 310 may be a hydrogen-containing oxide layer. A hydrogen concentration in the protection layer 310 may be higher than a hydrogen concentration in the lower insulating layer 300. The protection layer 310 may be a high density plasma (HDP) oxide layer or a tetraethylortho silicate (TEOS) layer.

A capping insulating layer 320 and a passivation layer 330 may be sequentially formed on the protection layer 310. The capping insulating layer 320 and the passivation layer 330 may have a pad opening OP exposing a portion of the input/output pad IOPAD.

The capping insulating layer 320 may include, for example, a silicon nitride layer or a silicon oxynitride layer. The passivation layer 330 may be formed of or include at least one of polyimide-based materials (e.g., photo sensitive polyimide (PSPI)).

In an embodiment, the first bonding pads BP1a, BP1b, and BP1c of the cell array structure CS may include first upper bonding pads BP1a provided on the first region BCR, second upper bonding pads BP1b provided on the word line connection regions WCR, and third upper bonding pads BP1c provided on the first peripheral region PR1.

First upper bonding pads BP1a may be electrically connected to the bit lines BL through conductive lines and contact plugs, and second upper bonding pads BP1b may be coupled to the word line pads PAD through conductive lines and cell contact plugs CPLG. The third upper bonding pads BP1c may be connected to the power capacitor PC and the input/output contact plug IOPLG through conductive lines and contact plugs.

The peripheral circuit structure PS may include a semiconductor substrate 200 and sense amplifiers SA, sub-word line drivers SWD, peripheral circuits PTR, and second bonding pads BP2a, BP2b, and BP2c, which are provided on the semiconductor substrate 200.

In detail, the semiconductor substrate 200 of the peripheral circuit structure PS may include a first core region CR1, a second core region CR2, and a second peripheral region PR2. The first and second core regions CR1 and CR2 may be vertically overlapped with the memory cell array region CAR. The second peripheral region PR2 may be vertically overlapped with the first peripheral region PR1.

The sense amplifiers SA may be provided on the first core region CR1 of the semiconductor substrate 200. The sub-word line drivers SWD may be provided on the second core region CR2 of the semiconductor substrate 200. The peripheral circuits PTR may be provided on the second peripheral region PR2 of the semiconductor substrate 200.

Peripheral interlayer insulating layers 210 and 220 may be provided on a top surface of the semiconductor substrate 200. The peripheral interlayer insulating layers 210 and 220 may be provided on the semiconductor substrate 200 to cover the peripheral circuits SA, SWD, and PTR, peripheral contact plugs PCP, and peripheral circuit lines PLP. The peripheral contact plugs PCP and the peripheral conductive lines may be electrically connected to the peripheral circuits SA, SWD, and PTR. The peripheral interlayer insulating layers 210 and 220 may include a silicon oxide layer, a silicon nitride layer, a silicon oxynitride layer, and/or a low-k dielectric layer.

The second bonding pads BP2*a*, BP2*b*, and BP2*c* of the peripheral circuit structure PS may include first lower bonding pads BP2*a* provided in the first core region CR1, second lower bonding pads BP2*b* provided in the second core region CR2, and third lower bonding pads BP2*c* provided in the second peripheral region PR2.

The first lower bonding pads BP2*a* may be electrically connected to the sense amplifiers SA through conductive lines and contact plugs. The second lower bonding pads BP2*b* may be electrically connected to the sub-word line drivers SWD through conductive lines and contact plugs. The third lower bonding pads BP2*c* may be electrically connected to the peripheral circuits PTR through conductive lines and contact plugs.

In an embodiment, the first, second, and third lower bonding pads BP2*a*, BP2*b*, and BP2*c* may be directly connected to the first, second, and third upper bonding pads BP1*a*, BP1*b*, and BP1*c*, respectively. The first, second, and third lower and upper bonding pads BP1*a*, BP1*b*, BP1*c*, BP2*a*, BP2*b*, and BP2*c* may be formed of or include the same metallic material and may have substantially the same size or area. The first, second, and third lower and upper bonding pads BP1*a*, BP1*b*, BP1*c*, BP2*a*, BP2*b*, and BP2*c* may be formed of or include at least one of, for example, copper (Cu), aluminum (Al), nickel (Ni), cobalt (Co), tungsten (W), titanium (Ti), tin (Sn), or alloys thereof. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 4:
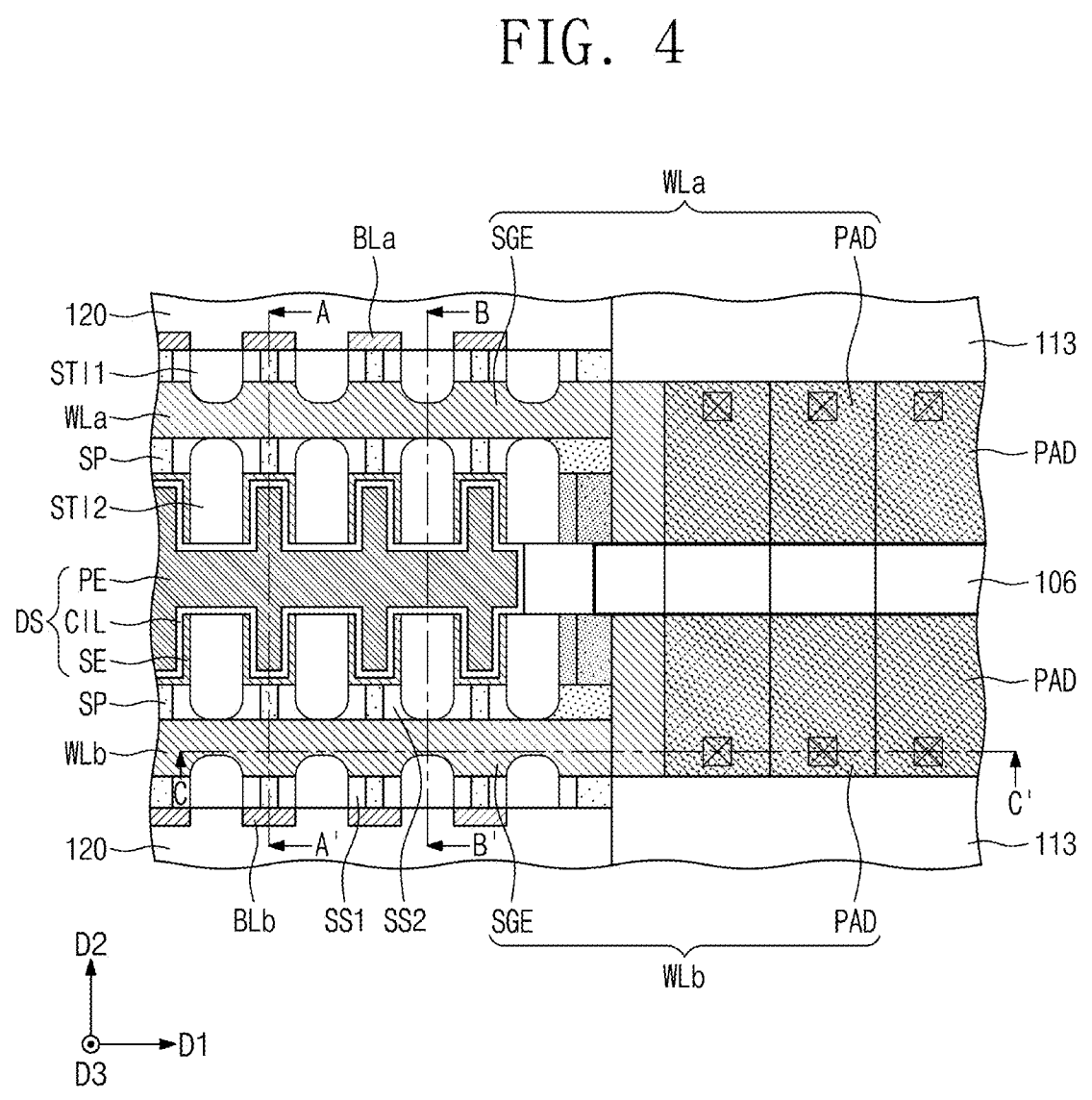
Figure 5A:
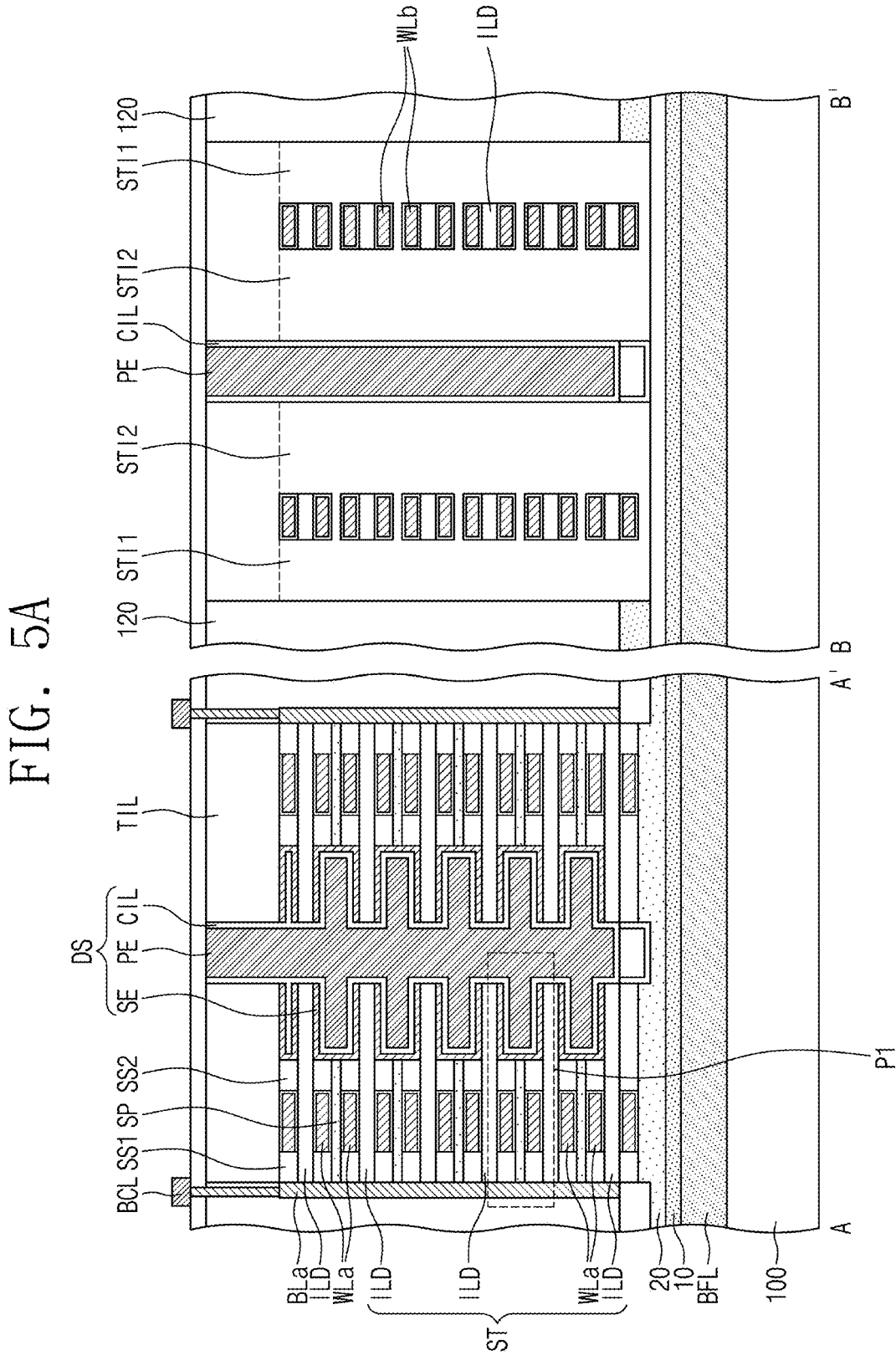
FIG. 5A is a sectional view, which is taken along lines A-A' and B-B' of FIG. 4 to illustrate a cell array structure of a semiconductor memory device according to an embodiment of the inventive concept.
Figure 5B:
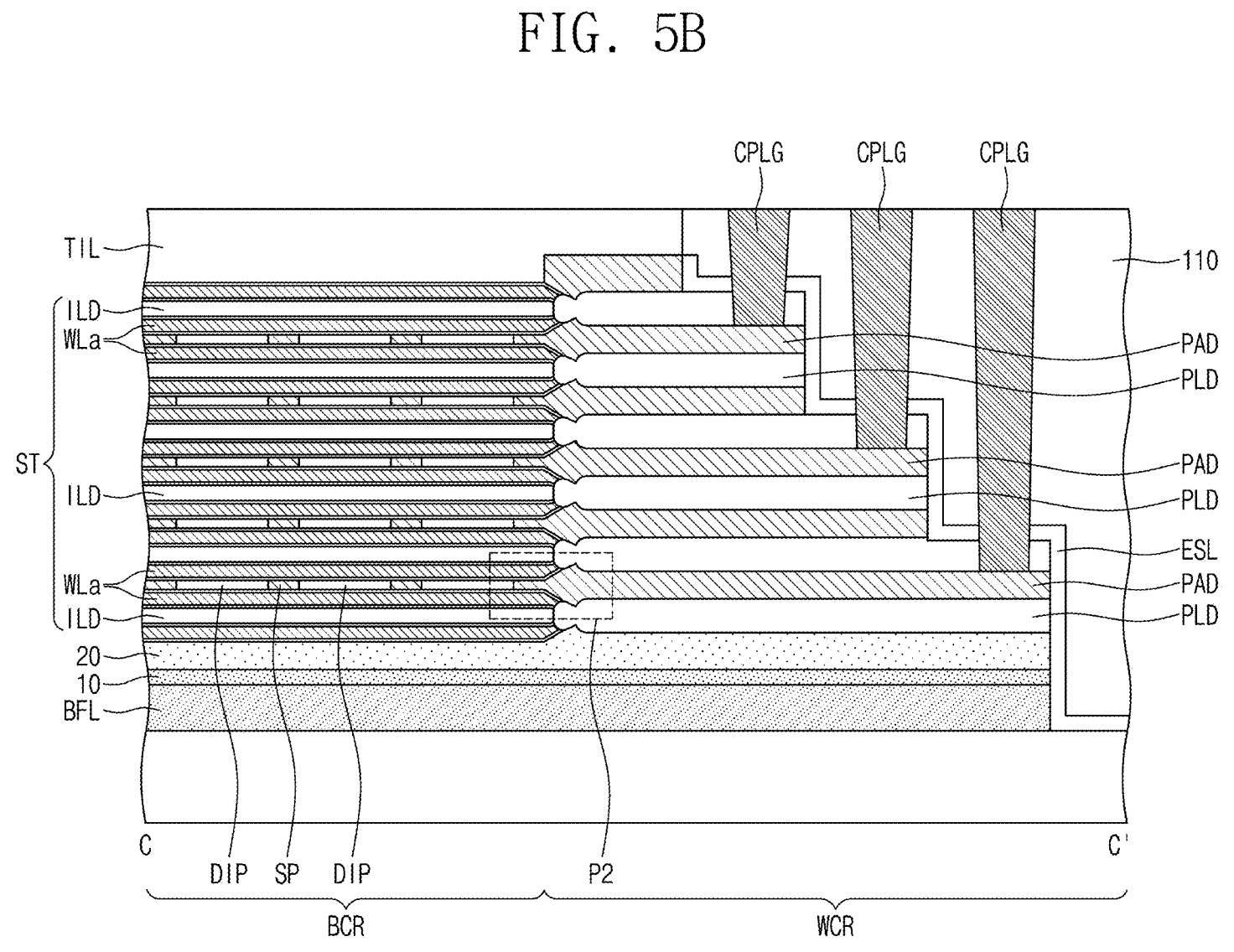
Figure 6:
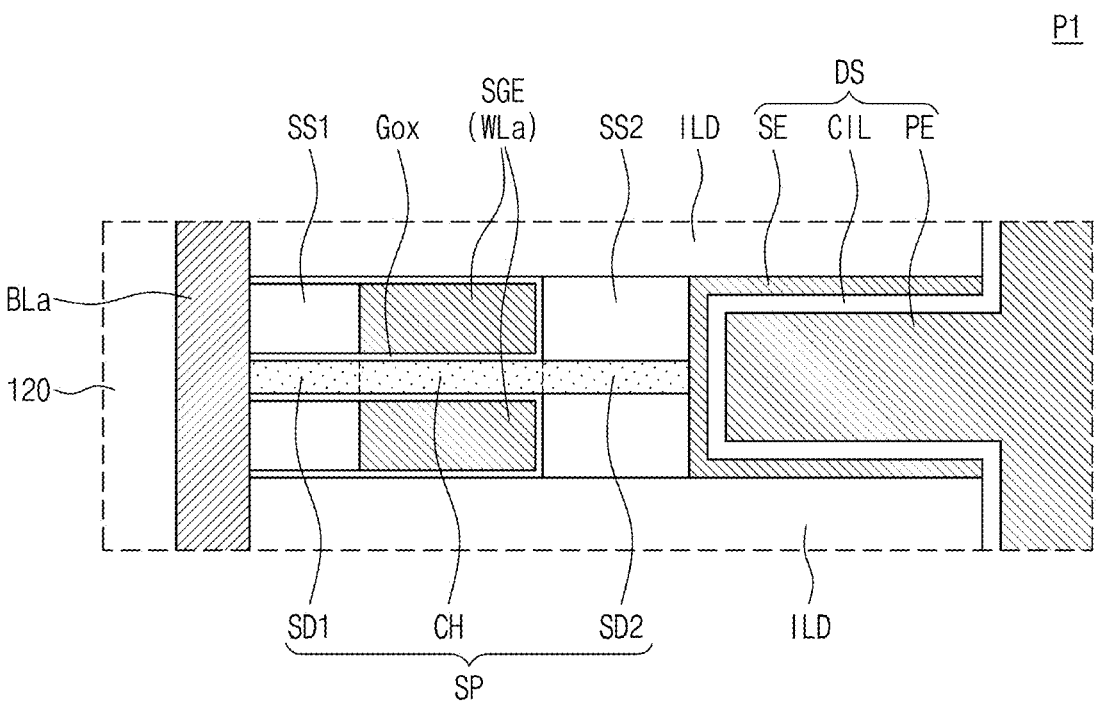
FIG. 6 is an enlarged sectional view illustrating a portion 'P1' of FIG. 5A.
Figure 7A:
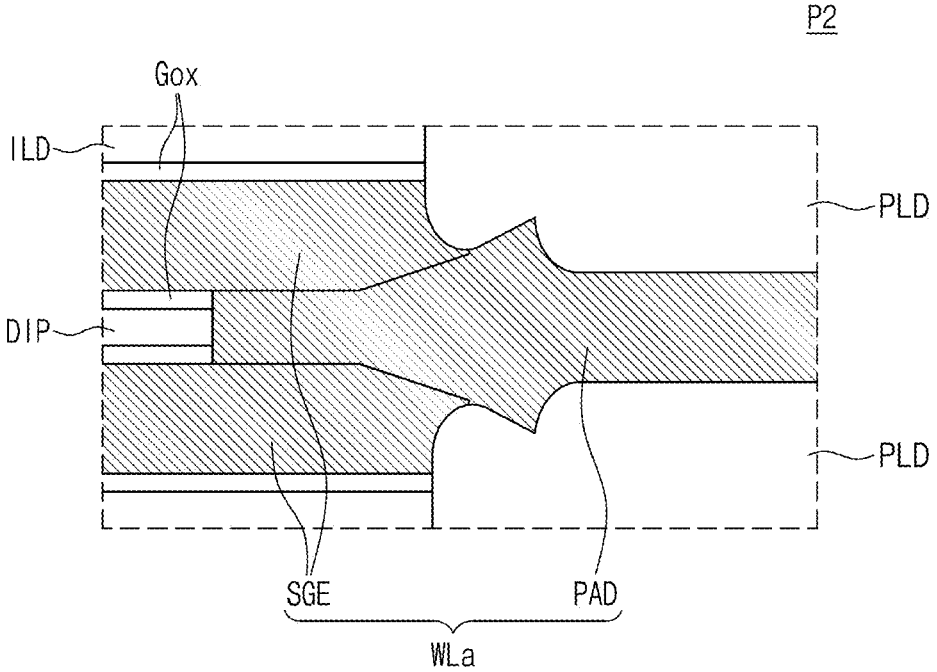
FIGS. 7A and 7B are enlarged sectional views illustrating a portion 'P2' of FIG. 5B.
Figure 7B:
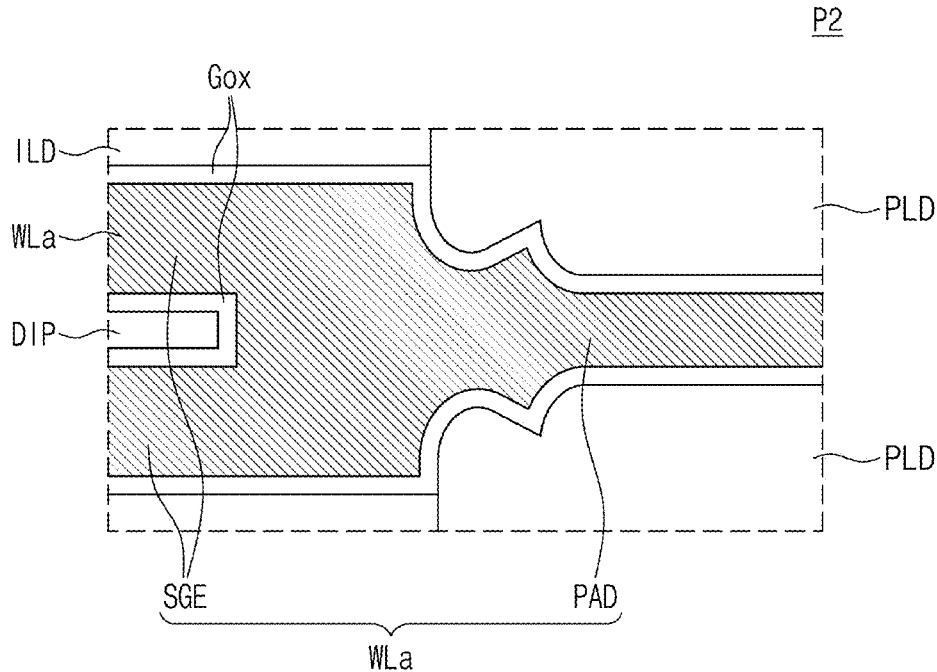

FIG. 4 is a plan view illustrating a cell array structure of a semiconductor memory device according to an embodiment of the inventive concept. FIG. 5A is a sectional view, which is taken along lines A-A' and B-B' of FIG. 4 to illustrate a cell array structure of a semiconductor memory device according to an embodiment of the inventive concept. FIG. 5B is a sectional view, which is taken along a line C-C' of FIG. 4 to illustrate a cell array structure of a semiconductor memory device according to an embodiment of the inventive concept. FIG. 6 is an enlarged sectional view illustrating a portion 'P1' of FIG. 5A. FIGS. 7A and 7B are enlarged sectional views illustrating a portion 'P2' of FIG. 5B.

Referring to FIGS. 4, 5A, and 5B, a semiconductor memory device may include stacks ST, which are disposed on a substrate 100.

The substrate 100 may include the first region BCR and the second region WCR adjacent thereto. The substrate 100 may be formed of or include at least one of a semiconductor material (e.g., silicon), an insulating material (e.g., glass), or a semiconductor or conductor material covered with an insulating material.

In an embodiment, each of the stacks ST may include the interlayer insulating patterns ILD and the word lines WLa and WLb, which are alternately stacked on the substrate 100 in the third direction D3. The stacks ST may extend from the first region BCR to the second region WCR in the first direction D1 and may have a staircase structure in the second region WCR. Each of the stacks ST may include pad insulating patterns PLD and the word line pads PAD of the word lines WLa and WLb, which are alternately stacked in the second region WCR. The pad insulating patterns PLD may be located at the same level as the interlayer insulating patterns ILD, and each of the pad insulating patterns PLD may be thicker than each of the interlayer insulating patterns ILD.

The stacks ST may include first and second stacks, which are adjacent to each other in the second direction D2 and are extended to be parallel to each other. The first stack may extend in the first direction D1 and may include first word lines WLa, which are stacked on the substrate 100 in the third direction D3, with the interlayer insulating patterns ILD interposed between. The second stack may be spaced apart from the first stack in the second direction D2 and may extend in the first direction D1. The second stack may include second word lines WLb, which are stacked on the substrate 100 in the third direction D3, with the interlayer insulating patterns ILD interposed therebetween. An upper insulating layer TIL may be disposed to cover the uppermost ones of the first and second word lines WLa and WLb. The first and second word lines WLa and WLb may be formed of or include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), or metal-semiconductor compounds (e.g., tungsten silicide, cobalt silicide, titanium silicide, and so forth).

In an embodiment, as shown in FIG. 5B, a single stair in the staircase structure of each stack ST may be composed of two word line pads PAD of the word lines WLa and WLb, which are successively stacked in the third direction D3. For example, in a stack comprising word lines WLa, two word lines WLa forming the single stair may have side surfaces, which are vertically aligned to each other. In a stack comprising word lines WLb, two word lines WLb forming the single stair may have side surfaces, which are vertically aligned to each other. Alternatively, a single stair in the staircase structure of the stack ST comprising word lines WLb and the stack ST comprising word lines WLb may be composed of three, four, or six word line pads PAD of the word lines WLa and WLb, respectively, which are successively stacked. The staircase structure of the stack ST may be variously changed, as will be described in more detail with reference to FIGS. 25A to 25G.

In each of the stacks ST, the word line pads PAD of the word lines WLa and WLb may be arranged in the first direction D1, and, when measured from the substrate 100, heights of the word line pads PAD of the word lines WLa and WLb may increase as a distance to the first region BCR decreases. In an embodiment, the word line pads PAD of odd-numbered ones of the word lines WLa and WLb may be arranged in the first direction D1, and the cell contact plugs CPLG may be respectively coupled to the word line pads PAD of the odd-numbered ones of the word lines WLa and WLb.

In the second region WCR, each of the stacks ST may be disposed between first and second line insulating isolation patterns 106 and 113. At least one of the first and second line insulating isolation patterns 106 and 113 may be provided to have substantially the same structure (i.e., the staircase structure) as the stack ST (e.g., see 106 of FIG. 23B). As the heights of the word line pads PAD from the substrate 100 are lowered, a width of the first line insulating isolation pattern

Figure 23A:
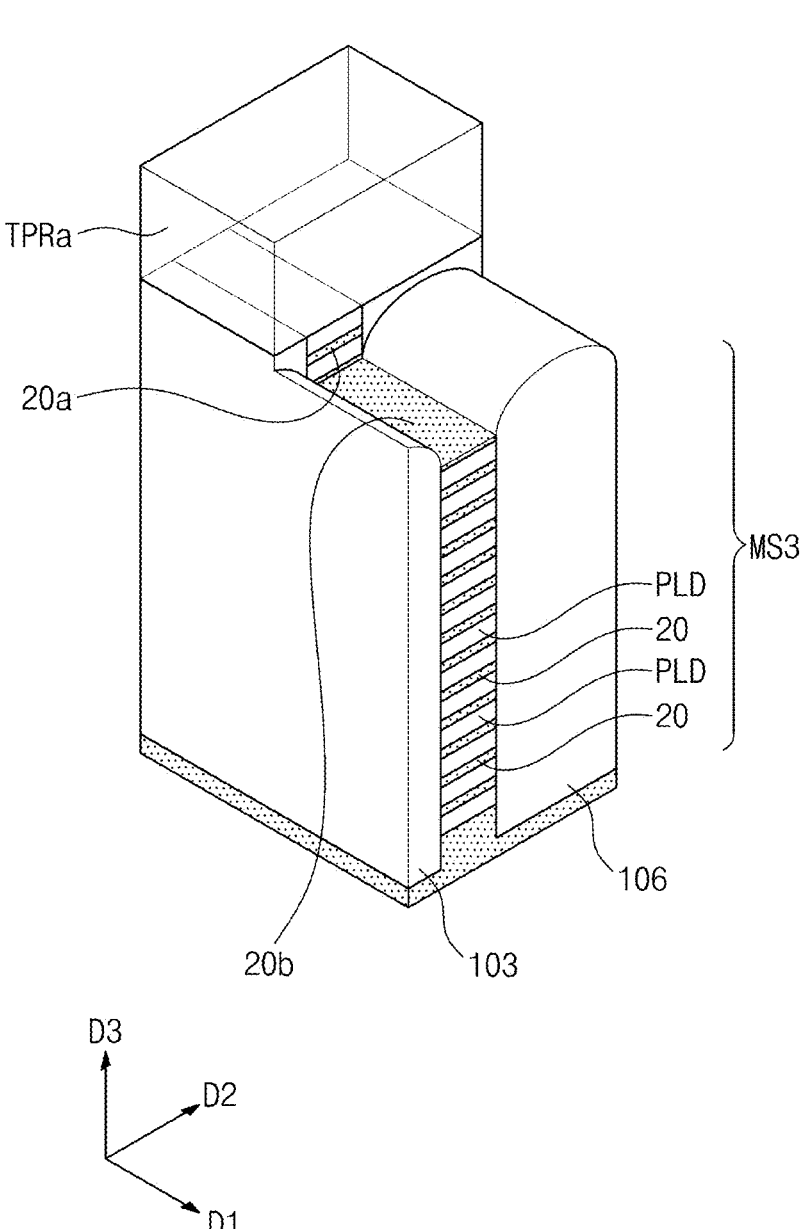
FIGS. 23A and 23B are perspective views illustrating a structure, which is formed by a pad trimming process according to an embodiment of the inventive concept.
Figure 23B:
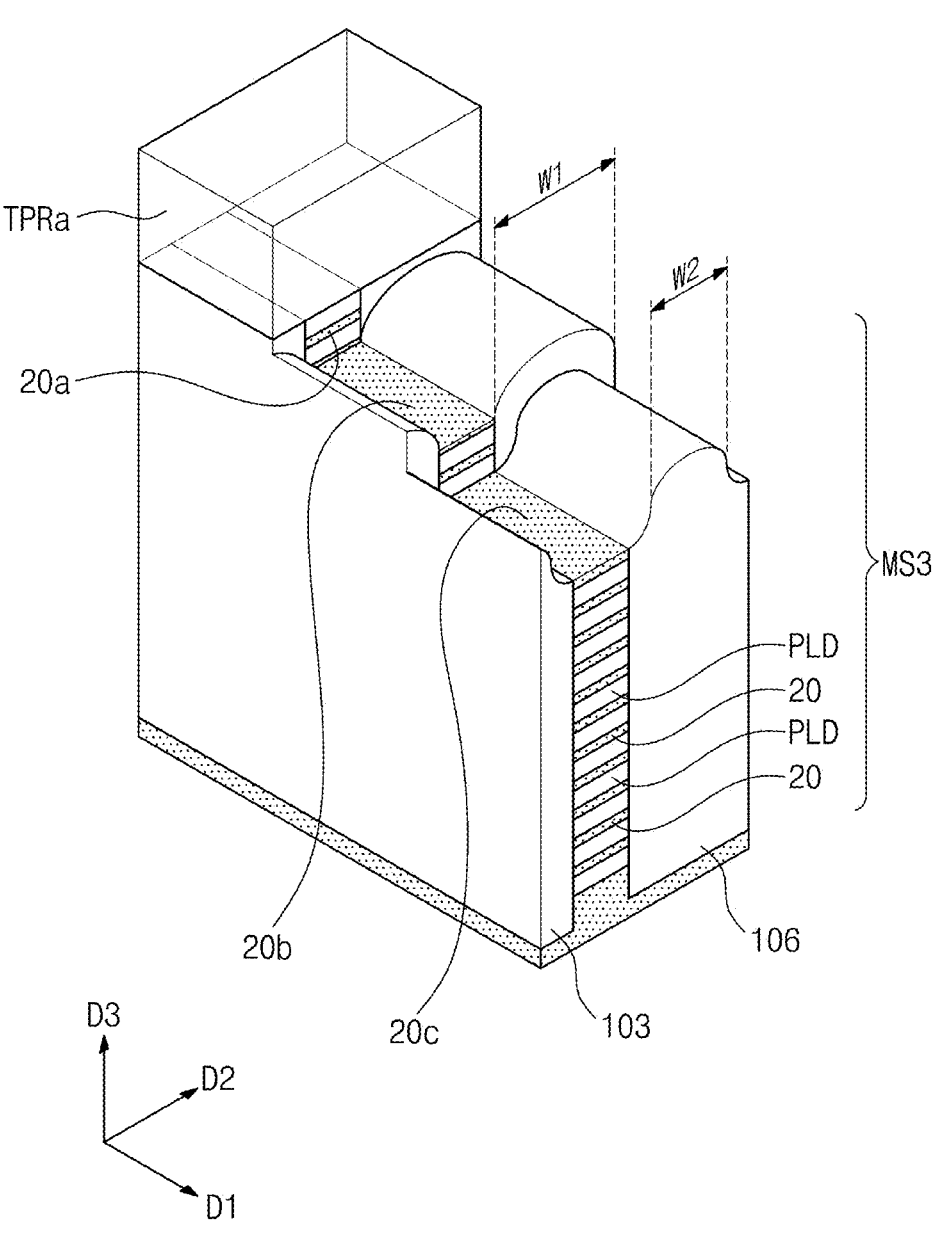

106 may be decreased (e.g., see 106 of FIG. 23B). In addition, as a result of a pad trimming process of forming the staircase structure in the second region WCR, as the heights of the word line pads PAD of the word lines WLa and WLb from the substrate 100 are lowered, the widths of the word line pads PAD of the word lines WLa and WLb may be decreased (e.g., see 20a and 20b of FIG. 24B). Accordingly, a width, in the second direction, of the first line insulating isolation pattern 106 and word line pads PAD may decrease as the distance from the first region BCR increases in the first direction.

In an embodiment, each of the word lines WLa and WLb in the first region BCR may be provided to face top and bottom surfaces of the channel pattern SP or to have a double gate structure, as shown in FIG. 2.

In detail, each of the first and second word lines WLa and WLb may include a pair of sub-gate electrodes SGE, which extend from the first region BCR in the first direction D1, and a word line pad PAD, which is connected in common to the sub-gate electrodes SGE in the second region WCR. For example, as illustrated in FIG. 4, the sub-gate electrodes SGE may be disposed between first and second insulating isolation patterns STI1 and STI2. In addition, when measured in the second direction D2, widths of the sub-gate electrodes SGE between the first and second insulating isolation patterns STI1 and STI2 may be smaller than widths of the sub-gate electrodes SGE on the channel patterns. When viewed in a plan view, a pair of the first and second word lines WLa and WLb may be provided to have a mirror symmetry about a plate electrode PE.

Referring to FIGS. 7A and 7B, in each of the word lines WLa and WLb, a thickness of the word line pad PAD may be larger than a thickness of each sub-gate electrode.

Referring to FIG. 7A, the word line pad PAD of each of the word lines WLa and WLb may be disposed between the pad insulating patterns PLD, which are vertically adjacent (e.g., in the third direction) to each other. Top and bottom surfaces of the word line pad PAD may be in contact with the pad insulating patterns PLD. In each of the word lines WLa and WLb, the word line pad PAD may have a protruding portion extended into a region between the sub-gate electrodes SGE. The protruding portion of the word line pad PAD may be in common contact with a pair of the sub-gate electrodes SGE. Furthermore, in each of the word lines WLa and WLb, there may be an interface between the sub-gate electrodes SGE and the word line pad PAD.

Referring to FIG. 7B, in each of the word lines WLa and WLb, the sub-gate electrodes SGE and the word line pad PAD may be composed of a single layer, without an interface between the sub-gate electrodes SGE and the word line pad PAD. In this case, a gate insulating layer Gox may be interposed between the word line pad PAD and the pad insulating patterns PLD.

The channel patterns SP may be stacked in the third direction D3 in the first region BCR and may be spaced apart from each other in the first and second directions D1 and D2. For example, the channel patterns SP may be three-dimensionally arranged on the substrate 100. As shown in FIG. 2, each of the channel patterns SP may have a bar-shaped pattern that is extended to cross the word lines WLa and WLb and has a long axis parallel to the second direction D2.

In the case where the word lines WLa and WLb have a double gate structure, the channel patterns SP may be spaced apart from each other in the first direction D1 between a pair of the sub-gate electrodes SGE. In addition, dummy insulating patterns DIP may be disposed between the channel patterns SP, which are adjacent to each other in the first direction D1, and between the pair of the sub-gate electrodes SGE.

The channel patterns SP may be formed of or include at least one of silicon (Si), germanium (Ge), or silicon germanium (SiGe). As an example, the channel patterns SP may be formed of or include single-crystalline silicon. In an embodiment, the channel patterns SP may have a band gap energy that is greater than that of silicon. For example, the channel patterns SP may have a band gap energy of about 1.5 eV to 5.6 eV. For example, when the channel patterns SP have a band gap energy of about 2.0 eV to 4.0 eV, the channel patterns SP may have an optimized channel performance. As an example, the channel patterns SP may be formed of or include at least one of oxide semiconductor materials (e.g., ZnxSnyO (ZTO), InxZnyO (IZO), ZnxO, InxGayZnzO (IGZO), InxGaySizO (IGSO), InxWyO (IWO), InxO, SnxO, TixO, ZnxONz, MgxZnyO, ZrxInyZnzO, HfxInyZnzO, SnxInyZnzO, AlxSnyInzZnaO, SixInyZnzO, AlxZnySnzO, GaxZnySnzO, ZrxZnySnzO, or combinations thereof).

As shown in FIG. 6, each of the channel patterns SP may include first and second source drain regions SD1 and SD2, which are spaced apart from each other, and a channel region CH between the first and second source drain regions SD1 and SD2. The first and second source drain regions SD1 and SD2 of each channel pattern SP may be doped with impurities.

First spacer insulating patterns SS1 may be respectively disposed between the word lines WL and the bit lines BL and between vertically adjacent ones of the interlayer insulating patterns ILD. The first spacer insulating pattern SS1 may be provided to enclose the first dopant region SD1 of the channel pattern SP.

Second spacer insulating patterns SS2 may be respectively disposed between the word lines WL and the data storage elements DS and between vertically adjacent ones of the interlayer insulating patterns ILD. The second spacer insulating pattern SS2 may be provided to enclose the second dopant region SD2 of the channel pattern SP. When measured in the second direction D2, a width of the second spacer insulating patterns SS2 may be larger than a width of the first spacer insulating patterns SS1.

In the first region BCR, the gate insulating layers Gox may be interposed between the channel regions CH of the channel patterns SP and the word lines WLa and WLb and between the interlayer insulating patterns ILD and the word lines WLa and WLb.

As shown in FIG. 7A, the gate insulating layers Gox may be spaced apart from the word line pad PAD of each of the word lines WLa and WLb. Alternatively, the gate insulating layers Gox may extend from the first region BCR to the second region WCR and may cover a surface of each word line, as shown in FIG. 7B.

The gate insulating layers Gox may include at least one of a high-k dielectric layer, a silicon oxide layer, a silicon nitride layer, a silicon oxynitride layer, or combinations thereof and may have a single- or multi-layered structure. In an embodiment, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A first end portion of the channel pattern SP may be in contact with the bit line BL, and a second end portion of the channel pattern SP may be connected to the data storage element DS.

In an embodiment, the data storage element DS may be a capacitor, and the data storage element DS may include the storage electrode SE, the plate electrode PE, and a capacitor dielectric layer CIL therebetween.

The storage electrode SE may be in contact with the second end portion of each channel pattern SP. The storage electrodes SE may be provided at substantially the same level in the third direction as the channel patterns SP. In other words, the storage electrodes SE may be stacked in the third direction D3 and may have a long axis parallel to the second direction D2. The storage electrodes SE may be respectively disposed between vertically adjacent ones of the interlayer insulating patterns ILD.

The capacitor dielectric layer CIL may be provided to conformally cover the storage electrodes SE. The plate electrode PE may be provided to fill inner spaces of the storage electrodes SE covered with the capacitor dielectric layer CIL.

The second insulating isolation patterns STI2 may be respectively disposed between the storage electrodes SE, which are adjacent to each other in the first direction D1. The second insulating isolation patterns STI2 may extend in the third direction D3. The second insulating isolation patterns STI2 may be formed of or include at least one of silicon oxide, silicon oxynitride, or insulating materials, which are formed using a spin-on-glass (SOG) technology.

First and second bit lines BLa and BLb may extend in the third direction D3 that is perpendicular to a top surface of the substrate 100. The first and second bit lines BLa and BLb may be provided to cross the first and second word lines WLa and WLb. The first bit lines BLa may be spaced apart from each other in the first direction D1, and the first insulating isolation patterns STI1 may be respectively disposed between the first bit lines BLa, which are adjacent to each other in the first direction D1. The first insulating isolation patterns STI1 may extend in the third direction D3. The first insulating isolation patterns STI1 may be formed of or include at least one of silicon oxide, silicon oxynitride, or insulating materials, which are formed using a spin-on-glass (SOG) technology.

The second bit lines BLb may be spaced apart from the first bit lines BLa in the second direction D2 and may be spaced apart from each other in the first direction D1. The first insulating isolation patterns STI1 may be respectively disposed between the second bit lines BLb, which are adjacent to each other in the first direction D1.

Each of the first and second bit lines BLa and BLb may be in contact with first side surfaces of the channel patterns SP, which are spaced apart from each other in the third direction D3. In other words, each of the first and second bit lines BLa and BLb may be connected to first dopant regions of the channel patterns SP, which are stacked in the third direction D3.

Line insulating isolation patterns 120 may be provided on the substrate 100 to extend in the first direction D1. The line insulating isolation patterns 120 may be provided to cover side surfaces of the first and second bit lines BLa and BLb and side surfaces of the first insulating isolation patterns STI1. The line insulating isolation patterns 120 may be formed of or include at least one of silicon oxide, silicon oxynitride, and insulating materials, which are formed using a spin-on-glass (SOG) technology.

FIG. 8 is a flowchart illustrating a method of fabricating a cell array structure of a semiconductor memory device, according to an embodiment of the inventive concept.

FIGS. 9A to 20A are plan views illustrating a method of fabricating a cell array structure of a semiconductor memory device, according to an embodiment of the inventive concept. FIGS. 9B to 16B and 18B to 20B are sectional views, which are respectively taken along lines A-A' and B-B' of FIGS. 9A to 16A and 18A to 20A. FIGS. 9C to 16C, 16D, 16E, 16F, 17B, and 18C to 20C are sectional views, which are respectively taken along lines C-C' of FIGS. 9A to 20A.

Referring to FIGS. 8, 9A, 9B, and 9C, a first mold structure may be formed on the substrate 100, which includes the first and second regions BCR and WCR (in S10).

The substrate 100 may be formed of or include at least one of a semiconductor material (e.g., silicon), an insulating material (e.g., glass), or a semiconductor or conductor material covered with an insulating material.

A first mold structure MS1 may include first semiconductor layers 10 and second semiconductor layers 20, which are alternatingly stacked on the substrate 100.

The first semiconductor layers 10 may be formed of or include a material having an etch selectivity with respect to the second semiconductor layers 20. For example, the first semiconductor layers 10 may be formed of or include at least one of silicon germanium, silicon oxide, silicon nitride, or silicon oxynitride. In an embodiment, the first semiconductor layers 10 may be formed of or include a semiconductor material (e.g., silicon germanium). A thickness of each first semiconductor layer 10 may be smaller than a thickness of each second semiconductor layer 20, when the first mold structure MS1 is formed.

The second semiconductor layers 20 may be formed of or include at least one of undoped semiconductor materials. For example, the second semiconductor layers 20 may be formed of or include at least one of undoped, for example, silicon, germanium, silicon-germanium, or indium gallium zinc oxide (IGZO). In an embodiment, the second semiconductor layers 20 may be formed of or include the same semiconductor material as the substrate 100. For example, the second semiconductor layers 20 may be a single-crystalline silicon layer or a poly-crystalline silicon layer.

The first and second semiconductor layers 10 and 20 may be formed by performing an epitaxial growth process.

In an embodiment, a buffer layer BFL may be interposed between the first mold structure MS1 and the substrate 100. As an example, the buffer layer BFL may be formed of or include silicon-germanium (SiGe) and may have a composition ratio different from the first semiconductor layers 10.

A first mask pattern MP1 may be formed on the first mold structure MS1. The first mask pattern MP1 may cover the uppermost one of the second semiconductor layers 20. The first mask pattern MP1 may be formed of or include an insulating material having an etch selectivity with respect to the first and second semiconductor layers 10 and 20. For example, the first mask pattern MP1 may be a silicon oxide layer or a silicon nitride layer.

Figure 9A:
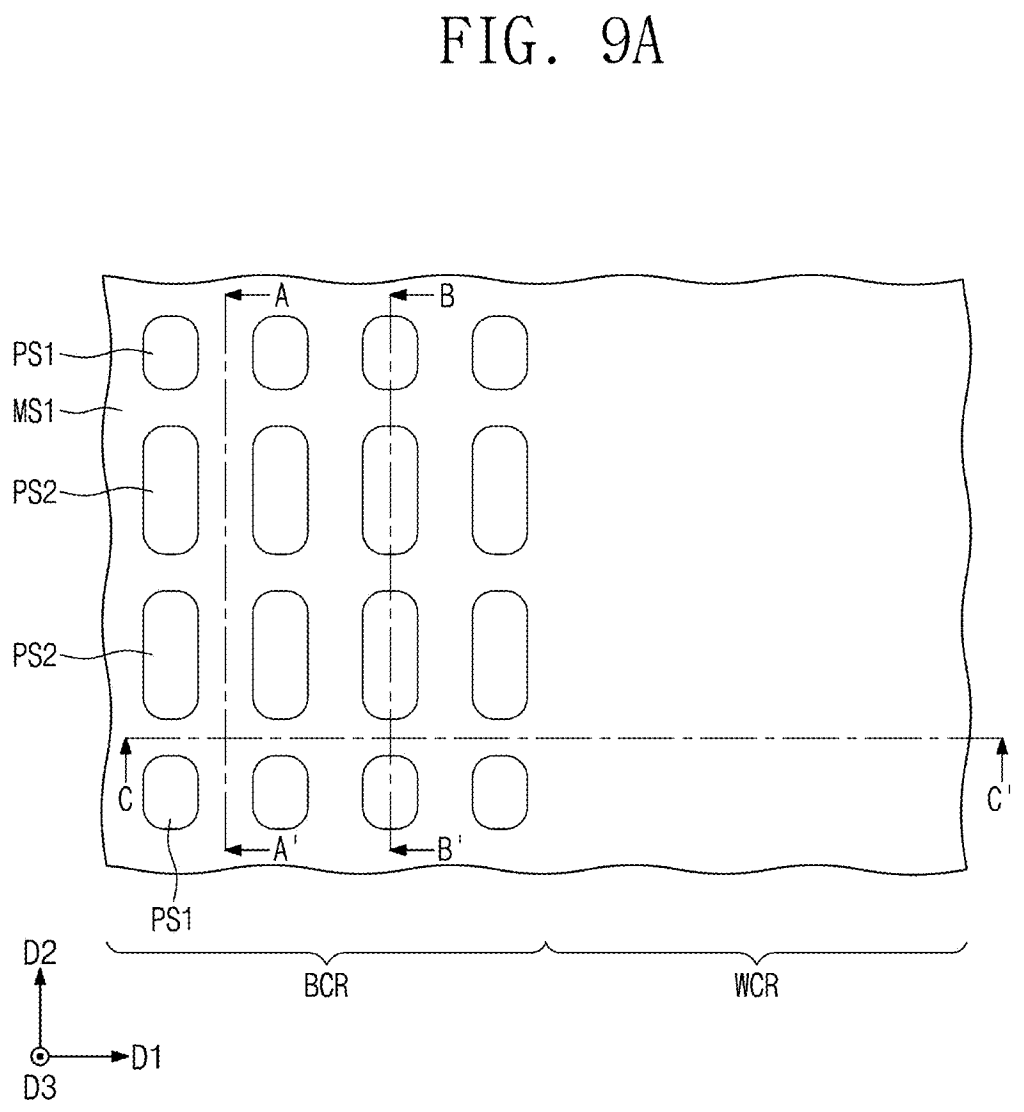
Figure 9B:
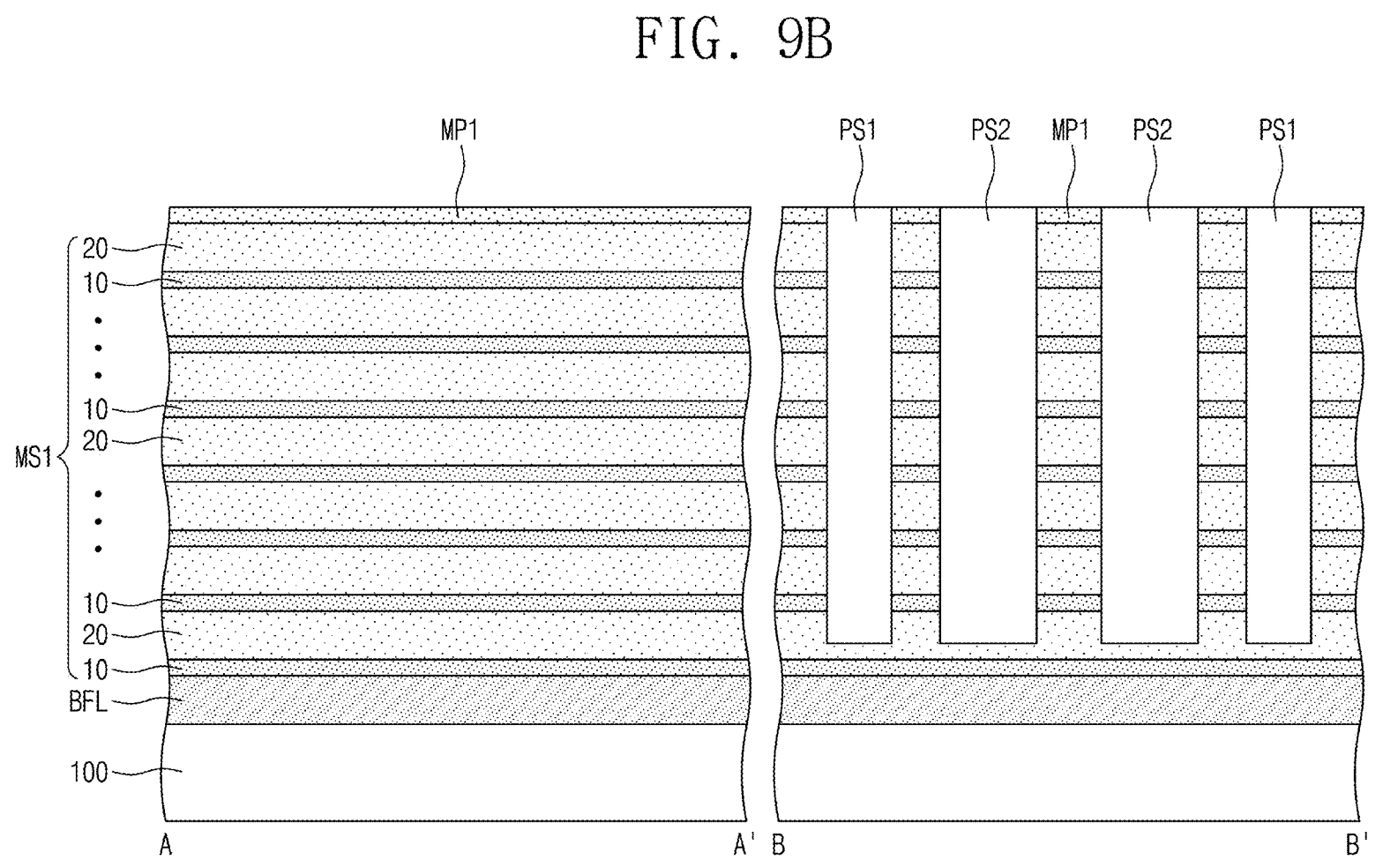
Figure 9C:
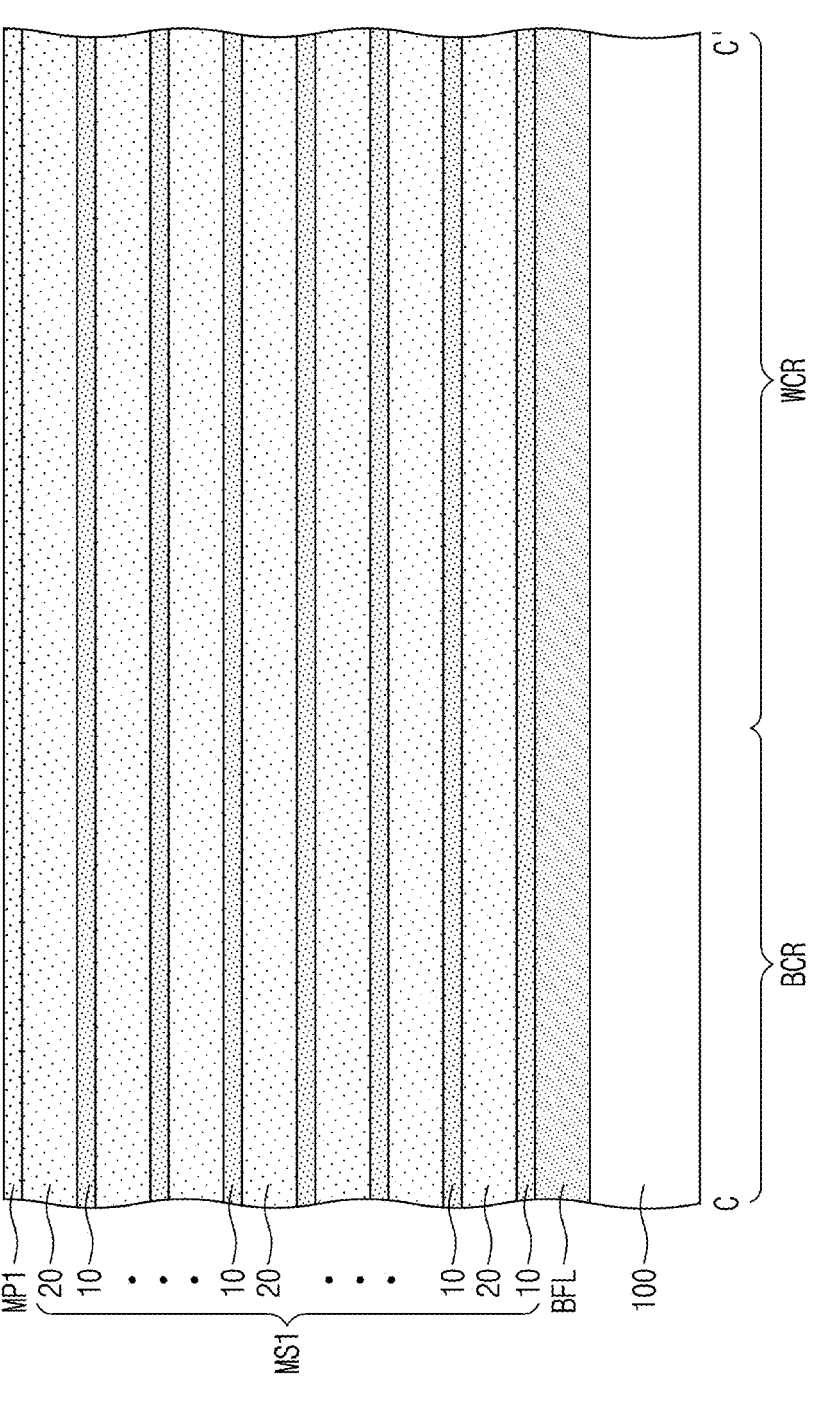

Next, referring to FIGS. 9A, 9B, and 9C, first and second preliminary separation patterns PS1 and PS2 may be formed to penetrate the first mold structure MS1 in the first region BCR. The first preliminary separation patterns PS1 may be arranged to be spaced apart from each other in the first direction D1, and the second preliminary separation patterns PS2 may be arranged to be spaced apart from the first preliminary separation patterns PS1 in the second direction D2. In addition, the first and second preliminary separation patterns PS1 and PS2 may be formed to be repeated in the second direction D2 in a mirror-symmetric manner.

The first and second preliminary separation patterns PS1 and PS2 may be spaced apart from each other in the first direction D1 by a first distance. The first preliminary separation patterns PS1 may be spaced apart from the second preliminary separation patterns PS2 in the second direction D2 by a second distance, which is smaller than the first distance.

When measured in the first direction D1, each of the first and second preliminary separation patterns PS1 and PS2 may have a first width. When measured in the second direction D2, a length of each first preliminary separation pattern PS1 may be smaller than a length of each second preliminary separation pattern 40.

The formation of the first and second preliminary separation patterns PS1 and PS2 may include forming first and second openings to penetrate the first mold structure MS1, using the first mask pattern MP1, and filling the first and second openings with an insulating material. Here, when the first and second openings are formed, the first and second openings may have bottom surfaces that are spaced apart from the top surface of the substrate 100. For example, at least one first semiconductor layer 10 and at least one second semiconductor layer 20 may be left between the bottom surfaces of the first and second preliminary separation patterns PS1 and PS2 and the substrate 100.

Thereafter, referring to FIG. 8, channel patterns and a second mold structure may be formed on the first region BCR (in S20). A method of forming the channel patterns and the second mold structure on the first region BCR will be described in more detail with reference to FIGS. 10A to 15C.

Figure 10A:
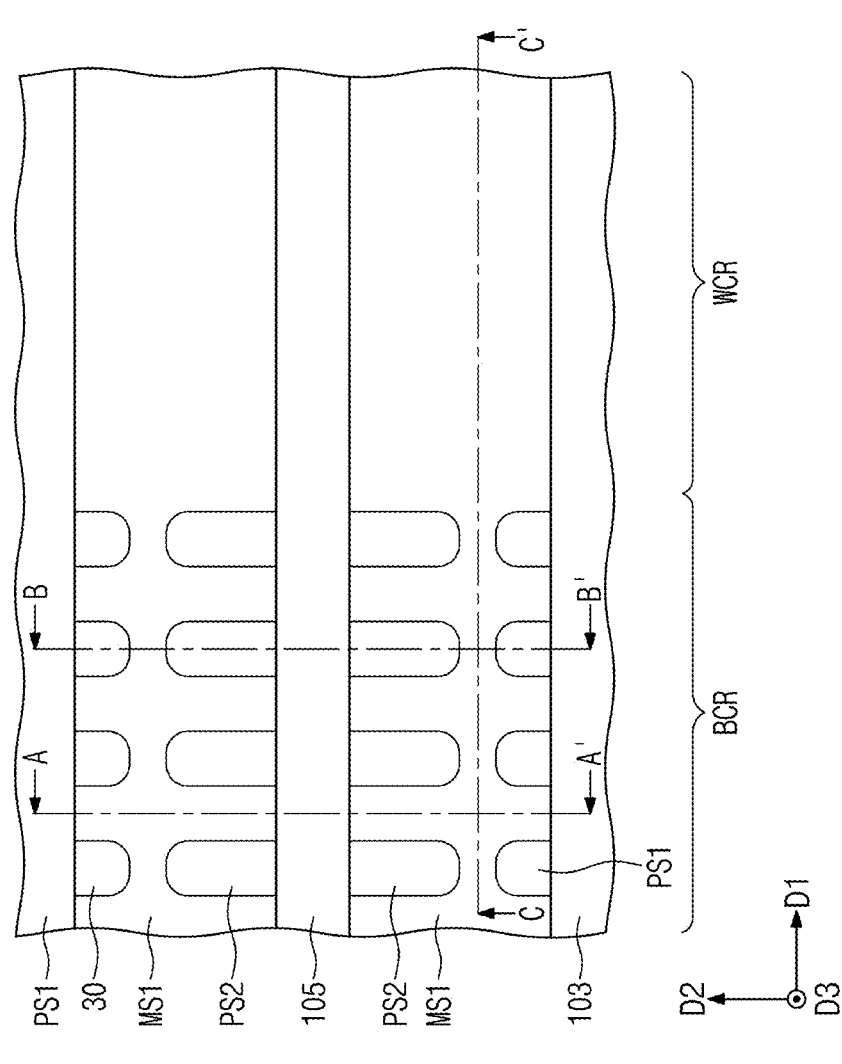
Figure 10B:
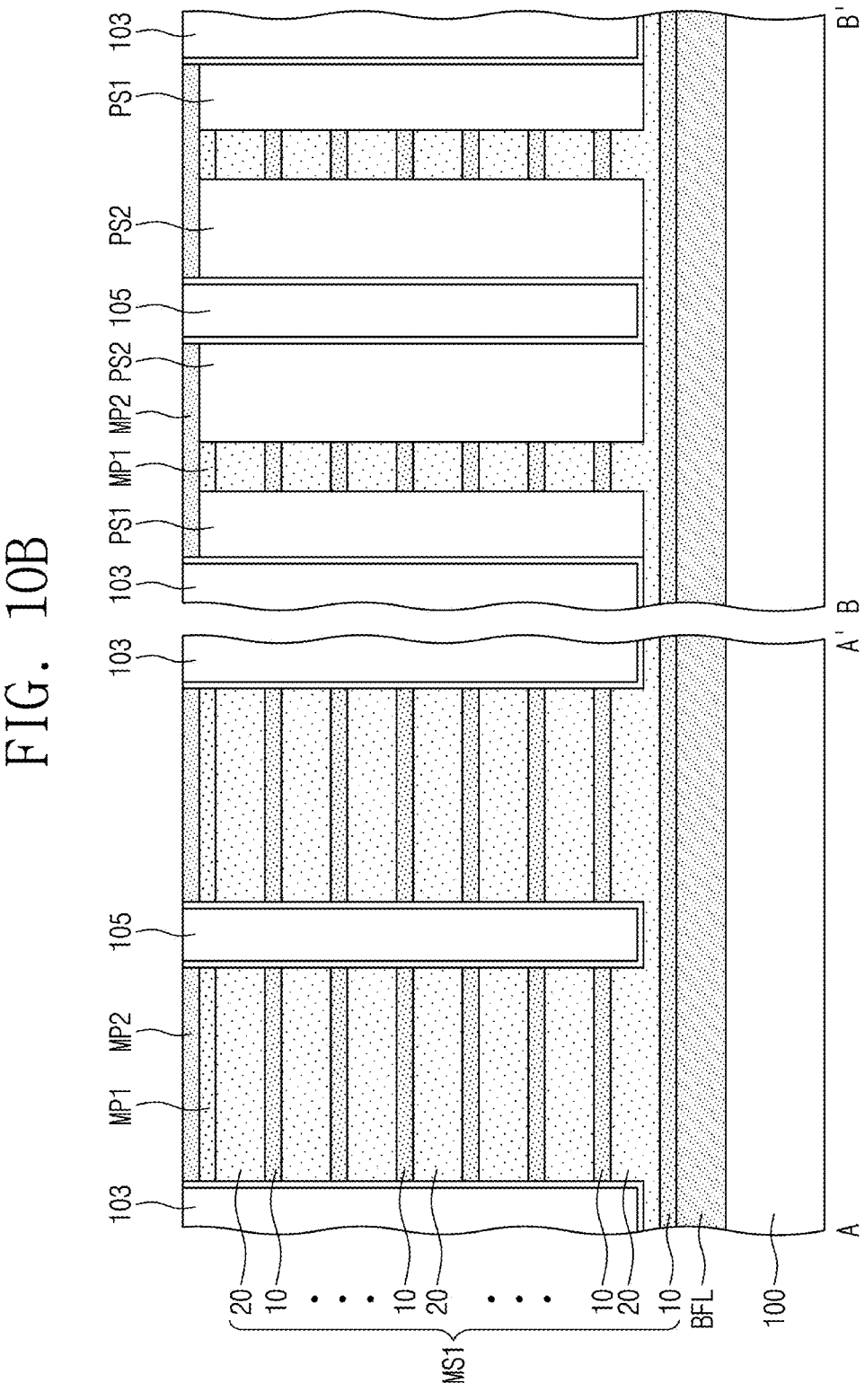
Figure 10C:
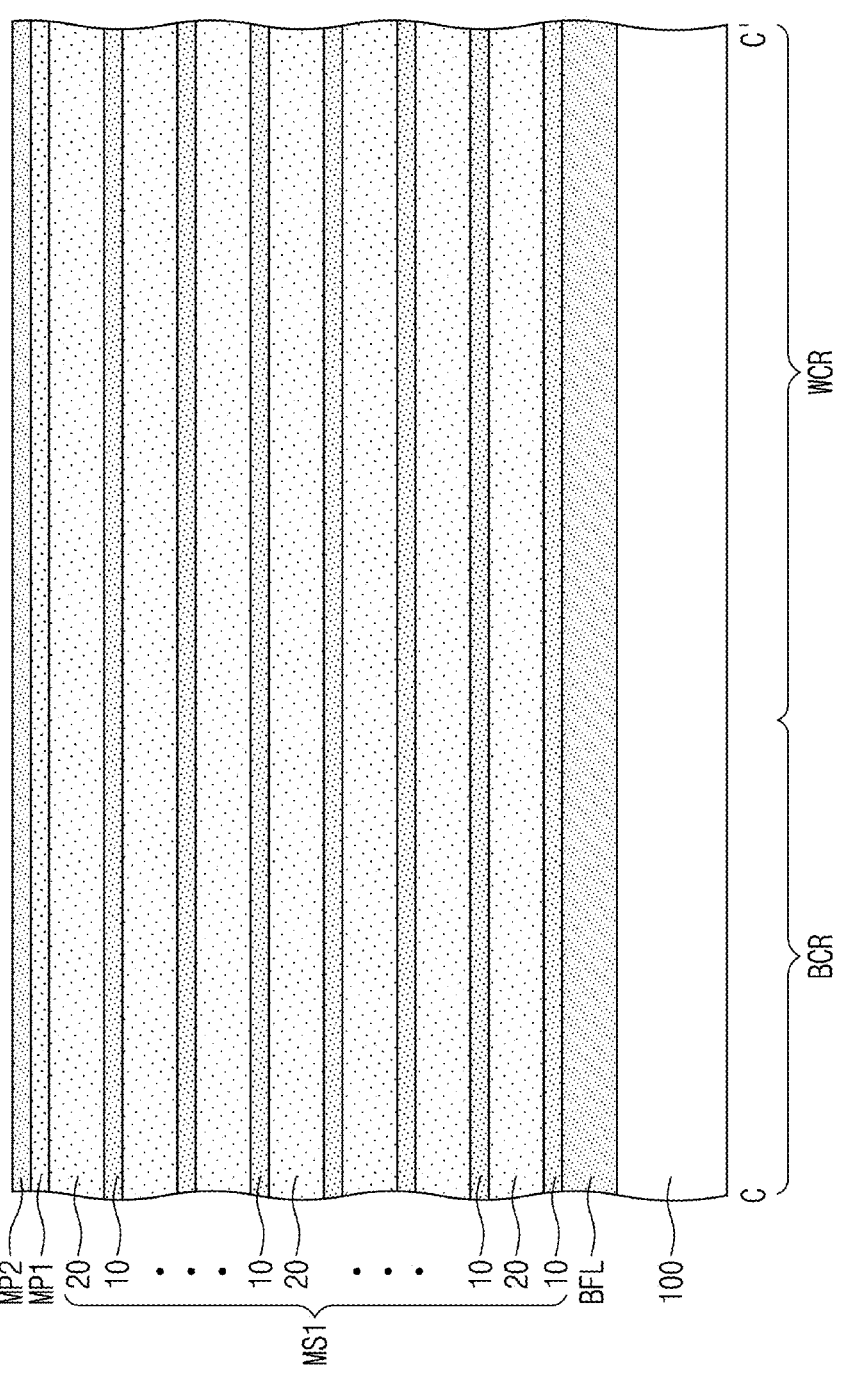

Referring to FIGS. 10A, 10B, and 10C, first and second preliminary line patterns 103 and 105 may be formed to extend in the first direction D1 and parallel to each other. The first and second preliminary line patterns 103 and 105 may extend from the first region BCR to the second region WCR.

The first preliminary line patterns 103 may be formed to be adjacent to the first preliminary separation patterns PS1 and to penetrate the first mold structure MS1. The second preliminary line pattern 105 may be provided between adjacent ones of the second preliminary separation patterns PS2 to penetrate the first mold structure.

The formation of the first and second preliminary line patterns 103 and 105 may include forming line-shaped second mask patterns MP2 on the first mask pattern MP1, anisotropically etching the first mold structure MS1 using the second mask patterns MP2 as an etch mask to form first and second trenches, and filling the first and second trenches with an insulating material. The first and second preliminary line patterns 103 and 105 may be formed of or include silicon oxide and/or silicon nitride.

Figure 11A:
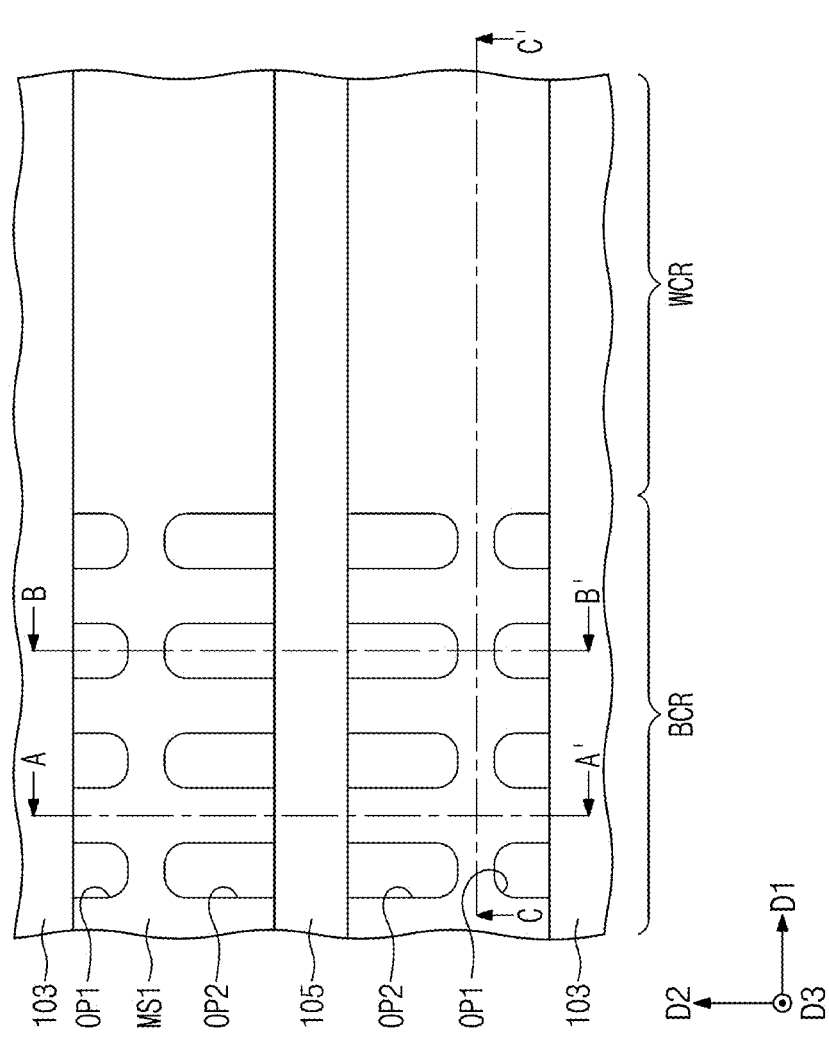
Figure 11B:
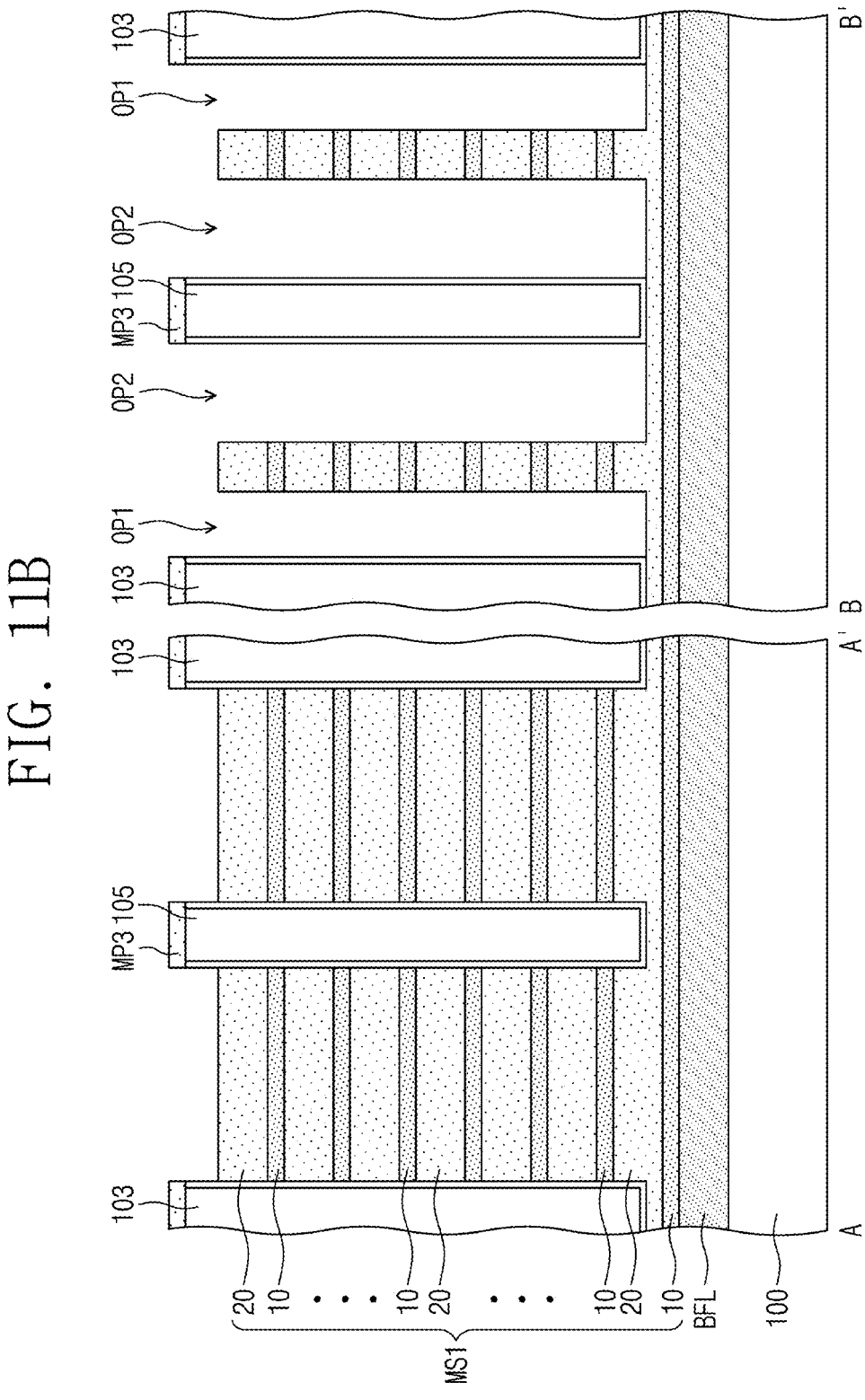
Figure 11C:
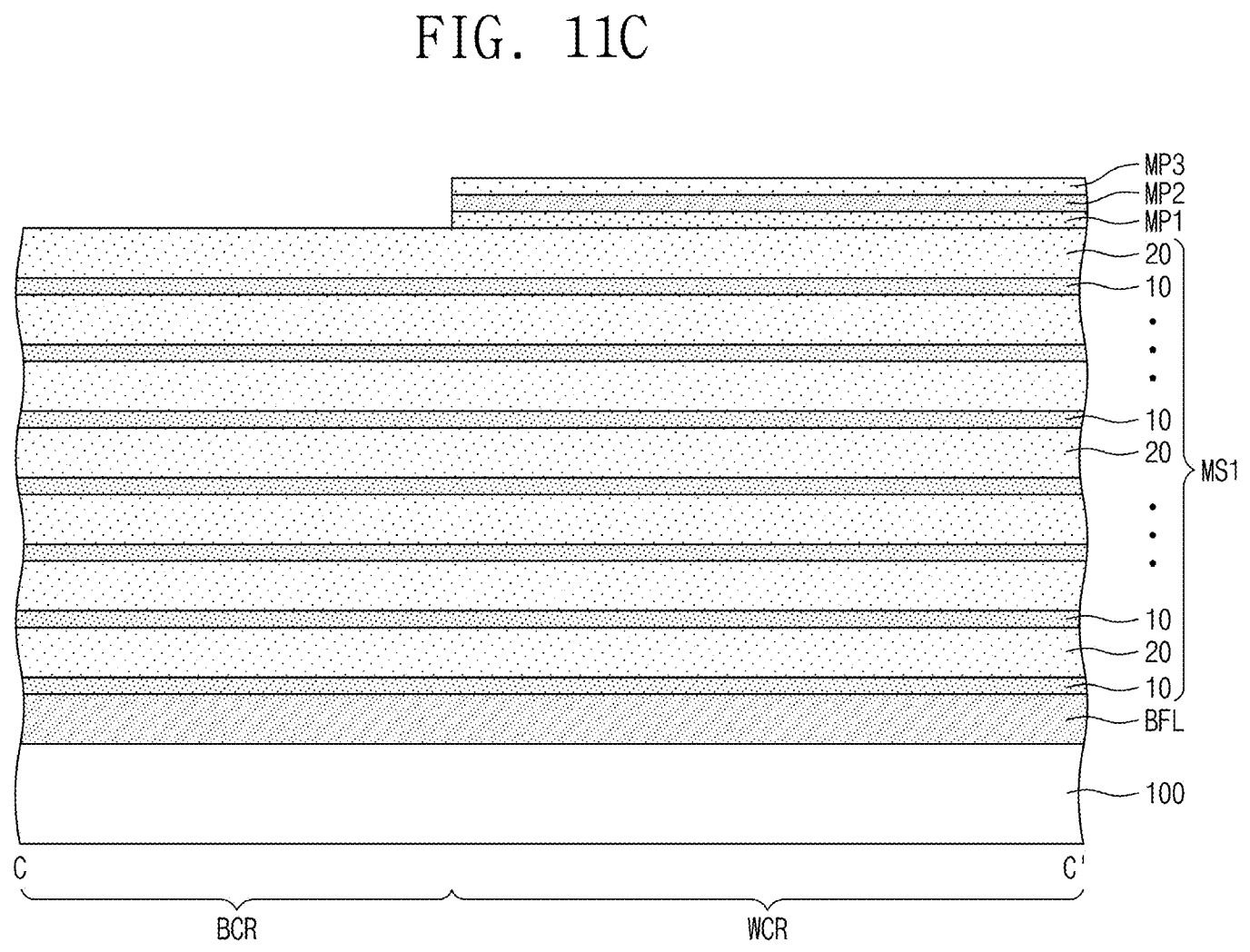

Referring to FIGS. 11A, 11B, and 11C, a third mask pattern MP3 may be formed on the first and second preliminary line patterns 103 and 105 in the first region BCR and on the second mask pattern MP2 in the second region WCR. The third mask pattern MP3 may have a line-shaped opening, which is extended in the first direction D1, in the first region BCR.

The first and second mask patterns MP1 and MP2 may be removed using the third mask pattern MP3 as an etch mask, and then, the first and second preliminary separation patterns PS1 and PS2 may be removed. Accordingly, the first and second openings OP1 and OP2 may be formed on the first region BCR again. In other words, the side surfaces of the first and second semiconductor layers 10 and 20 and the side surfaces of the first and second preliminary line patterns 103 and 105 may be exposed through the first and second openings OP1 and OP2.

Figure 12A:
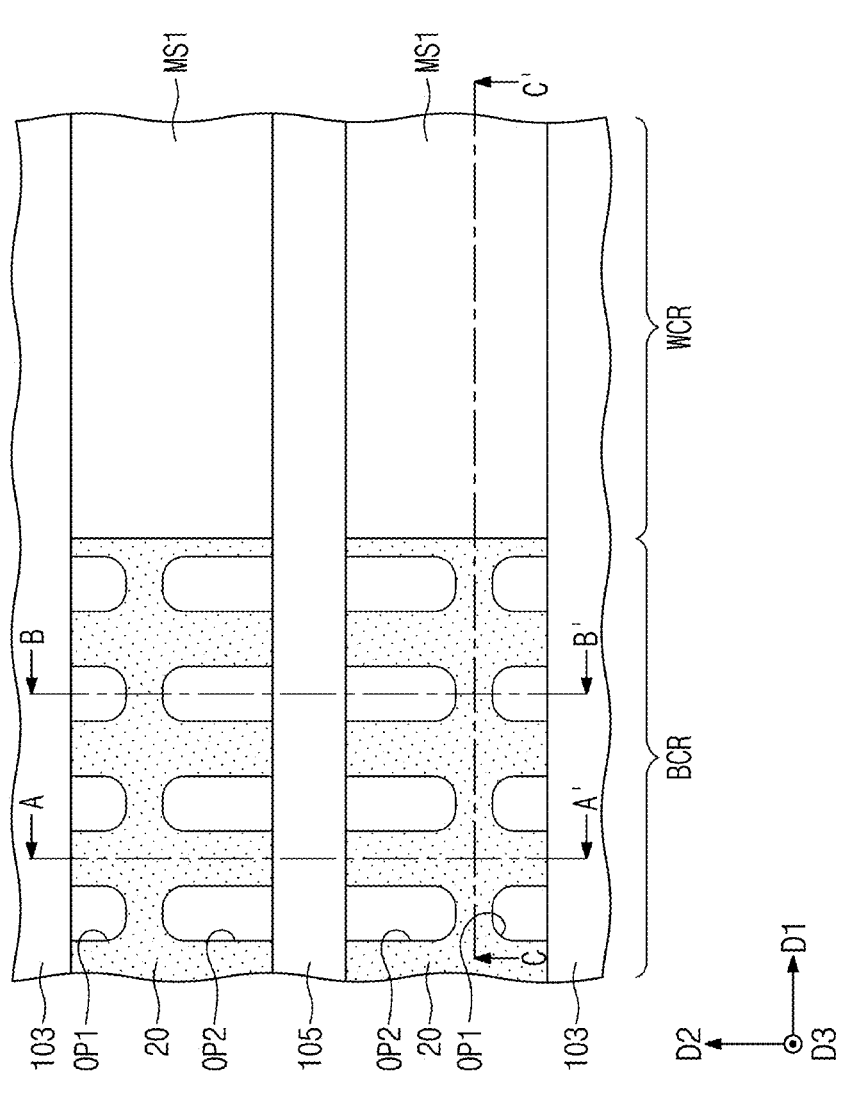
Figure 12B:
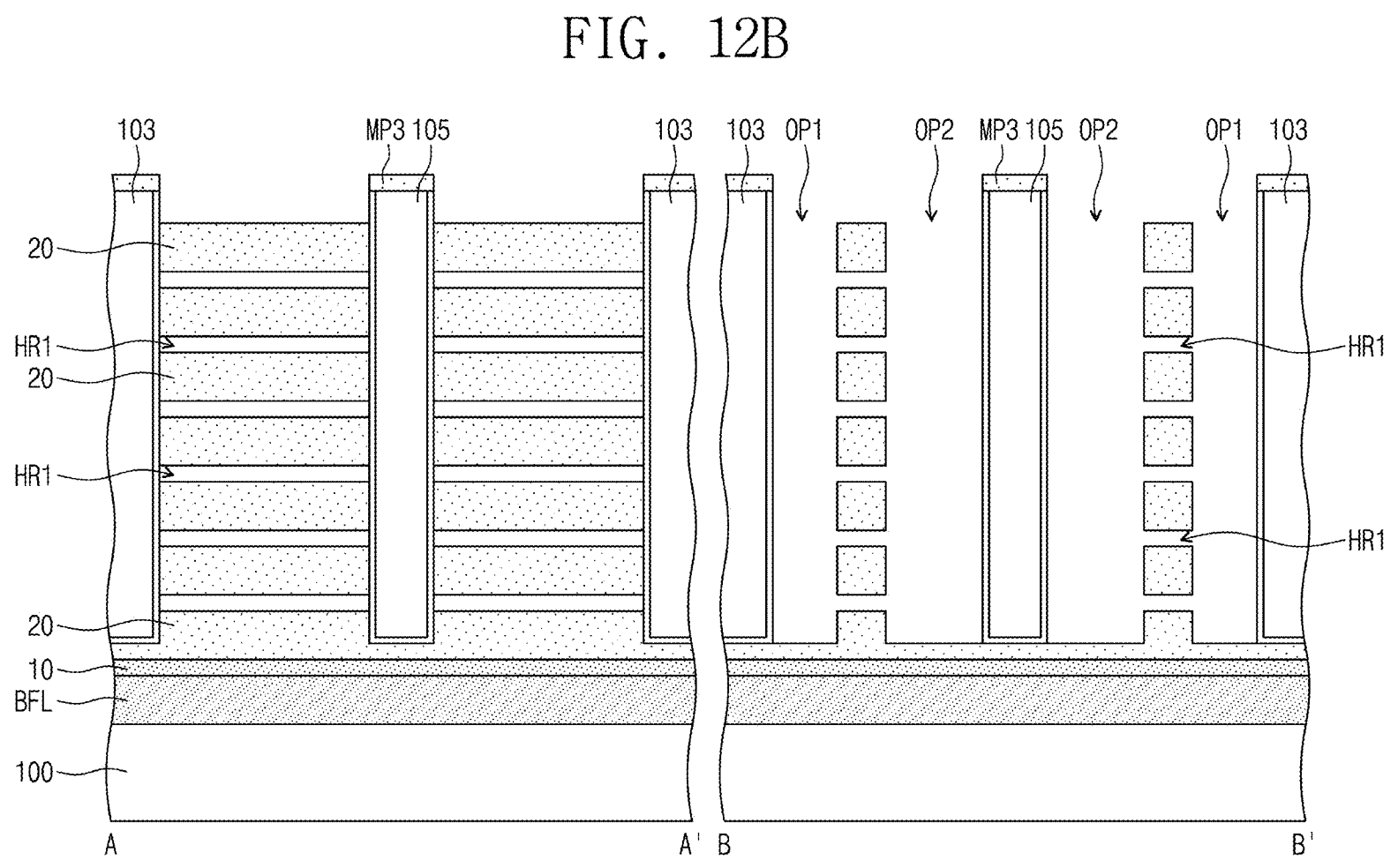
Figure 12C:
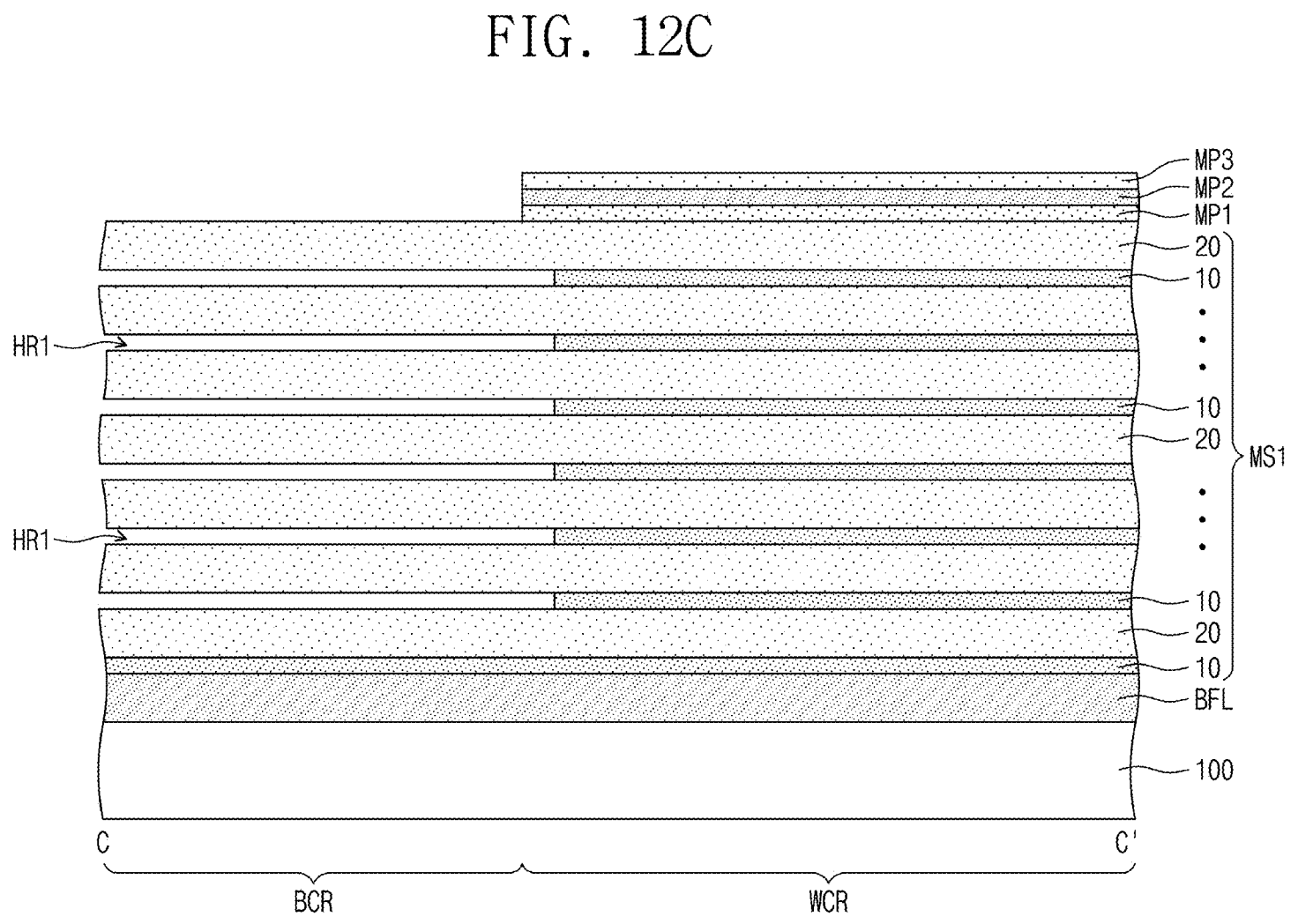

Referring to FIGS. 12A, 12B, and 12C, the first semiconductor layers 10, which are exposed through the first and second openings OP1 and OP2 in the first region BCR, may be removed to form first horizontal regions HR1 between vertically adjacent ones of the second semiconductor layers 20. When the first horizontal regions HR1 are formed in the first region BCR, the first semiconductor layers 10 in the second region WCR may not be etched and may be left.

The formation of the first horizontal regions HR1 may include isotropically etching the first semiconductor layers 10 through an etching process, which is performed to have an etch selectivity with respect to the substrate 100, the second semiconductor layers 20, and the first and second preliminary line patterns 103 and 105. Due to the presence of the first and second preliminary line patterns 103 and 105, the second semiconductor layers 20 may be vertically spaced apart from each other, without a collapsing issue during the removal of the first semiconductor layers 10.

A vertical thickness of the first horizontal regions HR1 (i.e., a vertical distance between adjacent ones of the second semiconductor layers 20) may be substantially equal to the thickness of the first semiconductor layer 10.

Figure 13A:
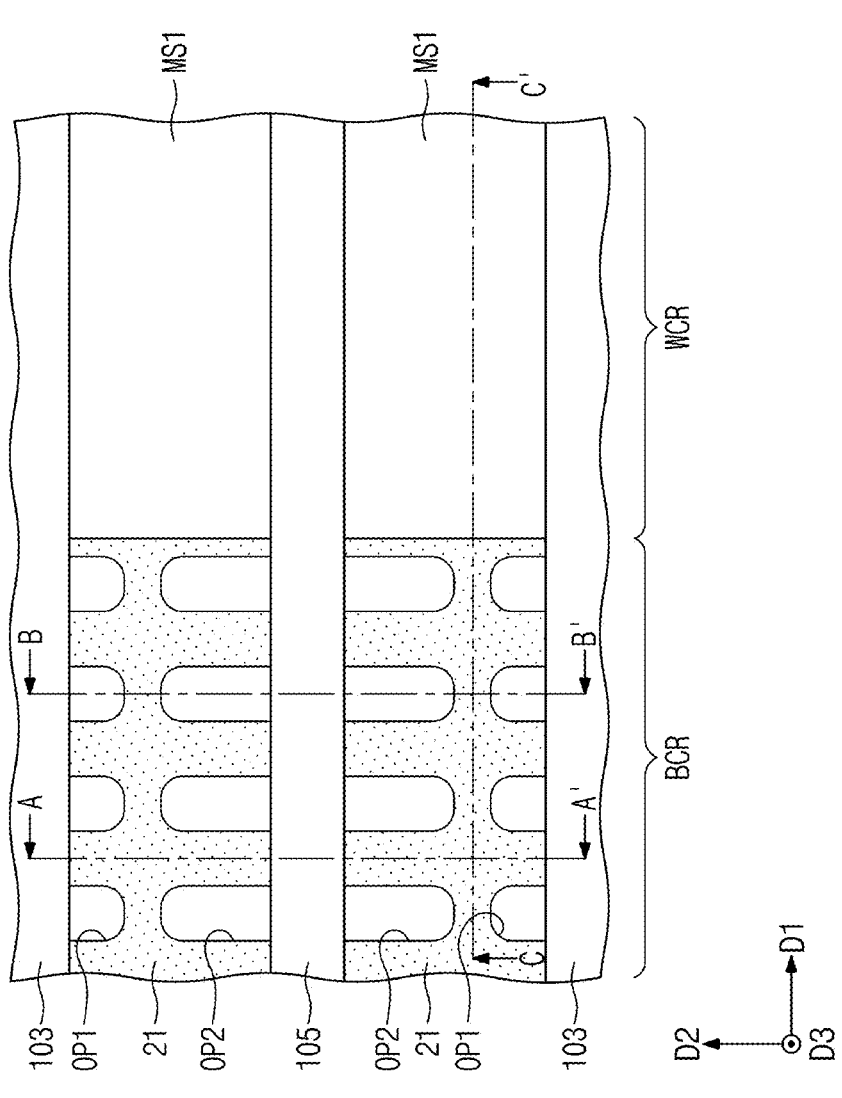
Figure 13B:
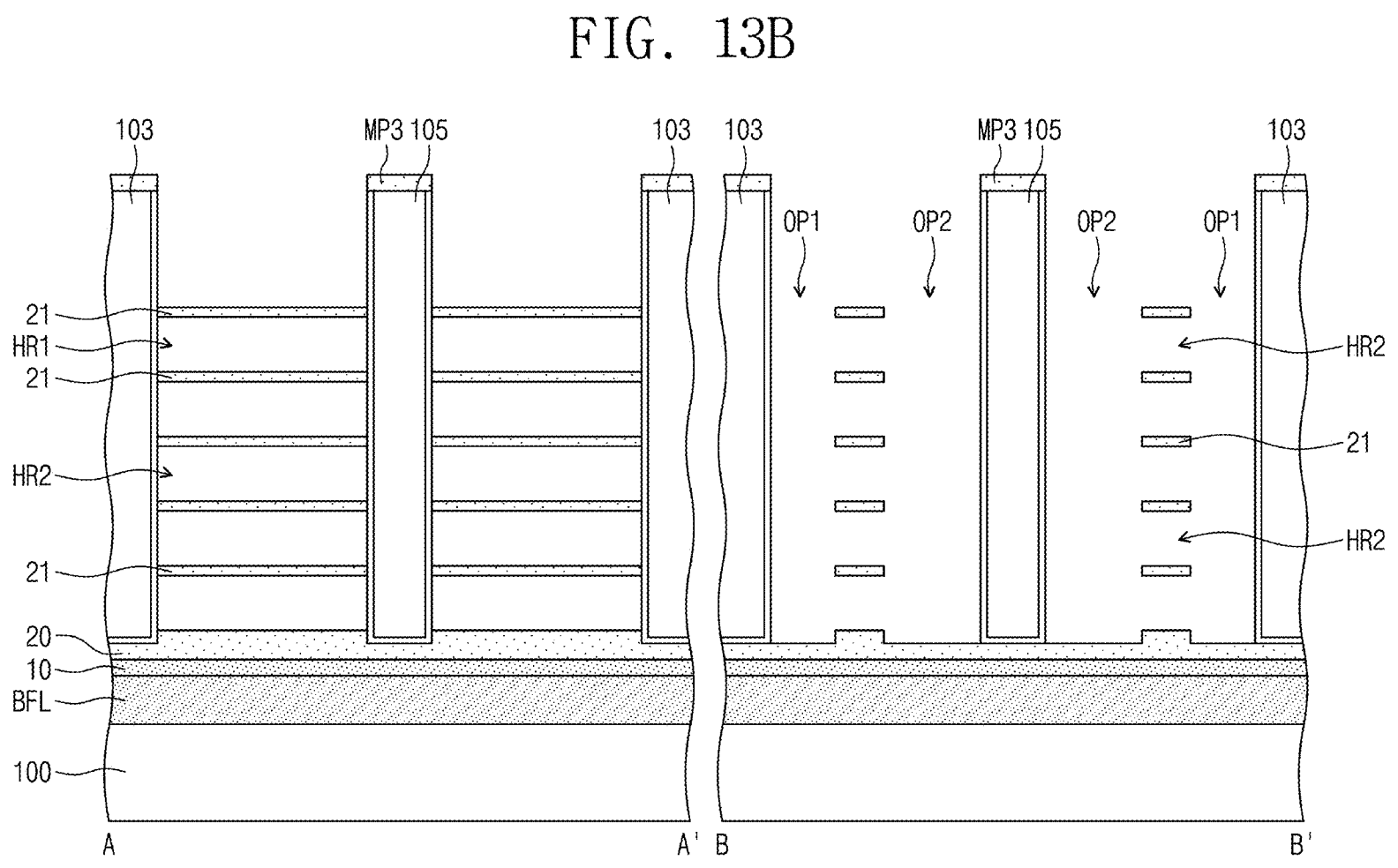
Figure 13C:
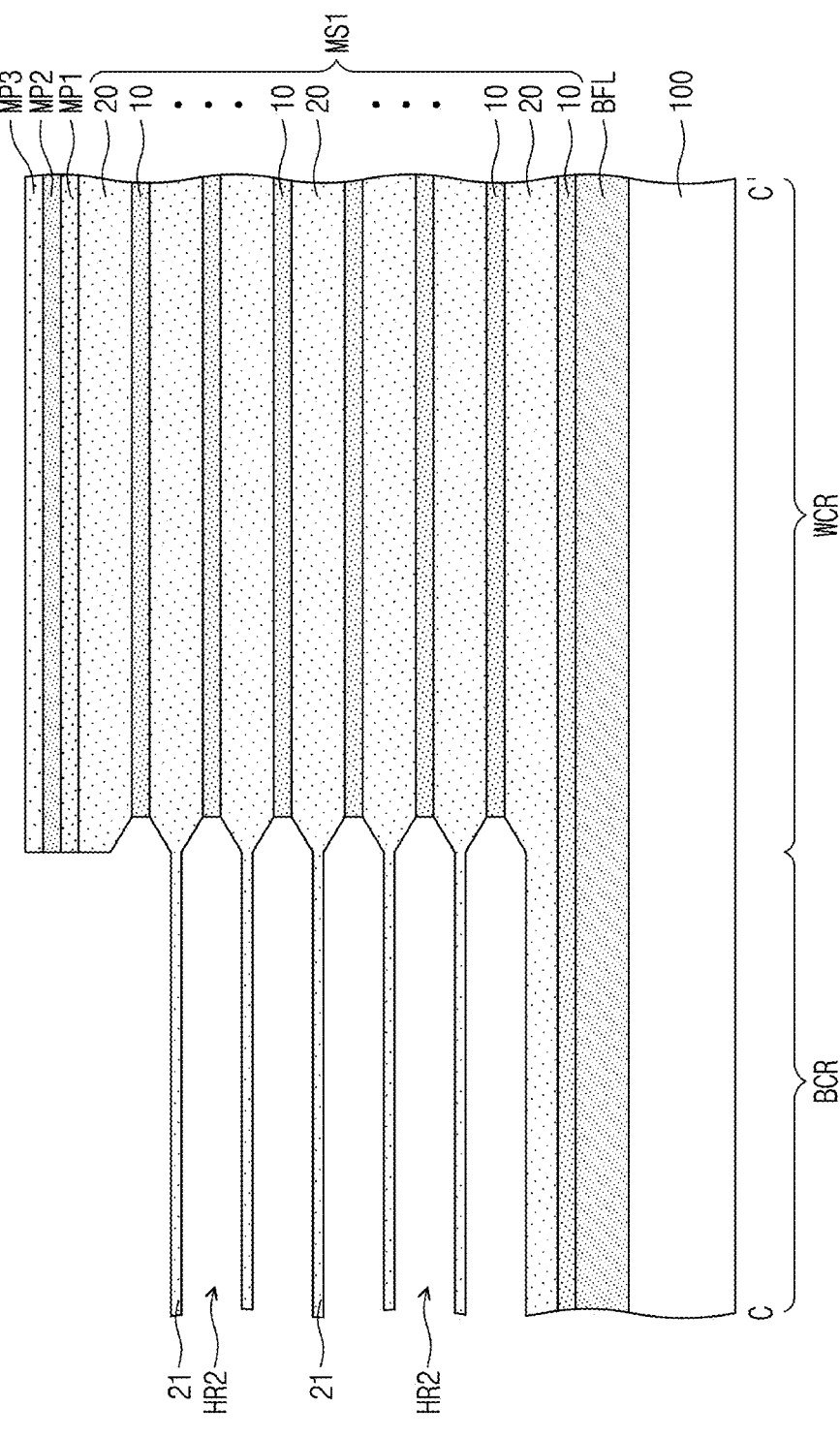

Referring to FIGS. 13A, 13B, and 13C, a trimming process may be performed to reduce thicknesses of the second semiconductor layers 20 exposed through the first horizontal regions HR1. The trimming process may include etching top and bottom surfaces of the second semiconductor layers 20, which are exposed through the first horizontal regions HR1. As an example, the trimming process may include an isotropic etching process, which is performed using an etch recipe having an etch selectivity with respect to the upper insulating layer TIL and the first and second preliminary line patterns 103 and 105.

As a result of the trimming process, a thickness of each of the second semiconductor layers 20 may be reduced to form preliminary channel layers 21. Furthermore, a vertical thickness of the first horizontal regions HR1 may be increased, and in this case, second horizontal regions HR2 may be respectively formed between vertically adjacent ones of the preliminary channel layers 21.

Figure 14A:
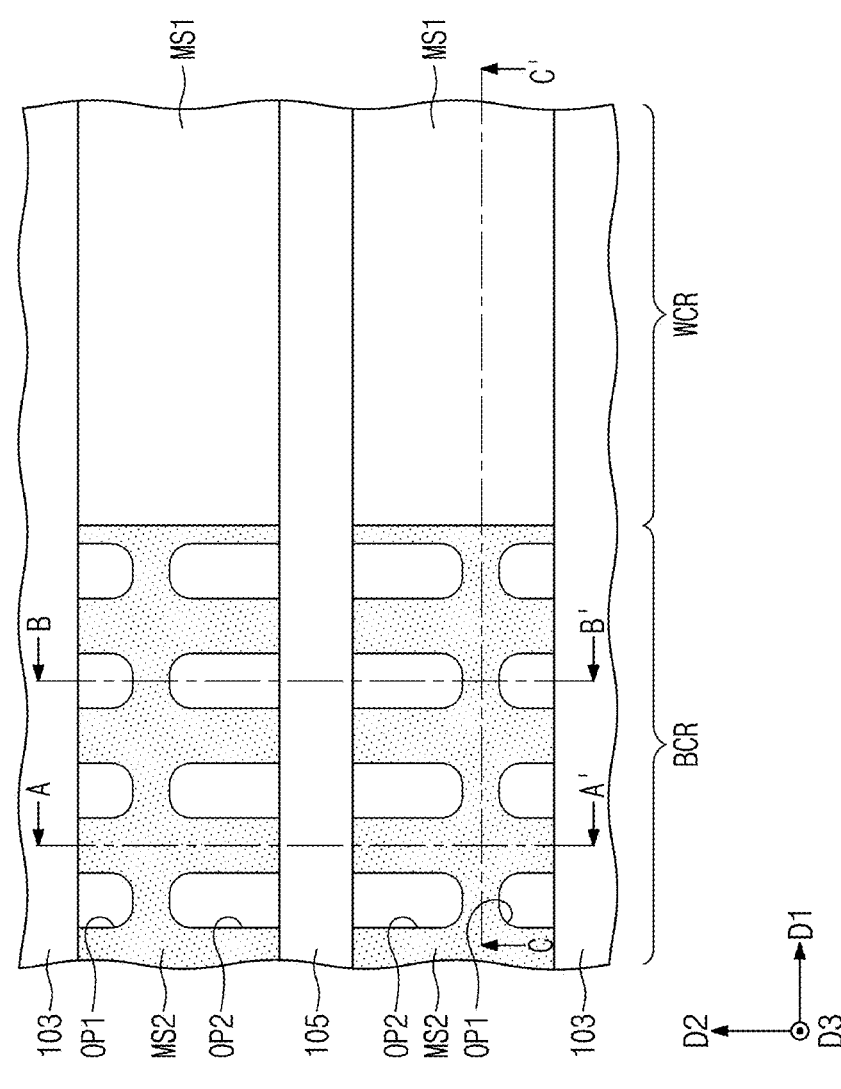
Figure 14B:
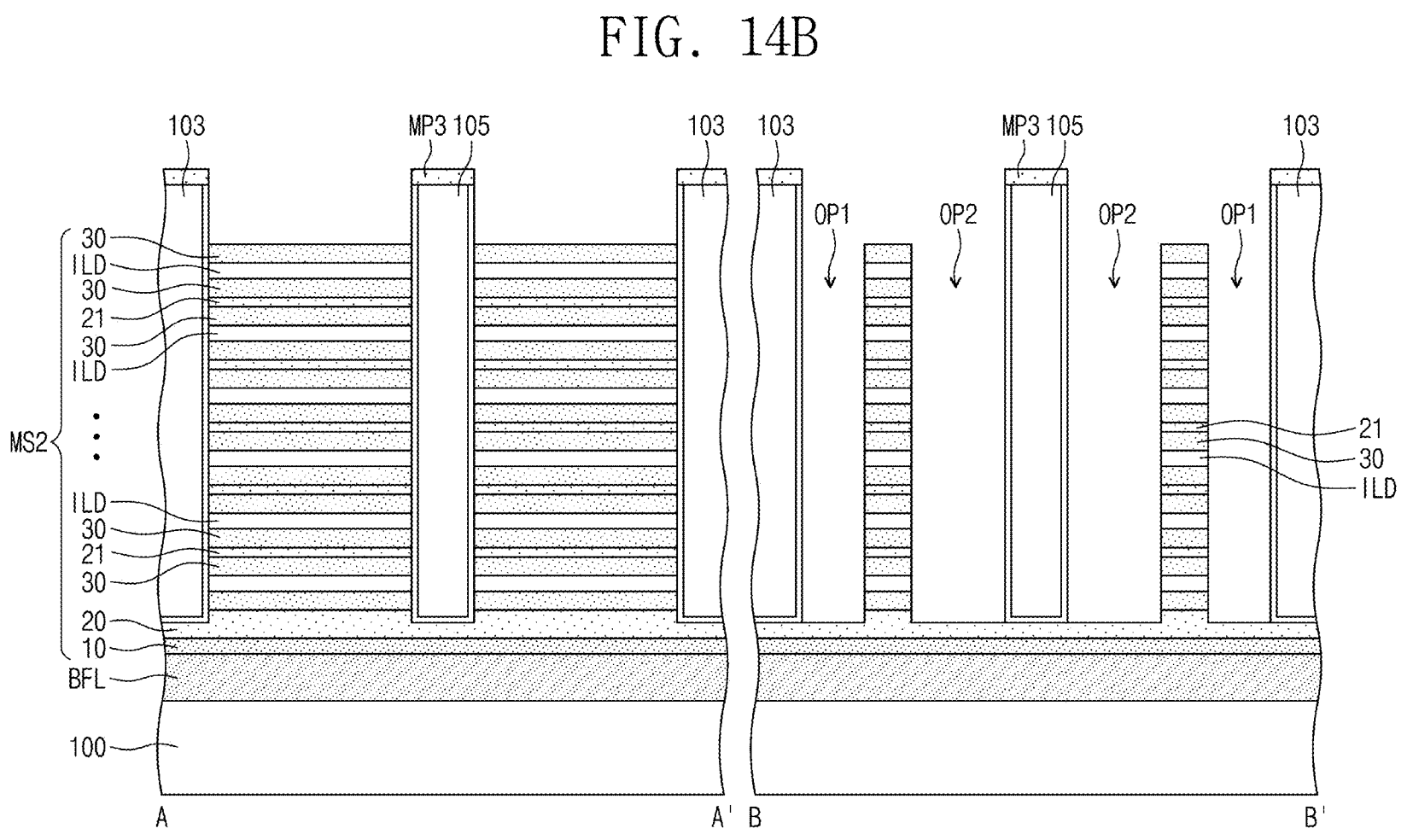
Figure 14C:
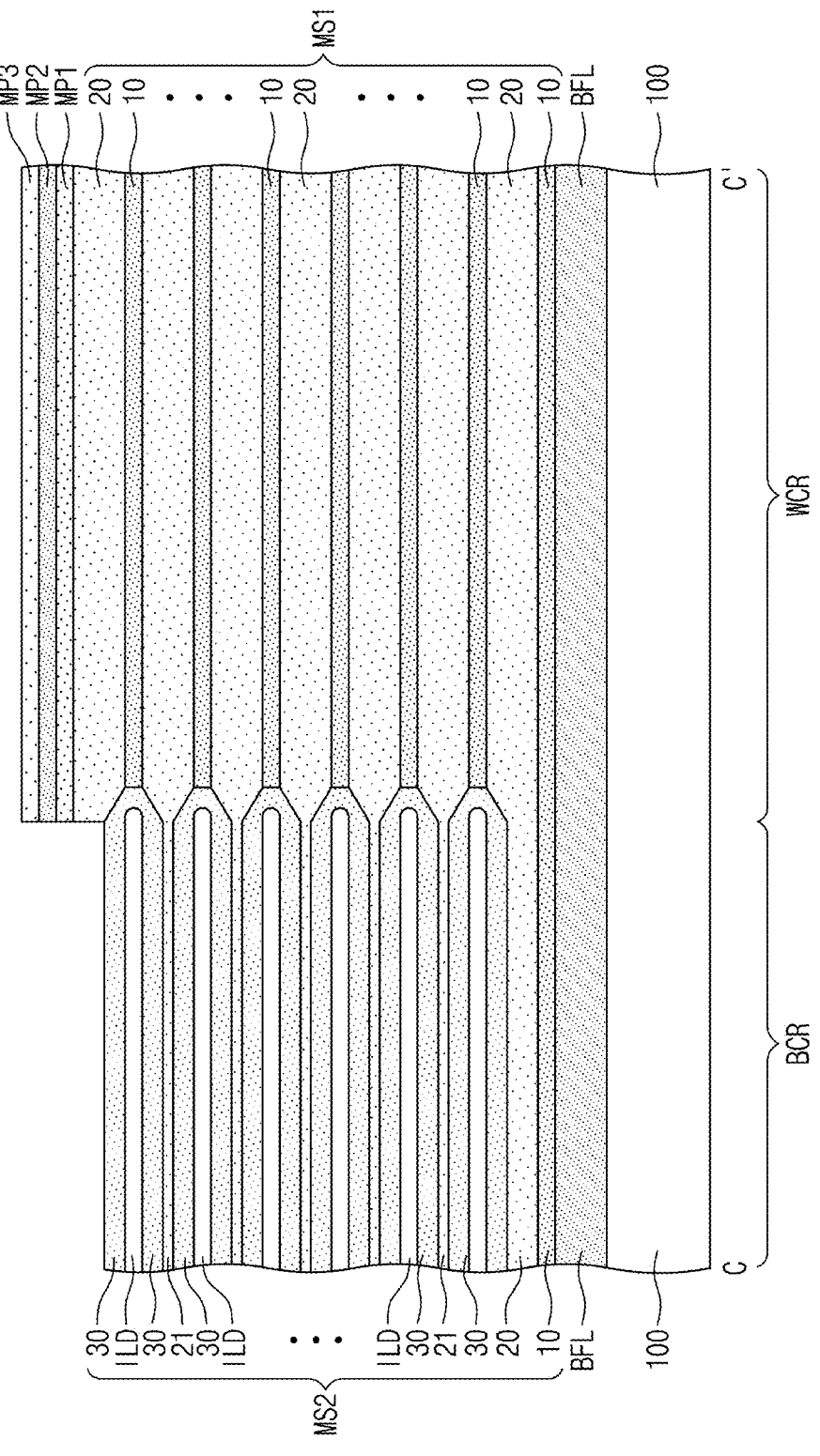

Referring to FIGS. 14A, 14B, and 14C, a second mold structure MS2 may be formed on the first region BCR by forming the sacrificial patterns 30 and the interlayer insulating patterns ILD in the second horizontal regions HR2.

The second mold structure MS2 may be formed by sequentially depositing a sacrificial layer and an interlayer insulating layer on surfaces of the preliminary channel layers 21 and then sequentially performing a partial etching process on the interlayer insulating layer and the sacrificial layer.

In more detail, the sacrificial layer and the interlayer insulating layer may be sequentially deposited on the surfaces of the preliminary channel layers 21. Here, the sacrificial layer may be deposited to have a thickness that is smaller than half of a vertical thickness of the second horizontal region HR2. In this case, after the deposition of the sacrificial layer, gap regions may be defined between vertically adjacent ones of the preliminary channel layers 21. Next, the interlayer insulating layer may be formed on the sacrificial layer to fill the second horizontal regions HR2 provided with the sacrificial layer.

After the formation of the interlayer insulating layer, the interlayer insulating patterns ILD may be formed by etching portions of the interlayer insulating layer exposed through the first and second openings OP1 and OP2. The interlayer insulating patterns ILD may be formed by isotropically etching the interlayer insulating layer until the sacrificial layer is exposed to the first and second openings OP1 and OP2. The interlayer insulating patterns ILD may be vertically separated from each other by the isotropic etching process.

After the formation of the interlayer insulating patterns ILD, the sacrificial patterns 30 may be respectively formed between the interlayer insulating patterns ILD and the preliminary channel layers 21 by performing an isotropic etching process on the sacrificial layer to expose the side surfaces of the preliminary channel layers 21.

After the formation of the second mold structure MS2, the side surfaces of the preliminary channel layers 21, the side surfaces of the sacrificial patterns 30, and the side surfaces of the interlayer insulating patterns ILD may be exposed through the first and second openings OP1 and OP2.

The sacrificial patterns 30 may be formed by depositing a material having an etch selectivity with respect to the substrate 100 and the preliminary channel layers 21. The sacrificial patterns 30 may be formed of or include at least one of silicon oxide, silicon nitride, or silicon oxynitride.

The interlayer insulating patterns ILD may be formed of or include an insulating material, which has an etch selectivity with respect to the preliminary channel layers 21, the sacrificial patterns 30, and the substrate 100. In an embodiment, the interlayer insulating patterns ILD may be formed of or include silicon oxide.

Figure 15A:
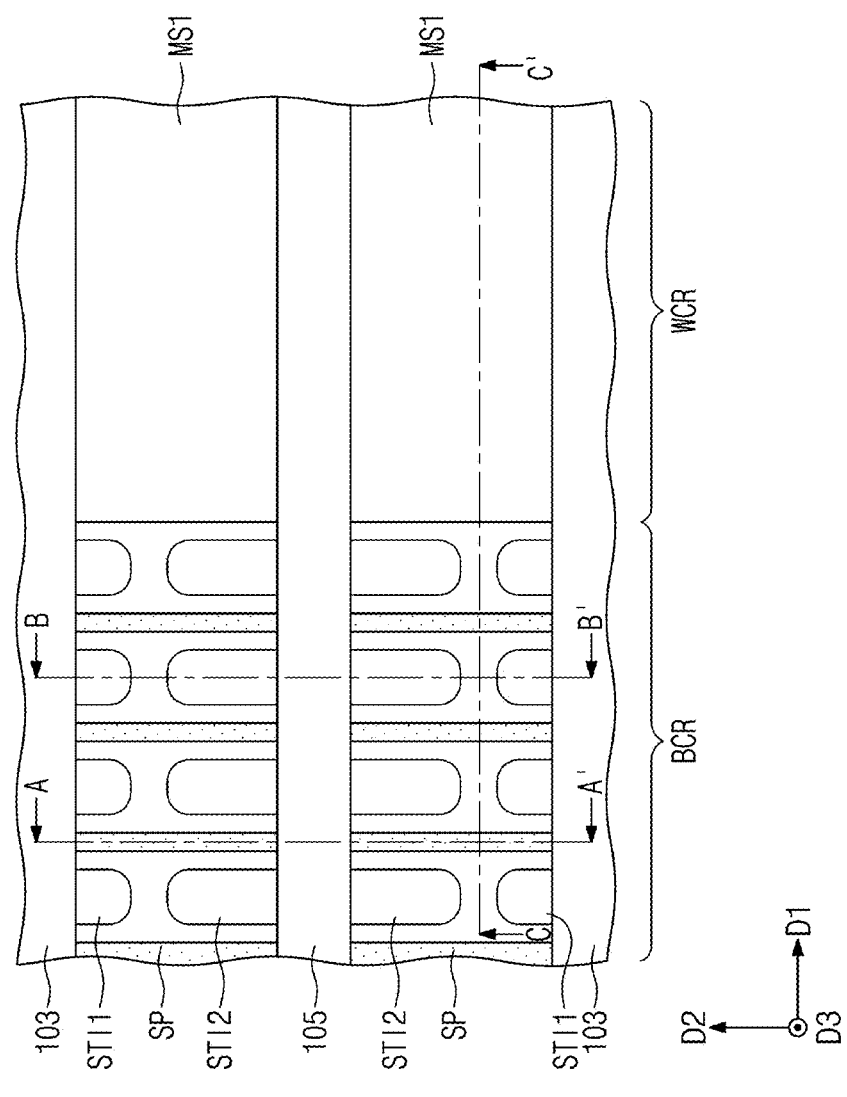
Figure 15B:
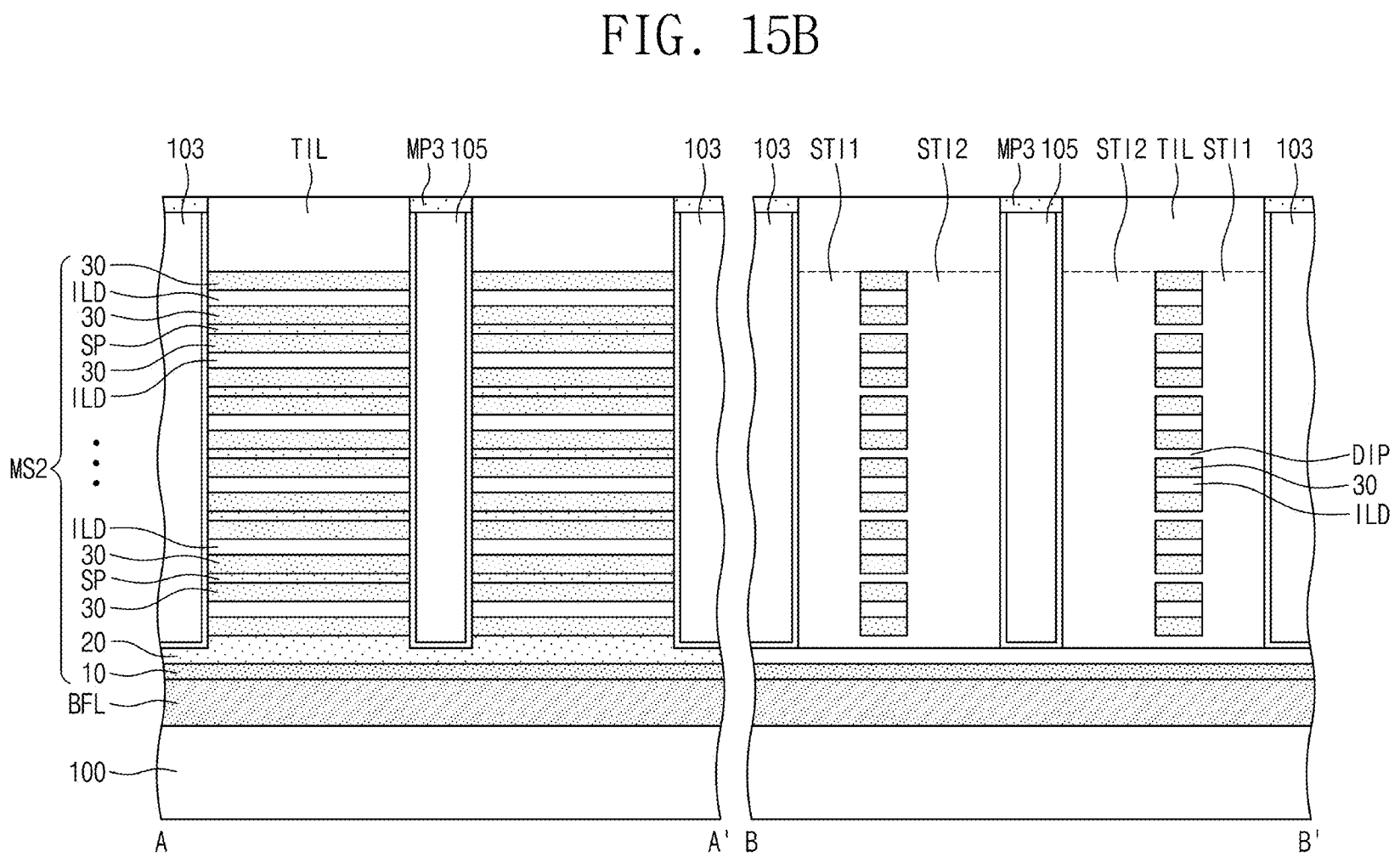
Figure 15C:
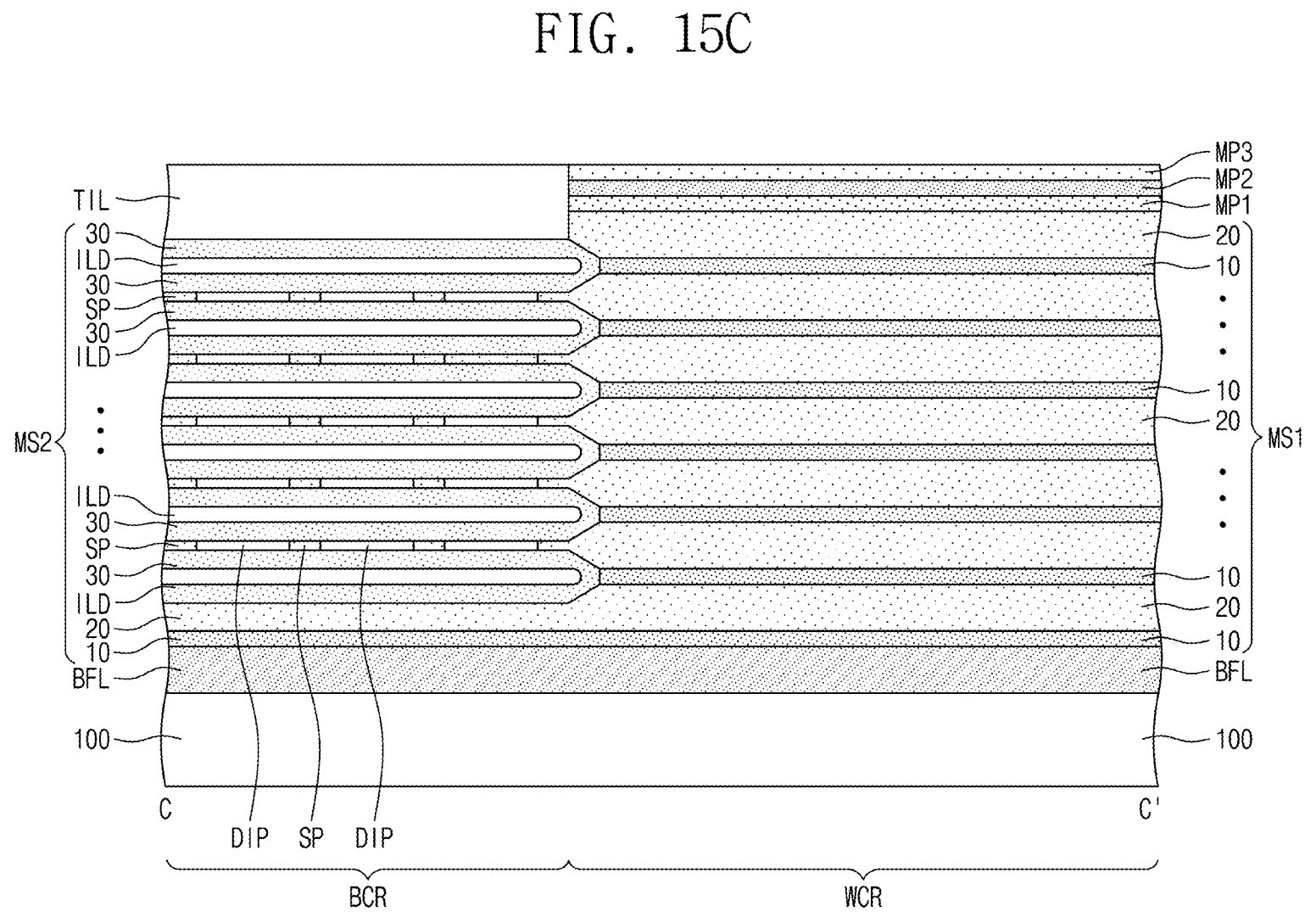

Referring to FIGS. 15A, 15B, and 15C, in the first region BCR, an etching process may be performed on portions of the preliminary channel layers 21, which are exposed through the first and second openings OP1 and OP2. Accordingly, the channel patterns SP may be formed to be spaced apart from each other in the first direction D1.

The formation of the channel patterns SP may include isotropically etching the preliminary channel layers 21, which are exposed through the first and second openings OP1 and OP2. That is, the preliminary channel layers 21 may be laterally etched in the first and second directions D1 and D2 by an etchant material, which is supplied through the first and second openings OP1 and OP2. Here, since a distance between the first openings OP1 and a distance between the second openings OP2 are larger than a distance between the first and second openings OP1 and OP2, portions of the preliminary channel layers 21 may be cut in the first direction D1 to form the channel patterns SP. As a result of the isotropic etching process, a width of each of the channel patterns SP in the first direction D1 may be larger in a center portion than in a side surface portion. Alternatively, each of the channel patterns SP may have a uniform width in the first direction D1.

Since the channel patterns SP are formed through the above process, gap regions may be formed between vertically adjacent ones of the sacrificial patterns 30 to expose the side surfaces of the channel patterns SP. The gap regions may correspond to regions, which are formed by etching the preliminary channel layers 21.

After the formation of the channel patterns SP, the first and second insulating isolation patterns STI1 and STI2 may be formed to fill the first and second openings OP1 and OP2, and the upper insulating layer TIL may be formed on the second mold structure MS2.

The upper insulating layer TIL and the first and second insulating isolation patterns STI1 and STI2 may be formed of or include at least one of silicon oxide, silicon oxynitride, or insulating materials, which are formed using a spin-onglass (SOG) technology. The upper insulating layer TIL and the first and second insulating isolation patterns STI1 and STI2 may be formed by depositing a separation insulating layer to fill the first and second openings OP1 and OP2 and planarizing the separation insulating layer to expose a top surface of the third mask pattern MP3.

When the upper insulating layer TIL and the first and second insulating isolation patterns STI1 and STI2 are formed, the gap regions may be filled with an insulating material. Accordingly, the dummy insulating patterns DIP may be formed between the channel patterns SP, which are adjacent to each other in the first direction D1, in the first region BCR.

Thereafter, referring to FIG. 8, a third mold structure MS3 may be formed in the second region WCR (in S30), after the formation of the channel patterns SP and the second mold structure MS2 in the first region BCR. The formation of the third mold structure MS3 may be described with reference to FIGS. 16A to 16E.

Figure 16A:
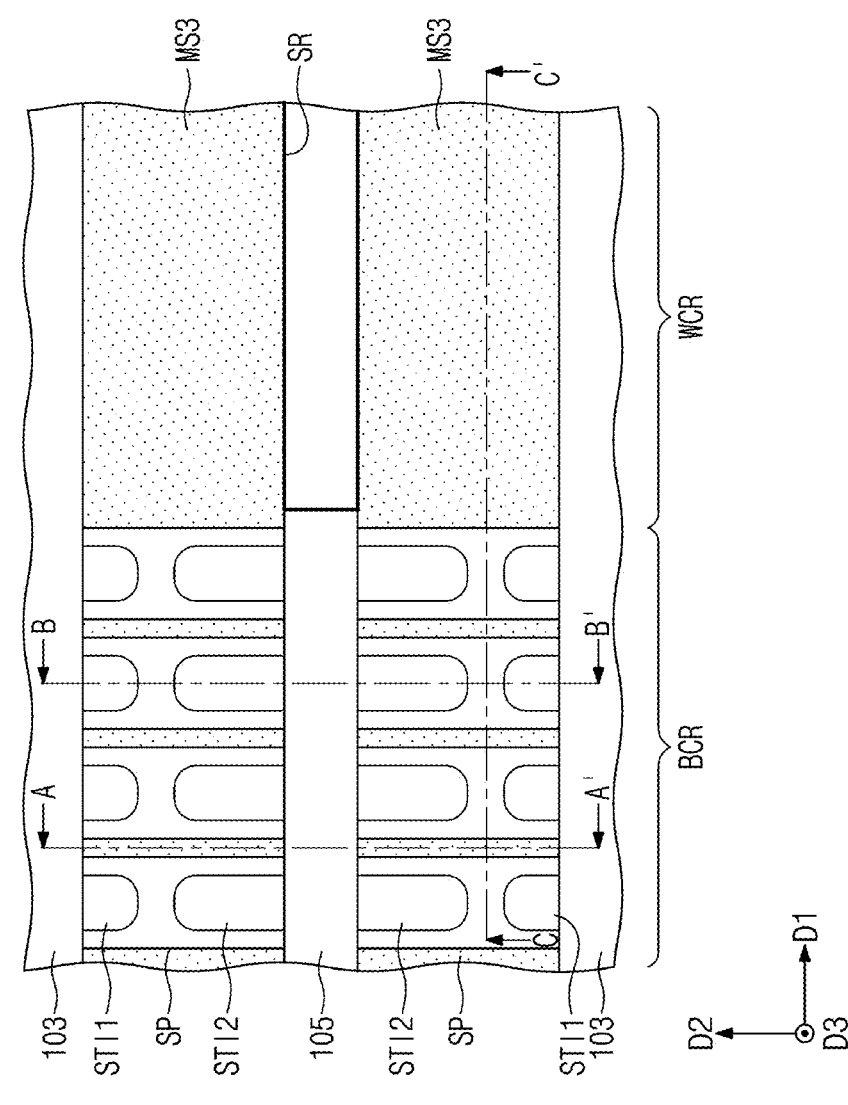
Figure 16B:
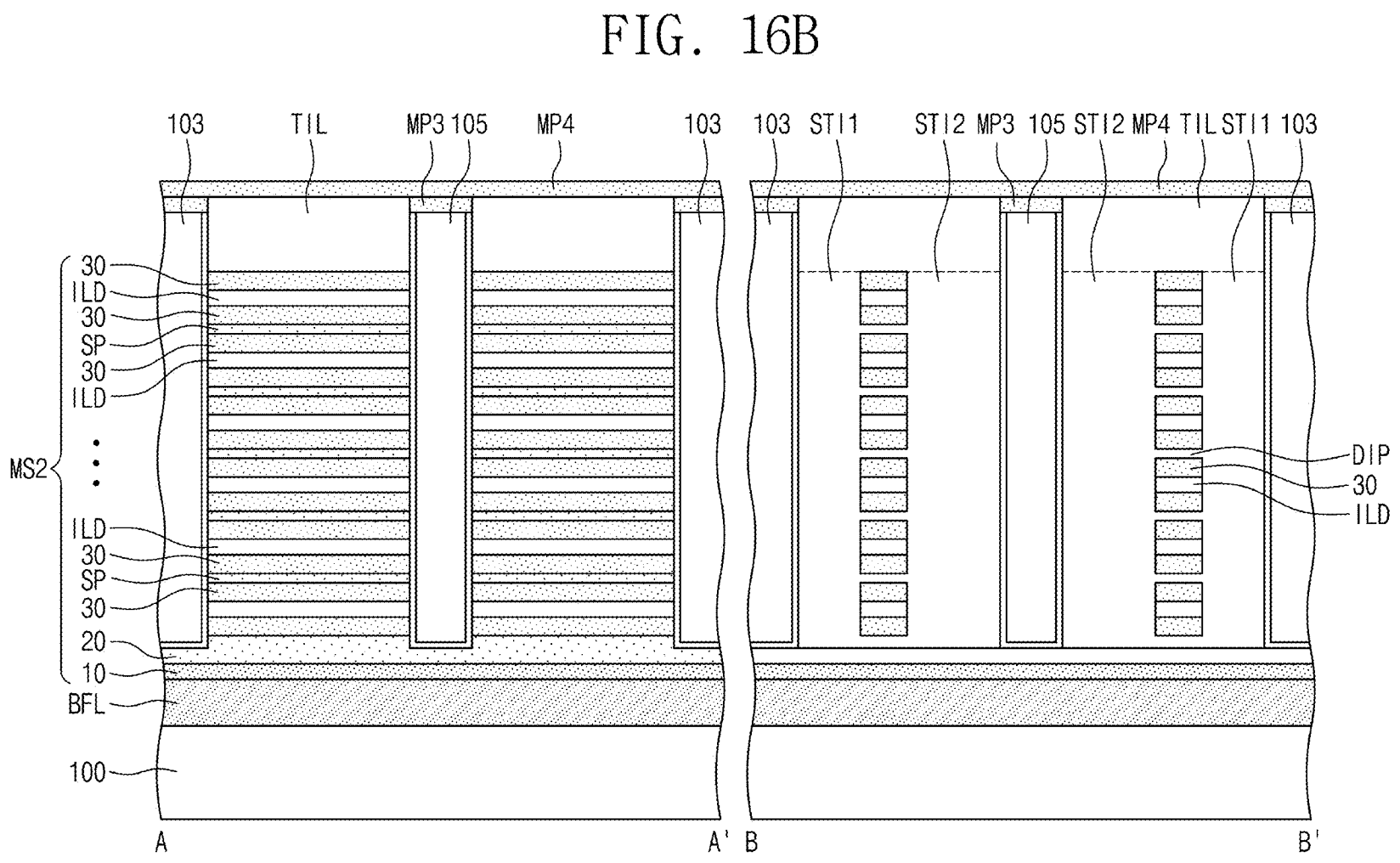
Figure 16C:
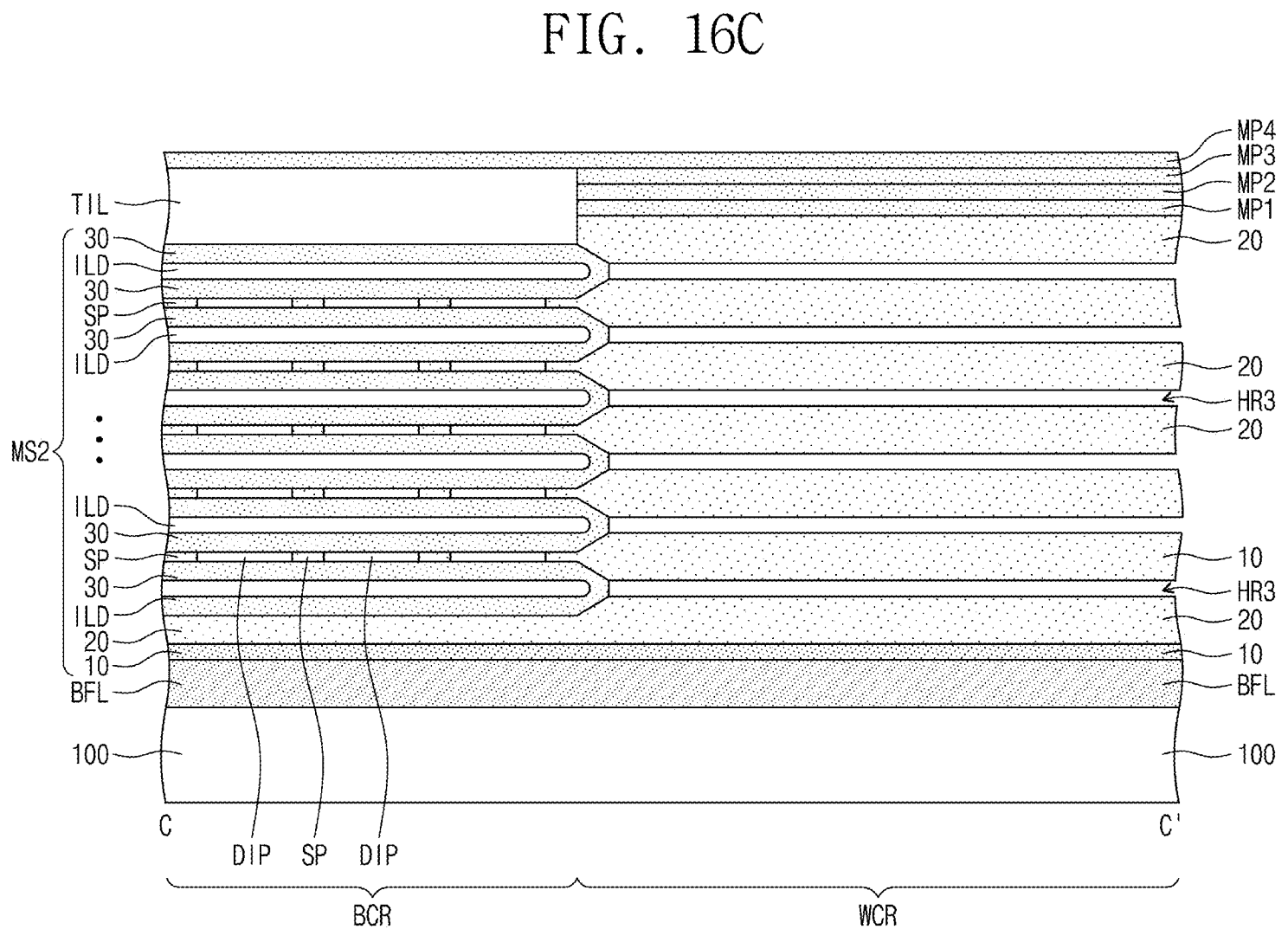

Referring to FIGS. 16A, 16B, and 16C, a fourth mask pattern MP4 may be formed to expose a portion of the second preliminary line pattern 105 in the second region WCR.

In the second region WCR, a portion of the second preliminary line pattern 105 may be etched using the fourth mask pattern MP4 as an etch mask, and thus, a separation region SR may be formed to penetrate a portion of the second mold structure MS2. The separation region SR may be formed to expose side surfaces of the first and second semiconductor layers 10 and 20 in the second region WCR.

Next, third horizontal regions HR3 may be formed between the second semiconductor layers 20 by selectively etching the first semiconductor layers 10 in the second region WCR through the separation region SR. Similar to the formation of the first horizontal regions HR1 described above, the formation of the third horizontal regions HR3 may include isotropically etching the first semiconductor layers 10 using an etching process, which has an etch selectivity with respect to the second semiconductor layers 20, the sacrificial patterns 30, and the first and second preliminary line patterns 103 and 105. In an embodiment, the third horizontal regions HR3 may be formed to expose portions of the sacrificial patterns 30, which are formed in the first region BCR.

Figure 16D:
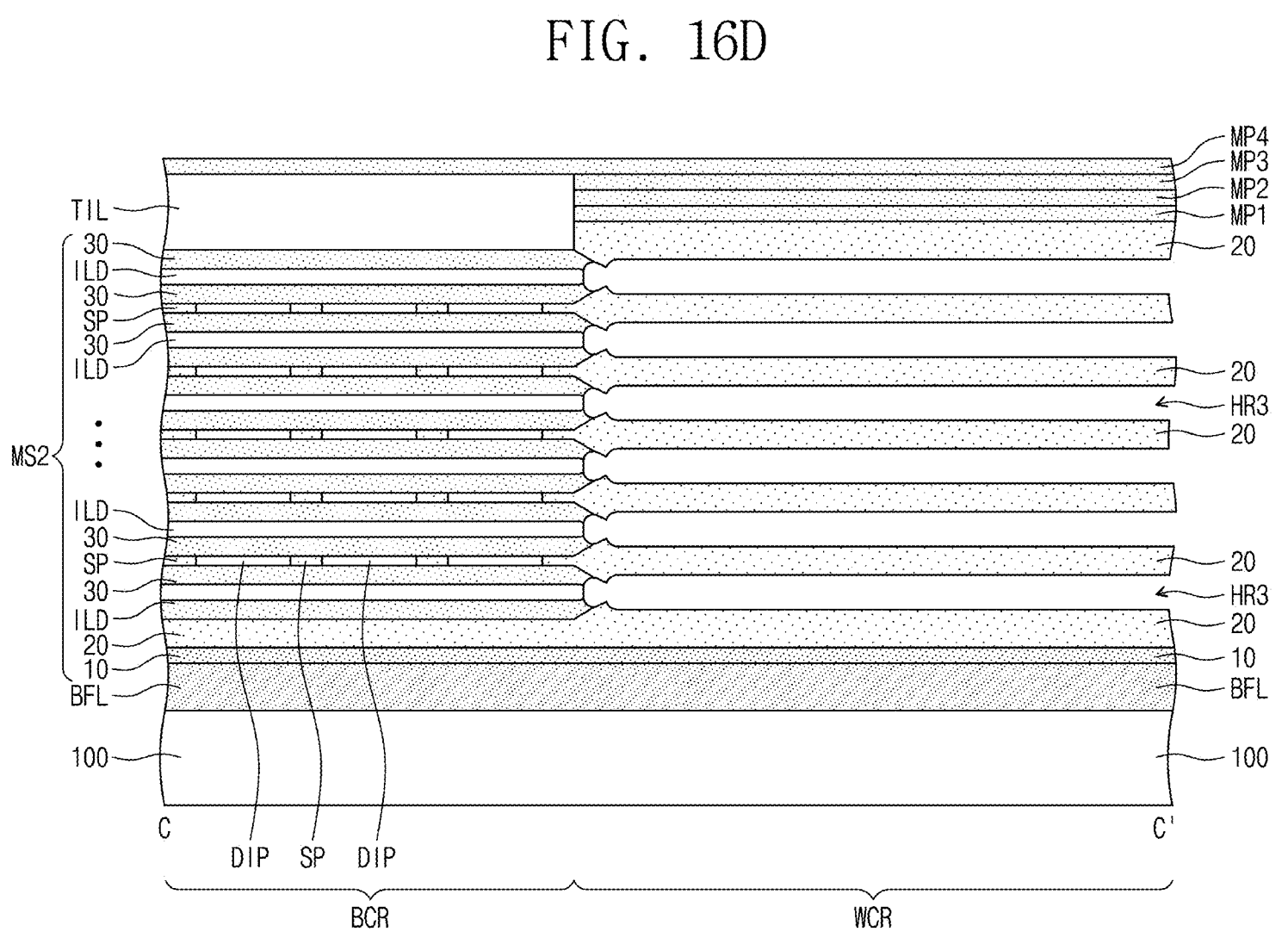

Thereafter, referring to FIG. 16D, a trimming process may be performed to reduce thicknesses of the second semiconductor layers 20 exposed by the third horizontal regions HR3, and an etching process may be performed to isotropically etch the sacrificial patterns 30, which are exposed through the third horizontal regions HR3. Thus, a vertical thickness of the third horizontal region HR3 may be increased, and the interlayer insulating patterns ILD in the first region BCR may be exposed to the third horizontal regions HR3.

Figure 16E:
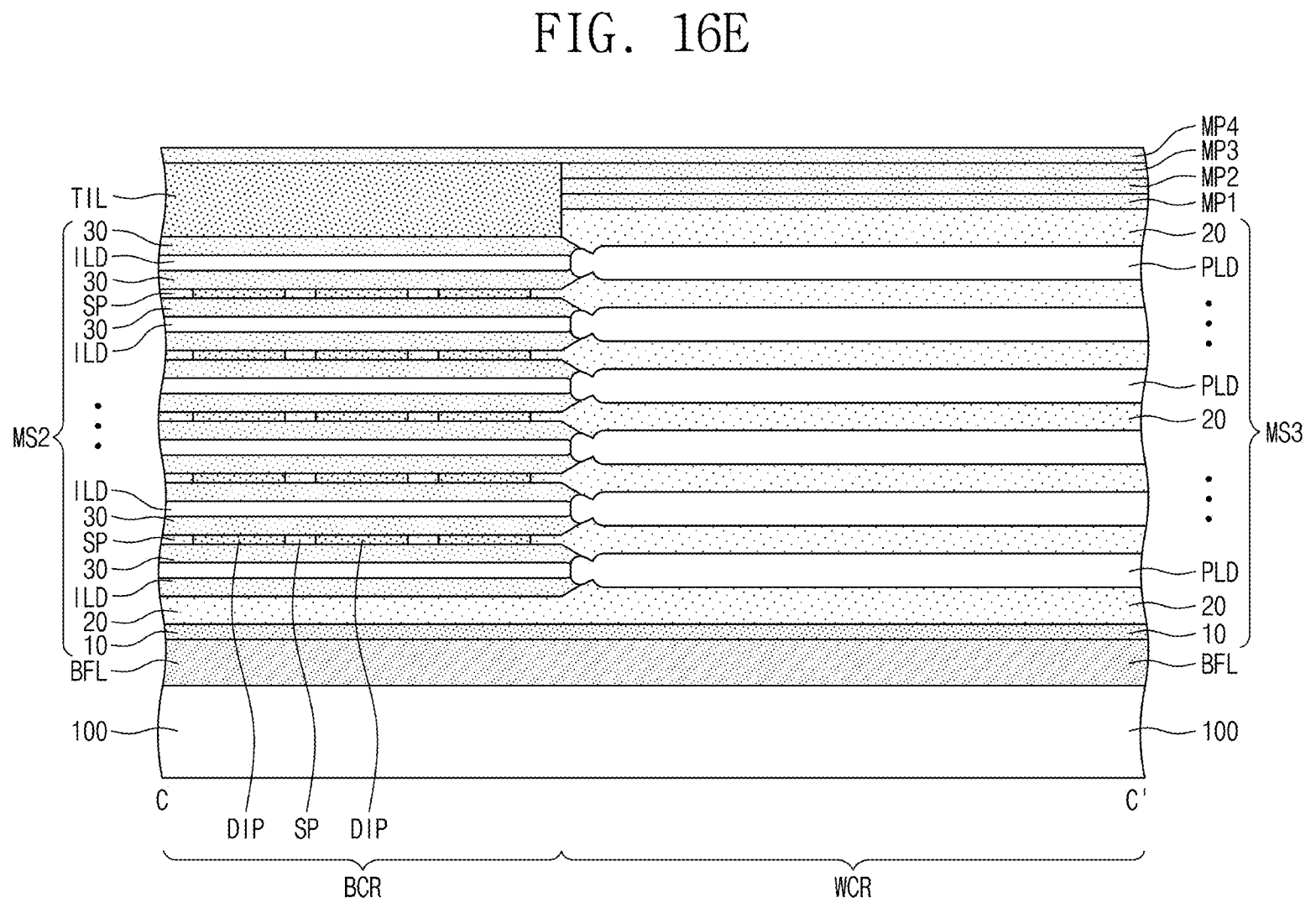

Referring to FIG. 16E, the third mold structure MS3 may be formed in the second region WCR by filling the third horizontal regions HR3 with an insulating material. The third mold structure MS3 may include the pad insulating patterns PLD, which are respectively formed between the second semiconductor layers 20. The pad insulating patterns PLD may be vertically spaced apart from each other by the second semiconductor layers 20 and may be in contact with the interlayer insulating patterns ILD in the first region BCR. The pad insulating patterns PLD may be formed of or include an insulating material having an etch selectivity with respect to the second semiconductor layers 20 and the sacrificial patterns 30. In an embodiment, the pad insulating patterns PLD may be formed of or include silicon oxide.

When the pad insulating patterns PLD are formed, the first line insulating pattern 106 may be formed in the separation region SR. The first line insulating pattern 106 may be formed of or include an insulating material, which is the same as or different from the pad insulating patterns PLD.

Referring to FIGS. 8, 17A, 17B, and 17C, a pad trimming process may be performed on the third mold structure MS3 in the second region WCR (in S40).

The pad trimming process may be performed to repeat a patterning process on the third mold structure MS3 in the second region WCR, and as a result, a staircase structure may be formed. During the pad trimming process, a trimming mask pattern TPR, which has a relatively large thickness, may be formed on the fourth mask pattern MP4, and the first, second, third, and fourth mask patterns MP1, MP2, MP3, and MP4 may be removed from the second region WCR. The pad trimming process may be described in more detail with reference to FIGS. 22A to 22F.

As a result of the pad trimming process, the third mold structure MS3 may have a staircase structure, which is formed in the first direction D1, in the second region WCR. Accordingly, a length, in the first direction D1, of the second semiconductor layers 20 in the second region WCR may decrease as a distance from the substrate 100 increases. The second semiconductor layer 20 and the pad insulating pattern PLD adjacent thereto may have side surfaces which are vertically aligned to each other.

In an embodiment, as a result of the pad trimming process, a staircase structure may be formed in the first preliminary line patterns 103 and the second line insulating pattern 106 in the second region WCR. That is, the first preliminary line patterns 103 and the second line insulating pattern 106 may have a thickness (or vertical length) which decreases as a distance from the first region BCR increases.

Referring to FIG. 8, word lines and bit lines may be formed in the first region BCR (in S50). This will be described in more detail with reference to FIGS. 18A to 20C.

Figure 18A:
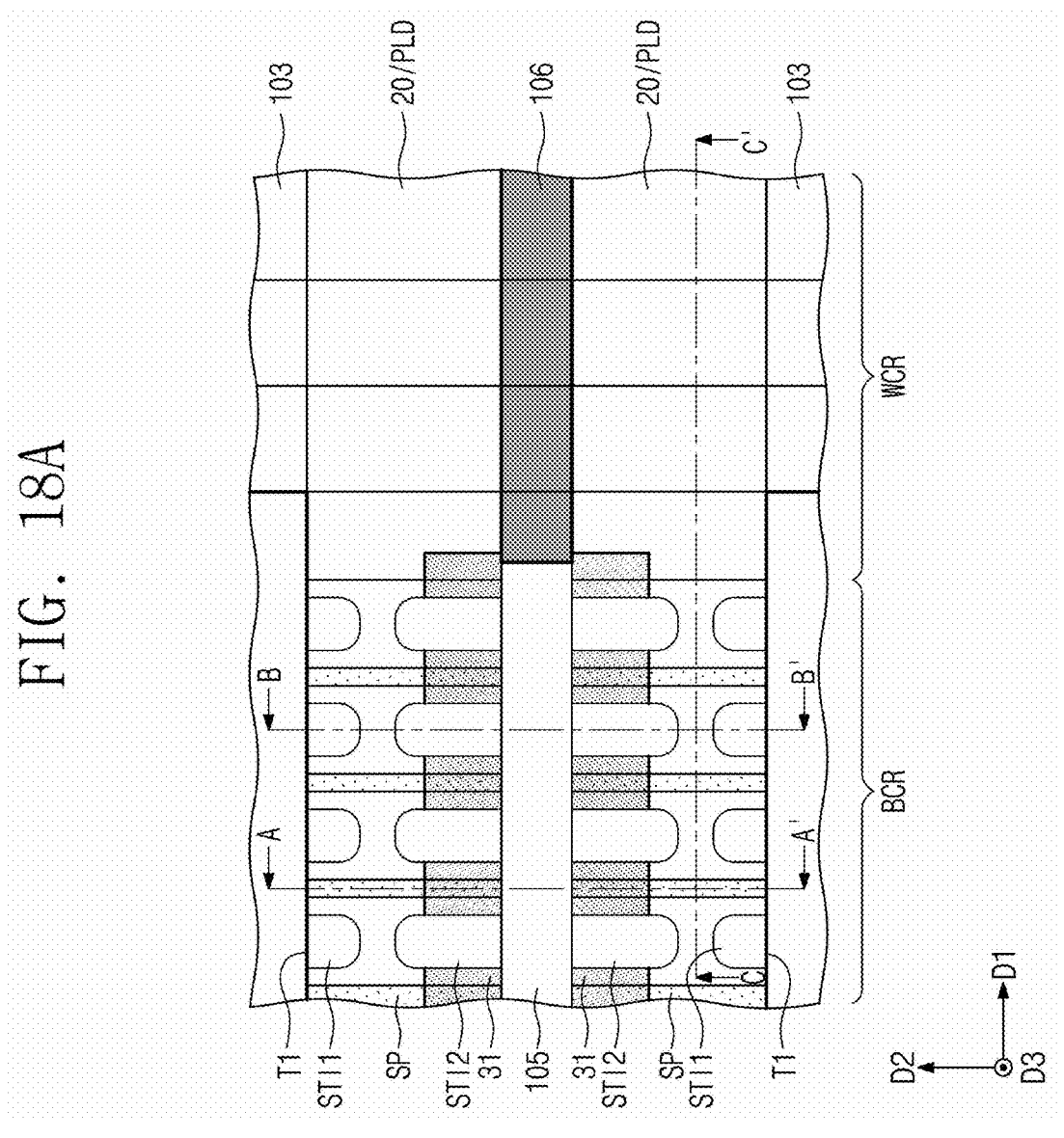
Figure 18B:
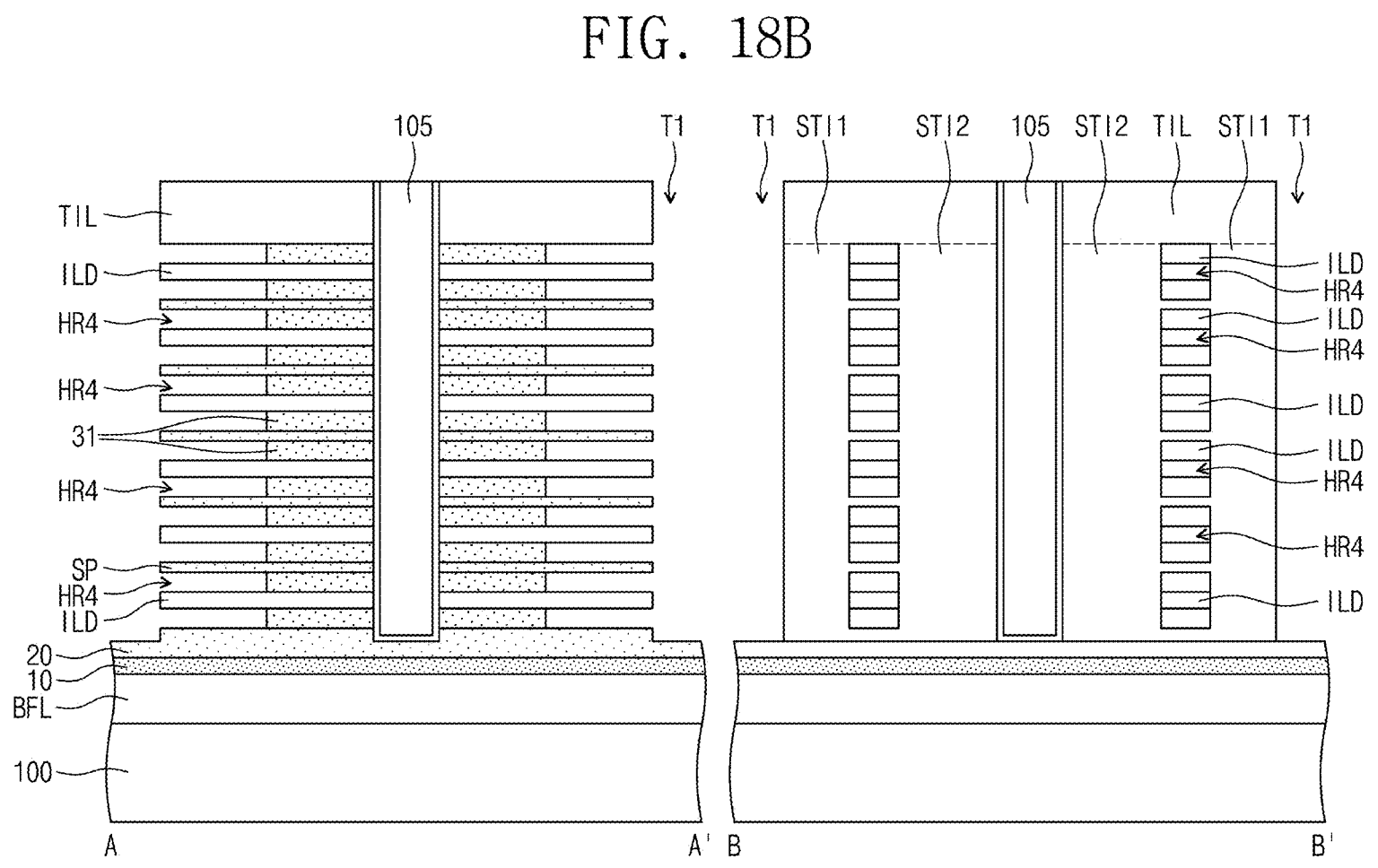
Figure 18C:
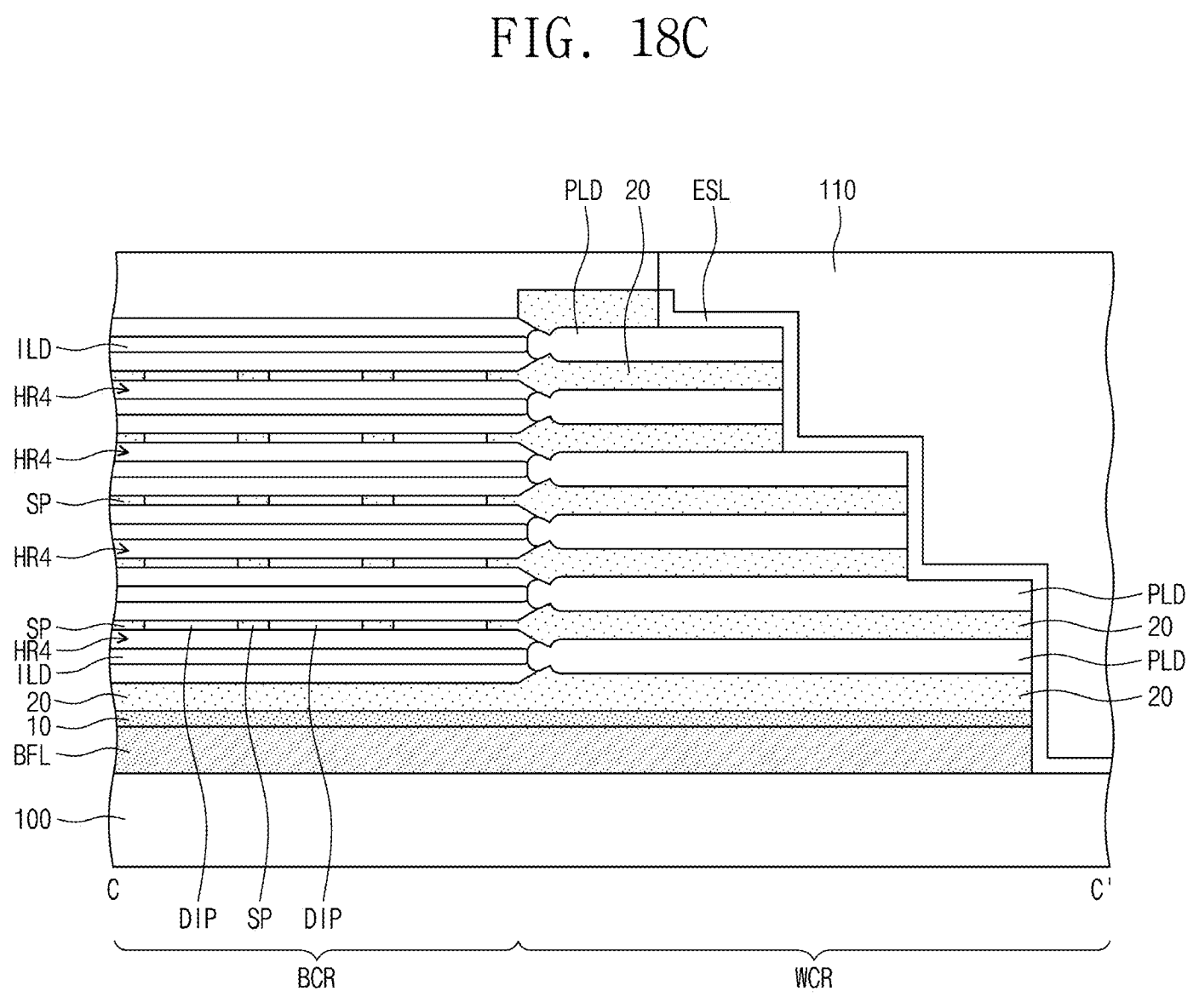

Referring to FIGS. 18A, 18B, and 18C, the first preliminary line patterns 103 may be removed from the first region BCR to form first trenches T1 exposing side surfaces of the second mold structure MS2. The first trenches T1 may be formed to expose the side surfaces of the channel patterns SP, the side surfaces of the sacrificial patterns 30, and the side surfaces of the interlayer insulating patterns ILD.

Next, fourth horizontal regions HR4 may be respectively formed between the channel patterns SP and the interlayer insulating patterns ILD by isotropically etching portions of the sacrificial patterns 30, which are exposed to the first trenches T1.

The fourth horizontal regions HR4 may be formed by isotropically etching the sacrificial patterns 30 using an etch recipe, which is chosen to have an etch selectivity with respect to the channel patterns SP and the interlayer insulating patterns ILD. As an example, in the case where the sacrificial patterns 30 and the interlayer insulating patterns ILD are formed of silicon nitride and silicon oxide, respectively, the process of isotropically etching the sacrificial patterns 30 to form the fourth horizontal regions HR4 may be performed using an etching solution containing phosphoric acid. The fourth horizontal regions HR4 may extend in the first direction D1, between the first and second insulating isolation patterns STI1 and STI2.

As a result of the formation of the fourth horizontal regions HR4, the sacrificial patterns 30 may be partially left to form first sacrificial patterns 31. The first sacrificial patterns 31 may be separated from each other in the first direction D1 by the second insulating isolation patterns STI2.

Figure 19A:
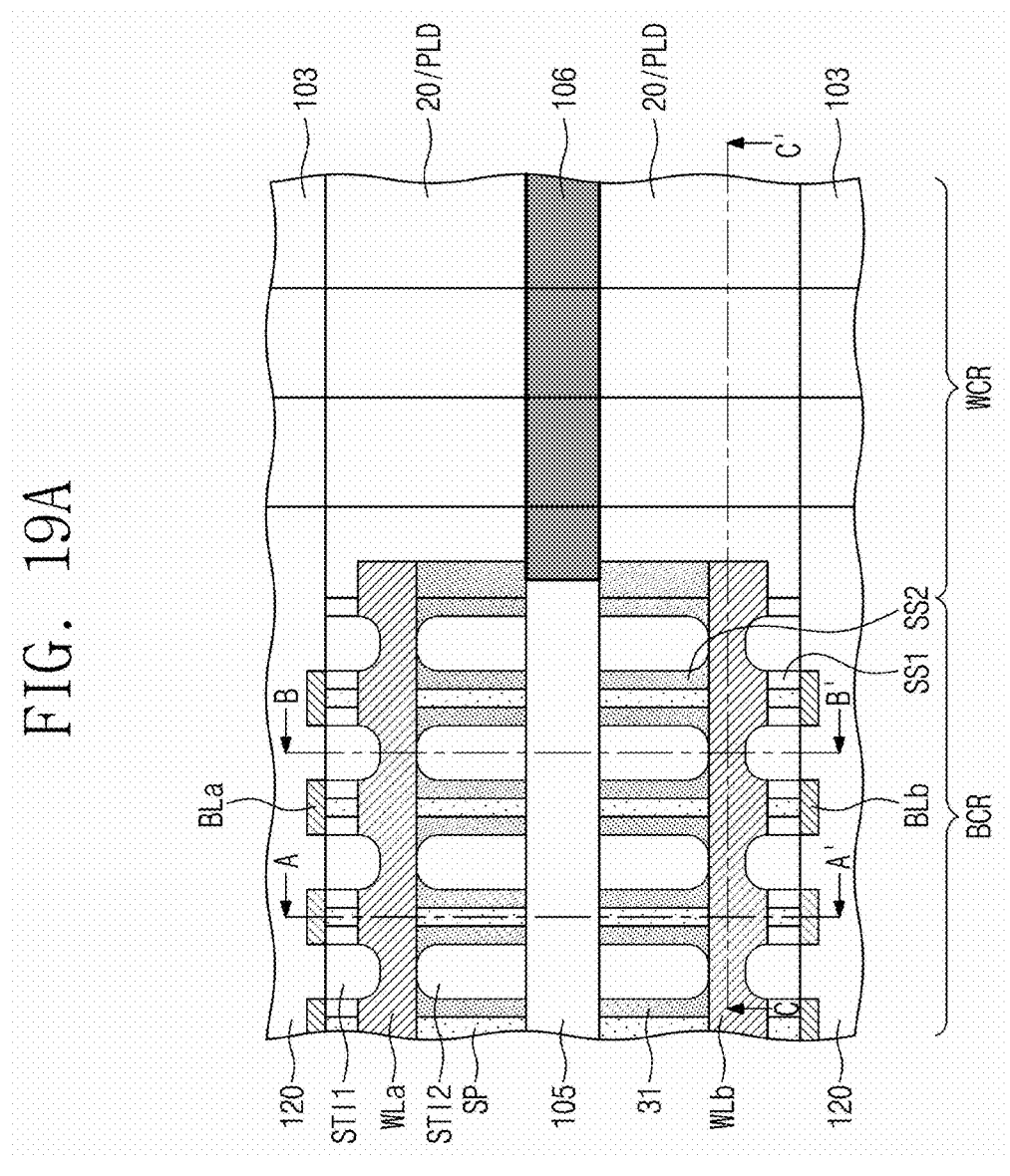
Figure 19B:
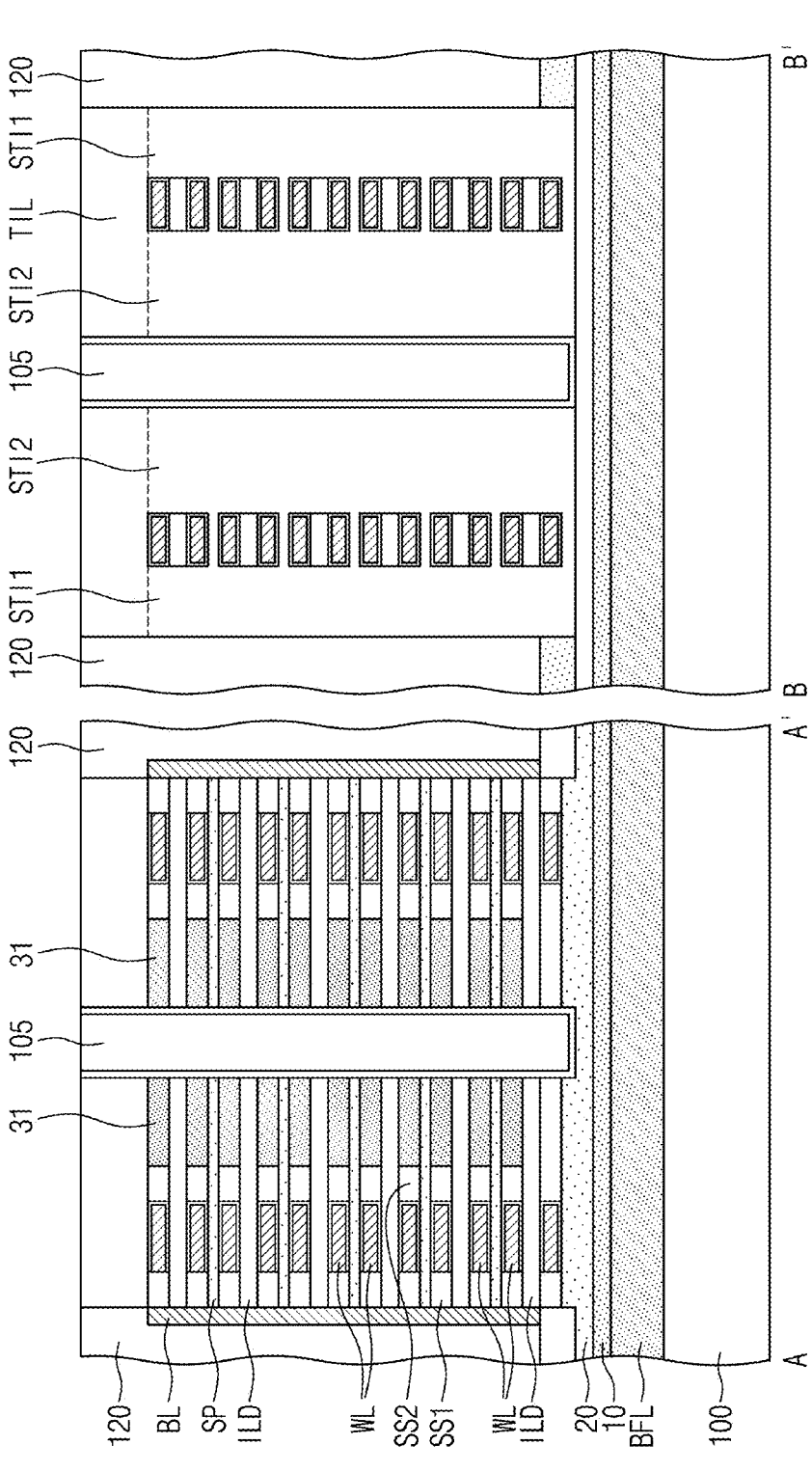
Figure 19C:
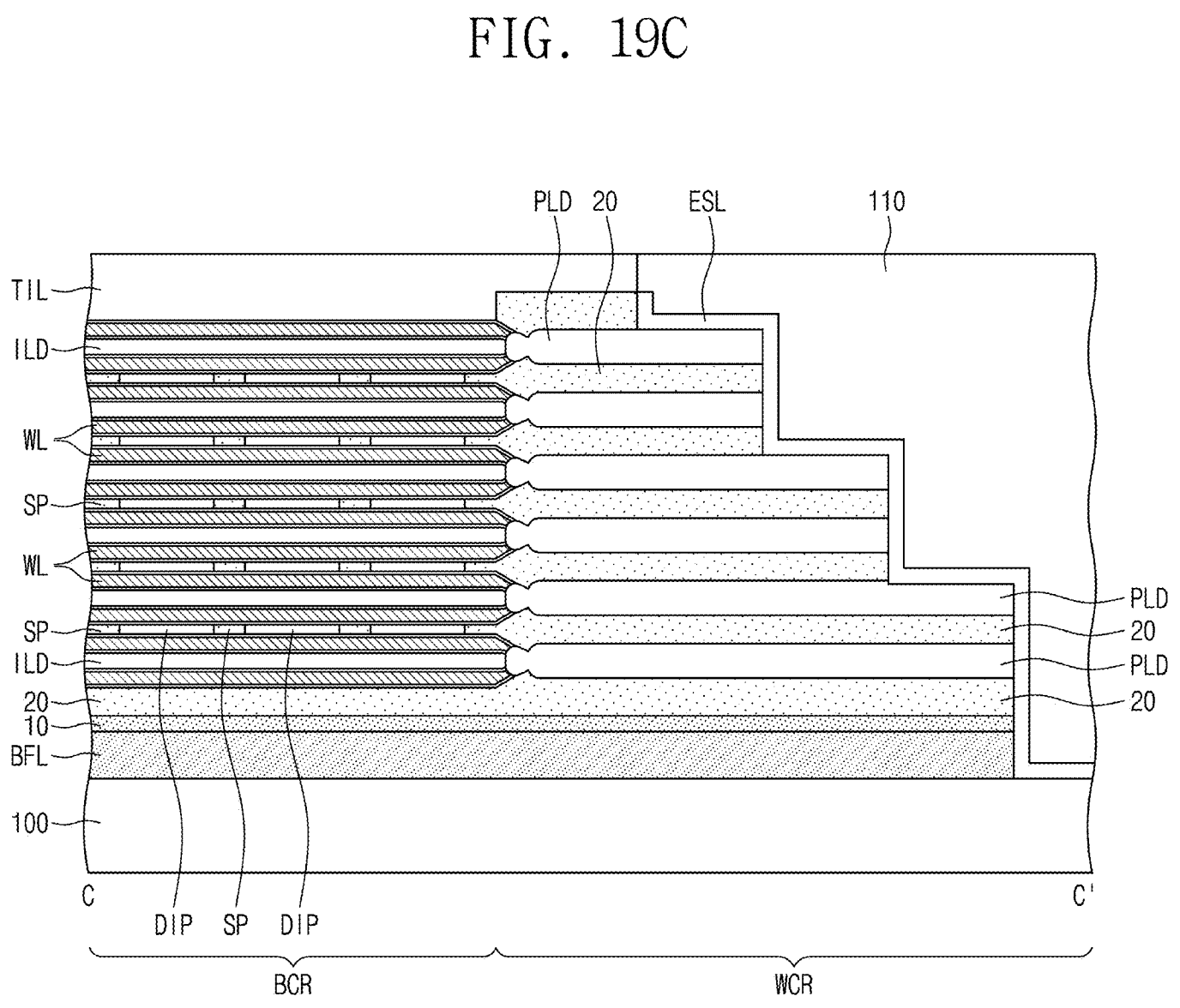

Referring to FIGS. 19A, 19B, and 19C, the gate insulating layer Gox and the word lines WL may be sequentially formed in the fourth horizontal regions HR4.

The formation of the gate insulating layer Gox and the word lines WL may include forming the gate insulating layer Gox to conformally cover the fourth horizontal regions HR4 provided with the first sacrificial patterns 31, forming a gate conductive layer on the gate insulating layer Gox to fill the fourth horizontal regions HR4, and removing the gate conductive layer from the first trenches T1 to form the word lines WL, which are vertically separated from each other. Here, the word lines WL may be formed to have side surfaces, which are further recessed inward relative to the side surfaces of the channel patterns SP, and thereby to partially fill the fourth horizontal regions HR4. The word lines WL may be formed on top and bottom surfaces of center portions (i.e., channel portions) of the channel patterns SP and may extend in the first direction D1. For example, each of the word lines WL may be provided to face the top and bottom surfaces of the channel pattern SP or to have a double gate structure. Alternatively, the word lines WL may be provided to completely surround the center portions (i.e., the channel portions) of the channel patterns SP or to have a gate-all-around structure. The word lines WL may be formed of or include at least one of doped semiconductor materials (e.g., doped silicon, doped germanium, and so forth).

Near the side surfaces of the first or second insulating isolation patterns STI1 or STI2, the word lines WL may have substantially the same profile as a side surface profile of the first or second insulating isolation patterns STI1 or STI2. For example, each of the word lines WL may have a non-uniform width in the second direction D2.

The first spacer insulating patterns SS1 may be formed in the fourth horizontal regions HR4 provided with the word lines WL. The first spacer insulating patterns SS1 may be formed to partially expose the channel patterns SP. The second spacer insulating patterns SS2 may be formed in the fourth horizontal regions HR4 before forming the word lines WL The formation of the first spacer insulating patterns SS1 may include forming a capping insulating layer on inner surfaces of the first trenches T1 to fill the fourth horizontal regions HR4 and removing the capping insulating layer from the first trenches T1 to expose the side surfaces of the interlayer insulating patterns ILD. The capping insulating layer may be etched by an isotropic etching process having an etch selectivity with respect to the interlayer insulating patterns ILD and the channel patterns SP. When the first spacer insulating patterns SS1 are formed, the gate insulating layer Gox on the side surfaces of the interlayer insulating patterns ILD may be partially etched.

Before or after the formation of the first spacer insulating patterns SS1, portions of the channel patterns SP, which are exposed to the first trenches T1, may be doped with impurities. Accordingly, the first dopant regions SD1 (e.g., see FIG. 6) may be formed in the channel patterns SP.

After the formation of the first spacer insulating patterns SS1, the bit lines BL may be formed in the first trenches T1.

The formation of the bit lines BL may include depositing a conductive layer on inner side surfaces of the first trenches T1 and removing the conductive layer to expose side surfaces of the first insulating isolation patterns STI1 on the inner side surfaces of the first trenches T1.

The bit lines BL, which are formed by the afore-described process, may extend in the third direction D3 perpendicular to the top surface of the substrate 100 and may be spaced apart from each other in the first direction D1 by the first insulating isolation patterns STI1. Each of the bit lines BL may be in contact with the first dopant regions of the channel patterns SP. The bit lines BL may be formed of or include at least one of doped silicon, metallic materials, metal nitrides, or metal silicides. For example, the bit lines BL may be formed of or include tantalum nitride or tungsten.

After the formation of the bit lines BL, the line insulating isolation patterns 120 may be formed in the first trenches T1. The line insulating isolation patterns 120 may extend in the first direction D1, on the substrate 100. The line insulating isolation patterns 120 may be provided to cover side surfaces of the bit lines BL and side surfaces of the first insulating isolation patterns STI1. The line insulating isolation patterns 120 may be formed of or include at least one of silicon oxide, silicon oxynitride, or insulating materials, which are formed using a spin-on-glass (SOG) technology.

Referring to FIGS. 8 and 20C, the second semiconductor layers 20 of the third mold structure MS3 in the second region WCR may be replaced with the word line pads PAD of the word lines WL (in S60).

In detail, referring to FIG. 20C, the replacement process may include forming a mask pattern (not shown) to cover the first region BCR, forming trenches to penetrate the third mold structure MS3 in the second region WCR, and performing an isotropic etching process on the second semiconductor layers 20 exposed through the trenches. Here, the trenches may be formed by partially removing the first preliminary line patterns 103 in the second region WCR. As a result of the isotropic etching process on the second semiconductor layers 20, empty spaces may be defined between the pad insulating patterns PLD in the second region WCR. Next, a conductive layer may be deposited to fill the empty spaces, and the word line pads PAD, which are vertically spaced apart from each other, may be formed by removing the conductive layer from inner surfaces of the trenches. After the formation of the word line pads PAD, the second line insulating patterns 113 may be formed in the trenches to cover side surfaces of the word line pads PAD.

Thereafter, a planarization insulating layer 110 may be formed to cover the staircase structure of the stack in the second region WCR, and in an embodiment, an etch stop layer ESL may be formed to conformally cover the staircase structure, before the formation of the planarization insulating layer 110.

Referring to FIG. 8, after the formation of the word line pads PAD and the planarization insulating layer 110, capacitors may be formed in the first region BCR (in S70).

Figure 20A:
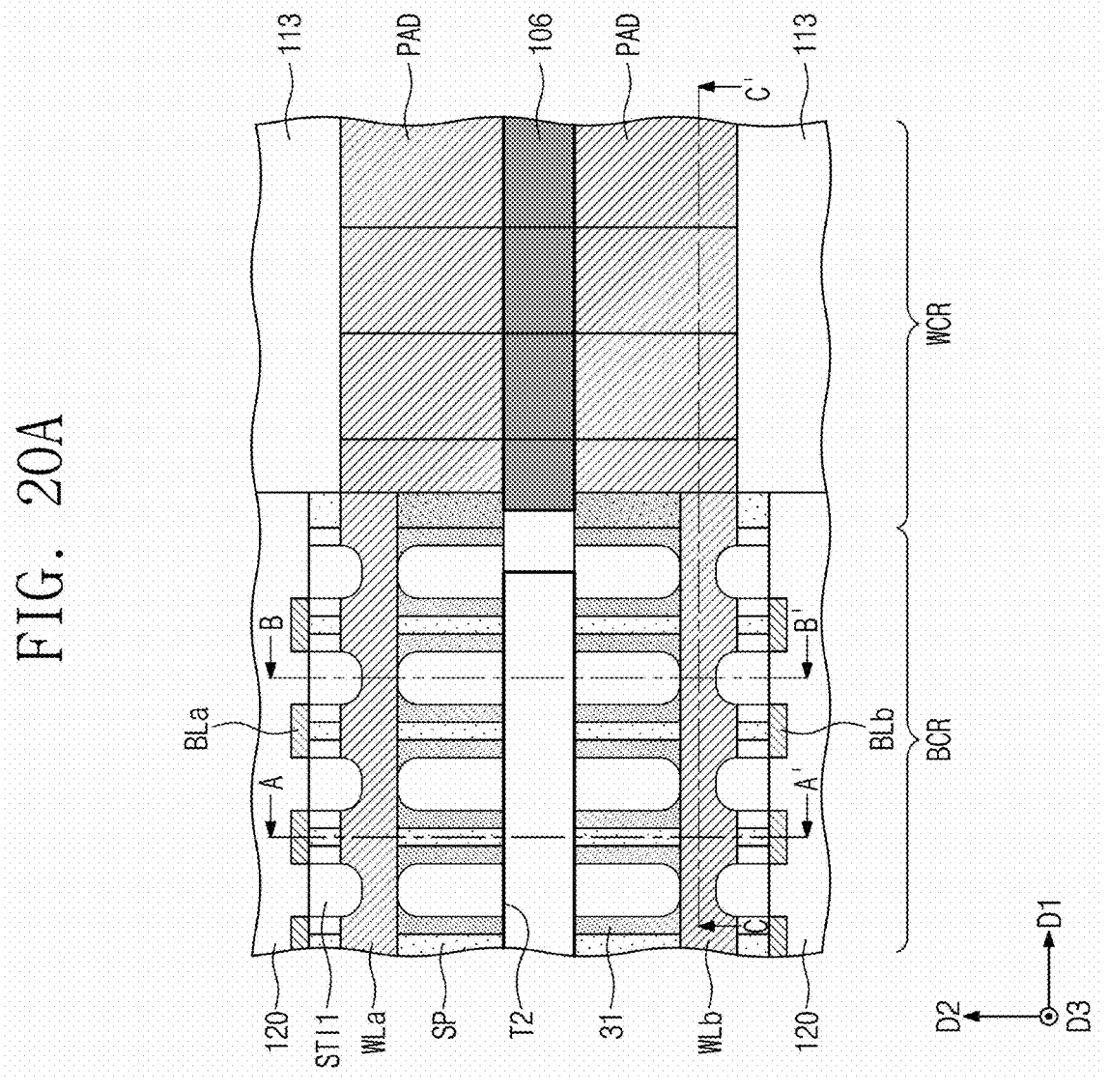
Figure 20B:
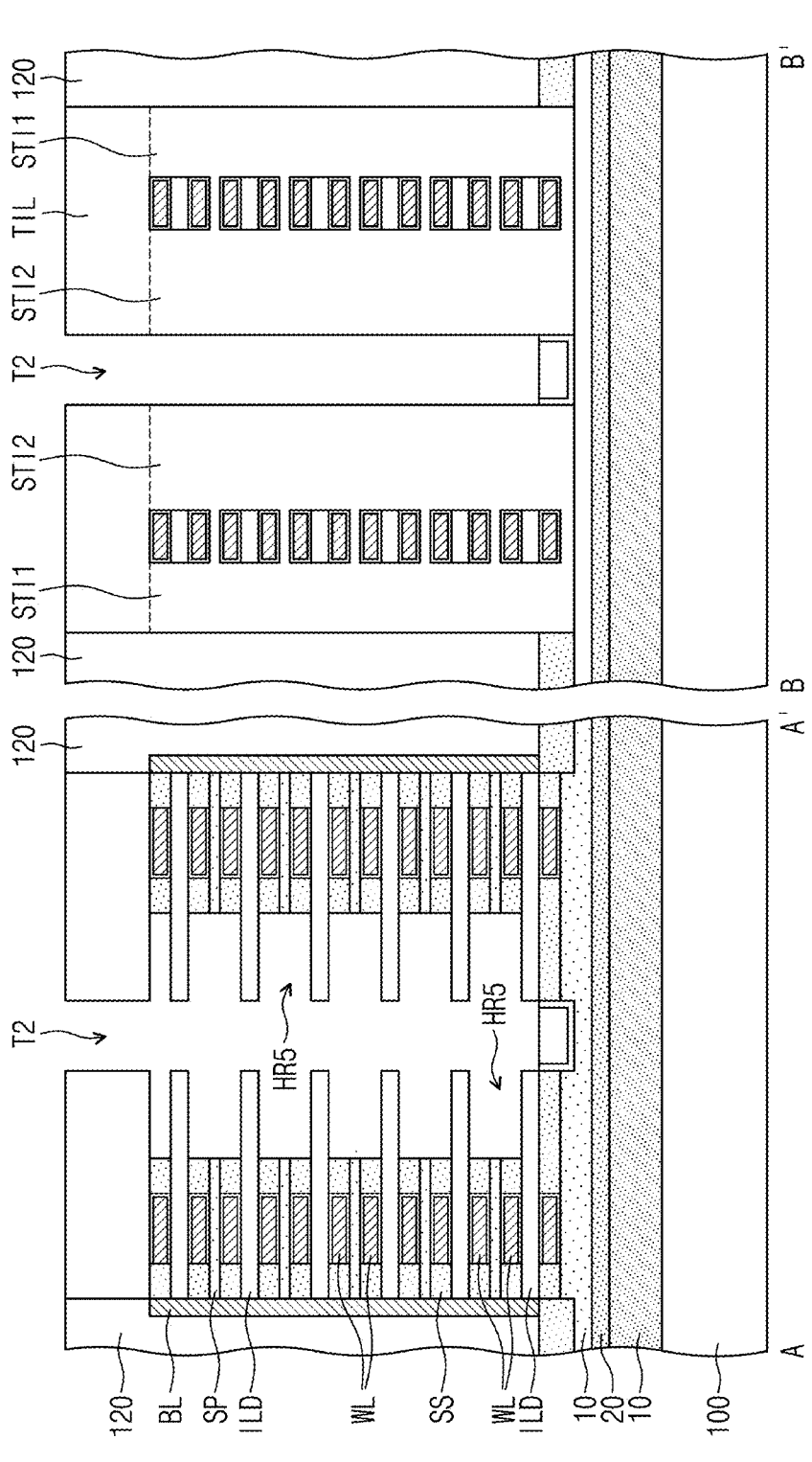
Figure 20C:
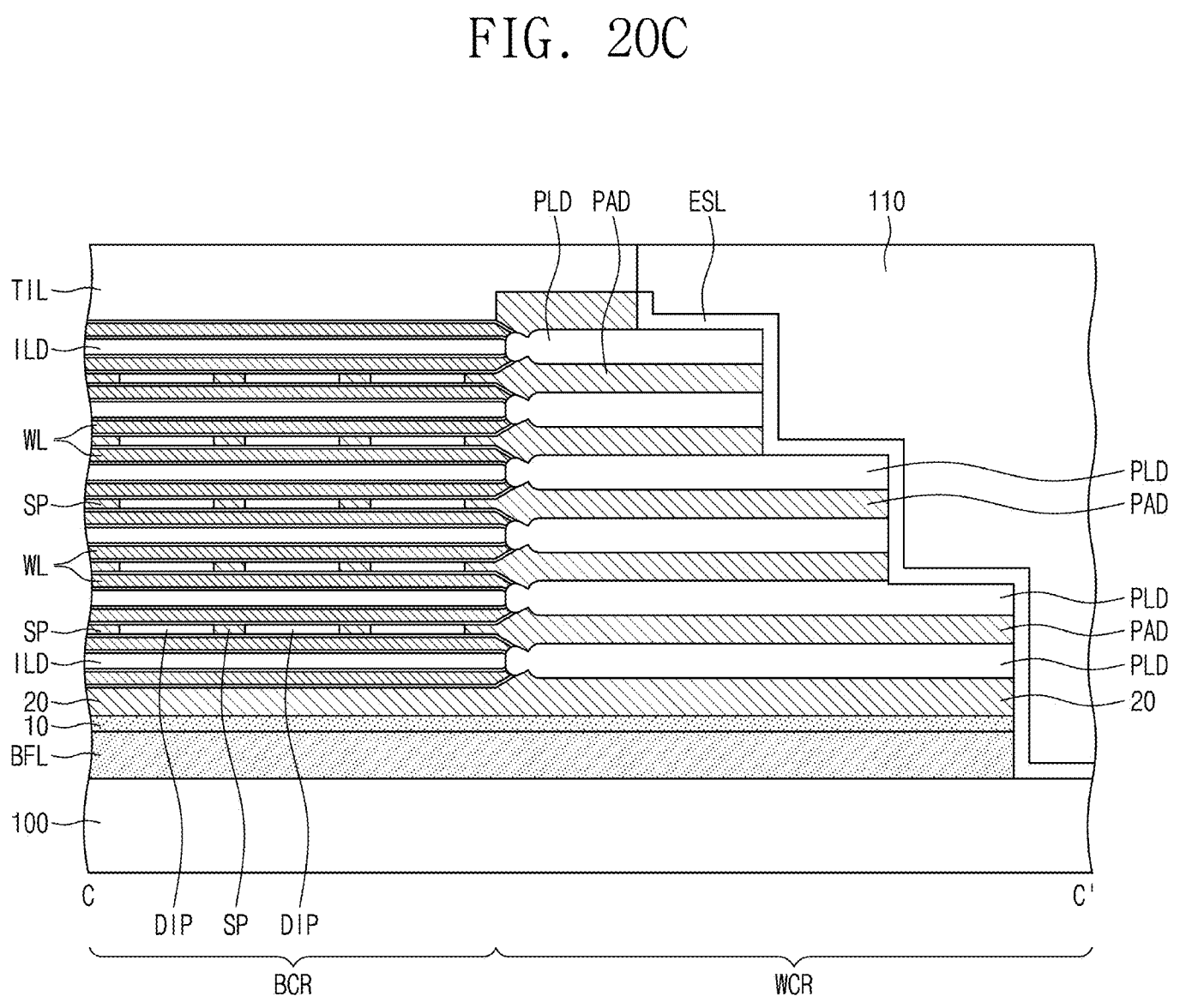

In detail, referring to FIGS. 20A, 20B, and 20C, the second preliminary line patterns 105 in the first region BCR may be removed to form a second trench T2 exposing the substrate 100. Here, the side surfaces of the first sacrificial patterns 31, the side surfaces of the channel patterns SP, and the side surfaces of the interlayer insulating patterns ILD may be exposed to the second trenches T2.

Next, the first sacrificial patterns 31, which are exposed to the second trenches T2, may be removed to form fifth horizontal regions HR5 exposing the second spacer insulating patterns SS2.

The formation of the fifth horizontal regions HR5 may include isotropically etching the first sacrificial patterns 31 using an etching process having an etch selectivity with respect to the substrate 100, the channel patterns SP, and the interlayer insulating patterns ILD. During the isotropic etching of the first sacrificial patterns 31, the second spacer insulating patterns SS2 may be used as an etch stop layer.

The fifth horizontal regions HR5 may be formed between the interlayer insulating patterns ILD and the channel patterns SP in a vertical direction and between the second insulating isolation patterns STI2 a horizontal direction. Portions of the channel patterns SP exposed to the fifth horizontal regions HR5 may be doped with impurities (e.g., phosphorus or boron) of the first conductivity type. Accordingly, the second dopant regions SD2 (e.g., see FIGS. 3A and 3B) may be formed in the channel patterns SP.

Next, referring to FIGS. 4, 5A, and 5B, the storage electrodes SE may be locally formed in the fifth horizontal regions HR5.

The formation of the storage electrodes SE may include depositing a conductive layer to conformally cover inner surfaces of the fifth horizontal regions HR5 and inner surfaces of the second trenches T2 and removing portions of the conductive layer, which is deposited on the inner surfaces of the second trenches T2, to locally leave conductive patterns in the fifth horizontal regions HR5.

The storage electrodes SE may be spaced apart from each other in the first direction D1, the second direction D2, and the third direction D3. The storage electrodes SE may be in contact with the channel patterns SP, which are exposed in the fifth horizontal regions HR5. Each of the storage electrodes SE may define an empty space in the fifth horizontal region HR5. In other words, each of the storage electrodes SE may have a long axis parallel to the second direction D2 and may have a hollow cylinder shape. Alternatively, the storage electrode SE may be a pillar-shaped pattern having a long axis parallel to the second direction D2. The storage electrode SE may be formed of or include at least one of metallic materials, metal nitride materials, or metal silicide materials.

Thereafter, the capacitor dielectric layer CIL may be formed to conformally cover the fifth horizontal regions HR5 provided with the storage electrodes SE, and the plate electrode PE may be formed to fill the fifth horizontal regions HR5, in which the storage electrodes SE and the capacitor dielectric layer CIL are formed, and the second trenches T2.

Referring to FIGS. 8, 4, 5A, and 5B, after the formation of the capacitors in the first region BCR, the cell contact plugs CPLG may be formed to be coupled to the word line pads PAD in the second region WCR (in S70).

The cell contact plugs CPLG may be formed to be coupled to the word line pads PAD, respectively. The cell contact plugs CPLG may be formed of or include at least one of metallic materials and/or metal nitride materials.

When the cell contact plugs CPLG are formed, contact holes may be formed to penetrate the interlayer insulating layers 130, 140, 150, and 160 and the planarization insulating layer 110 and to expose the word line pads PAD, respectively.

FIG. 21 is a flow chart illustrating a method of fabricating a cell array structure of a semiconductor memory device, according to an embodiment of the inventive concept.

Referring to FIG. 21, a first mold structure may be formed in the first and second regions BCR and WCR (in S11), as described with reference to FIGS. 9A, 9B, and 9C.

Next, channel patterns and a second mold structure may be formed in the first region BCR (in S21), as described with reference to FIGS. 10A to 15C.

After the formation of the channel patterns in the first region BCR, the second mold structure may be formed in the second region WCR (in S31). That is, the second mold structure MS2 in the second region WCR may include the sacrificial patterns 30, which are formed between vertically adjacent ones of the preliminary channel layers 21, and the interlayer insulating pattern ILD therebetween.

A pad trimming process may be performed on the second mold structure in the second region WCR (in S41). The pad trimming process may be performed to repeat a patterning process on the second mold structure in the second region WCR and thereby to form a staircase structure, as described with reference to FIGS. 17A, 17B, and 17C.

Next, word lines may be formed in the first region BCR, and the word line pads PAD may be formed in the second region WCR (in S51). The formation of the word lines and the word line pads PAD may include a process of replacing the sacrificial patterns 30 of the second mold structure in both of the first and second regions BCR and WCR with a conductive material. That is, the word lines and the word line pads PAD may be formed simultaneously.

Thereafter, bit lines and capacitors may be formed in the first region BCR (in S61). The bit lines may be formed on the first region BCR to be perpendicular to the top surface of the substrate 100, as described with reference to FIGS. 19A, 19B, and 19C. The formation of the capacitors may include forming the storage electrodes SE to be in contact with the channel patterns SP and forming the capacitor dielectric layer CIL and the plate electrode PE, which are used as shielding layers, to cover the storage electrodes SE, as described with reference to FIGS. 20A, 20B, and 20C.

FIGS. 22A to 22F are perspective views illustrating a pad trimming process, which is performed during a process of forming a cell array structure, according to an embodiment of the inventive concept.

Before the pad trimming process, a third mold structure including the pad insulating patterns PLD and the second semiconductor layers 20 may be formed in the second region WCR, as previously described with reference to FIG. 16E. The third mold structure may be disposed between the first and second preliminary line patterns 103 and 105. In an embodiment, the second semiconductor layers 20 may be formed of or include a material having an etch selectivity with respect to the pad insulating patterns PLD and the first and second preliminary line patterns 103 and 105.

Figure 22A:
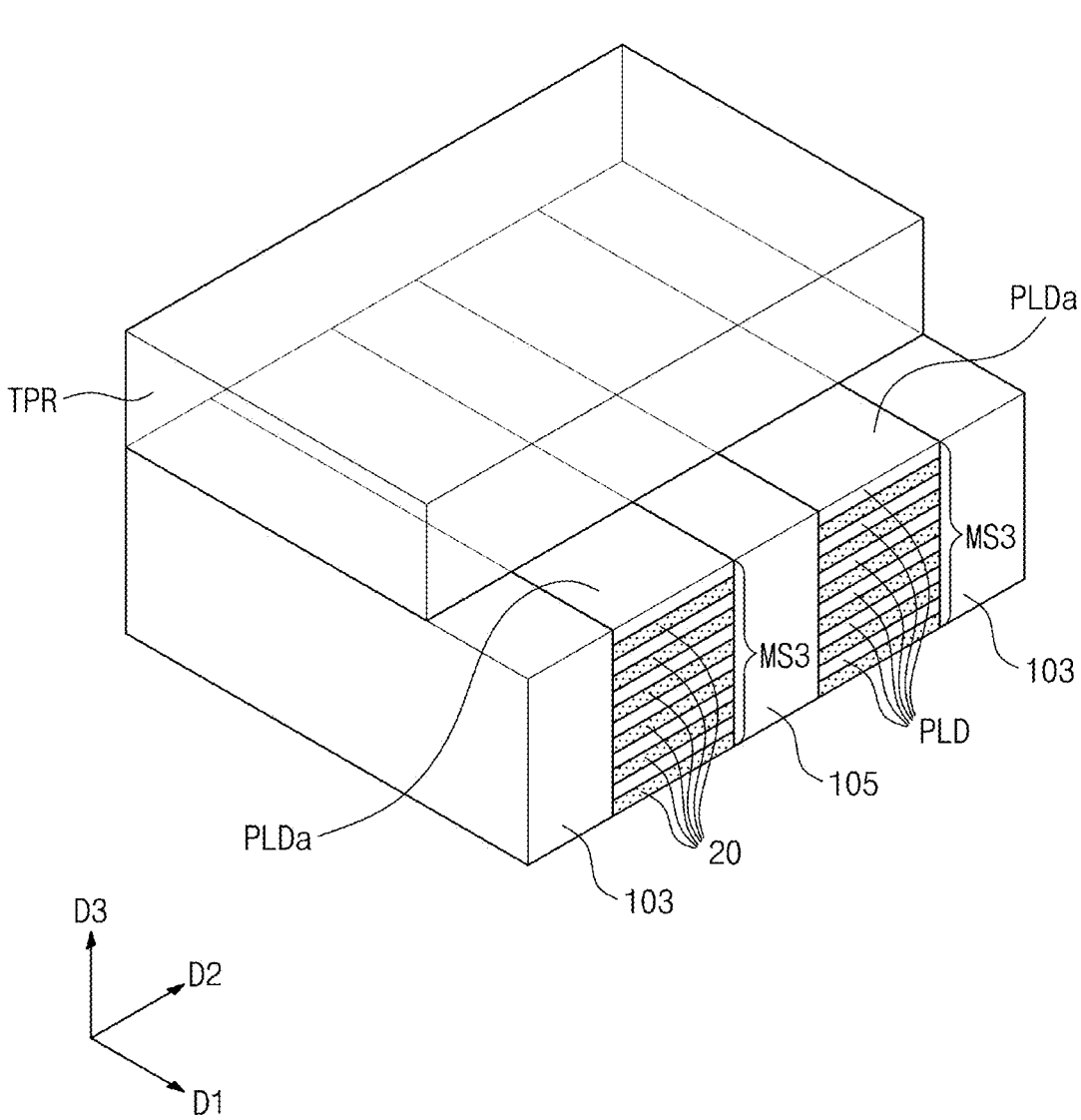
FIGS. 22A, 22B, 22C, 22D, 22E, and 22F are perspective views illustrating a pad trimming process, which is performed during a process of forming a cell array structure, according to an embodiment of the inventive concept.

Referring to FIG. 22A, a pad mask pattern TPR may be formed on the first and second regions BCR and WCR to cover the third mold structure and the first and second preliminary line patterns 103 and 105.

The pad mask pattern TPR may expose a portion of the third mold structure and portions of the first and second preliminary line patterns 103 and 105, in the second region WCR. A thickness of the pad mask pattern TPR may be larger than a width of the second region WCR. The pad mask pattern TPR may be formed of or include a material having an etch selectivity with respect to the third mold structure and the first and second preliminary line patterns 103 and 105. As an example, the pad mask pattern TPR may be formed of or include at least one of one of organic materials or one of photoresist materials.

Figure 22B:
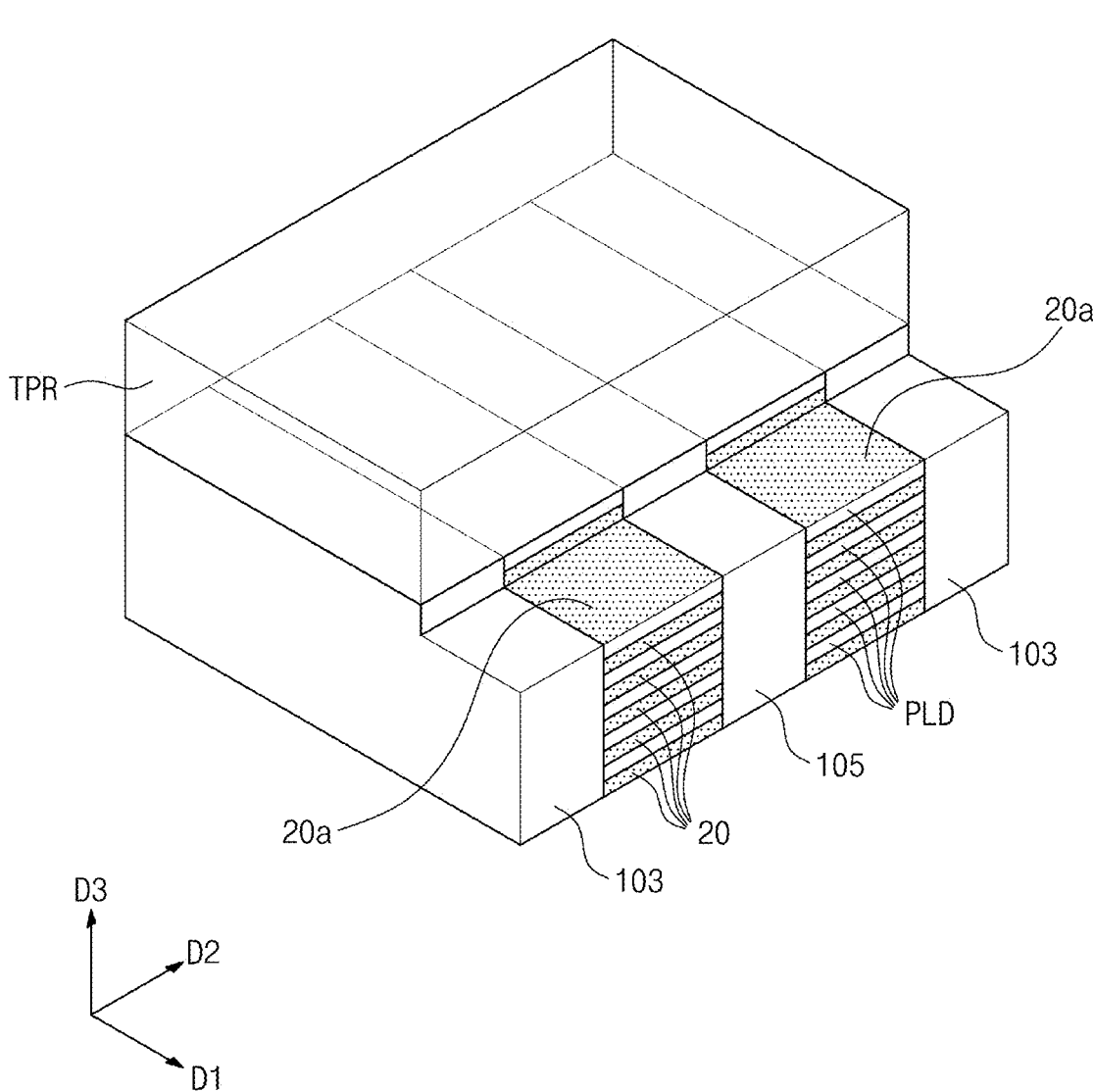

Referring to FIG. 22B, a first etching process using the pad mask pattern TPR as an etch mask may be performed to etch the pad insulating pattern PLD and the first and second preliminary line patterns 103 and 105. During the first etching process, the second semiconductor layer 20 below the pad insulating pattern PLD may be used as an etch stop layer.

Figure 22C:
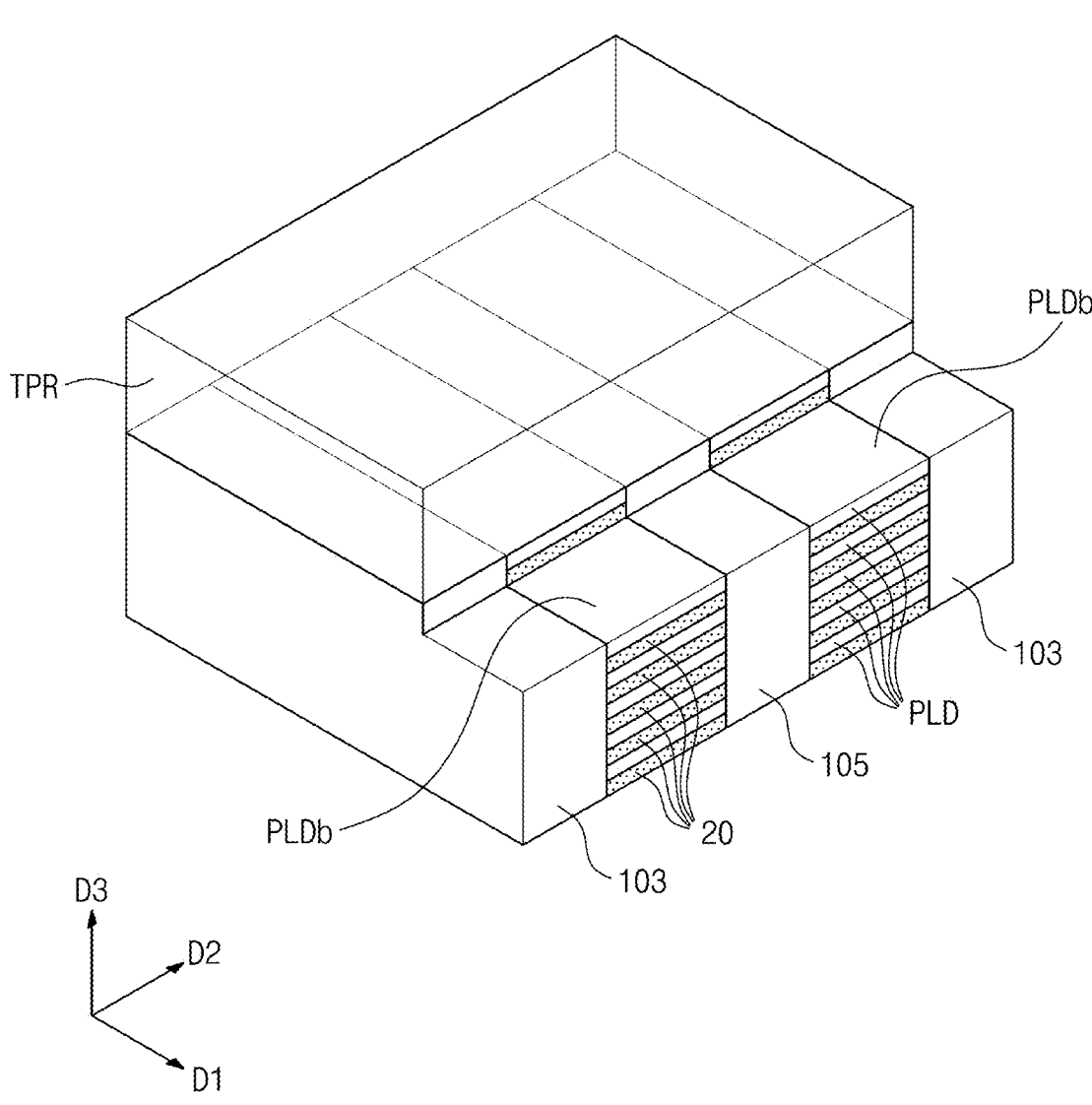

Referring to FIG. 22C, a second etching process using the pad mask pattern TPR as an etch mask may be performed to etch the second semiconductor layer 20. During the second etching process, the pad insulating pattern PLD below the second semiconductor layer 20 may be used as an etch stop layer. Lengths of the pad insulating pattern PLD and the second semiconductor layer 20 may be reduced by the first and second etching processes, and as a result, a first stair may be formed.

Figure 22D:
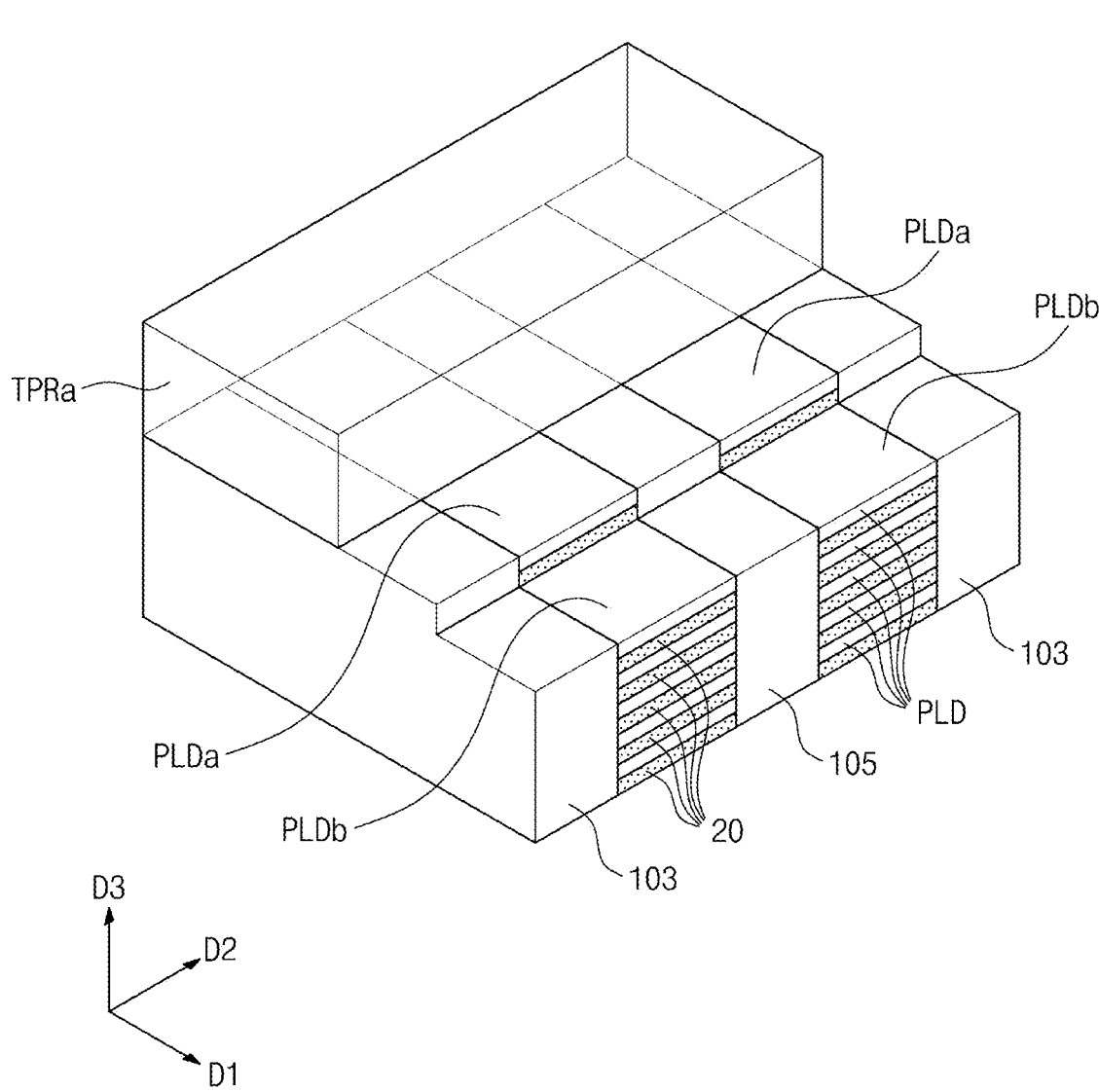

Referring to FIG. 22D, a mask trimming process may be performed to reduce the pad mask pattern TPR.

The mask trimming process may be performed to horizontally move a side surface of the pad mask pattern TPR toward the first region BCR by a specific distance and thereby to form a pad mask pattern TPRa having a reduced area. Here, the horizontal moving distance of the side surface of the pad mask pattern TPR in the first direction D1 may correspond to the width of the word line pad PAD described above. The mask trimming process may include an isotropic dry process or a wet etching process, which is performed on the pad mask pattern TPR.

Meanwhile, the first and second etching processes described above may be repeated two or more times, before the mask trimming process, and in this case, side surfaces of two or more second semiconductor layers 20 may be vertically aligned to form a single stair.

Figure 22E:
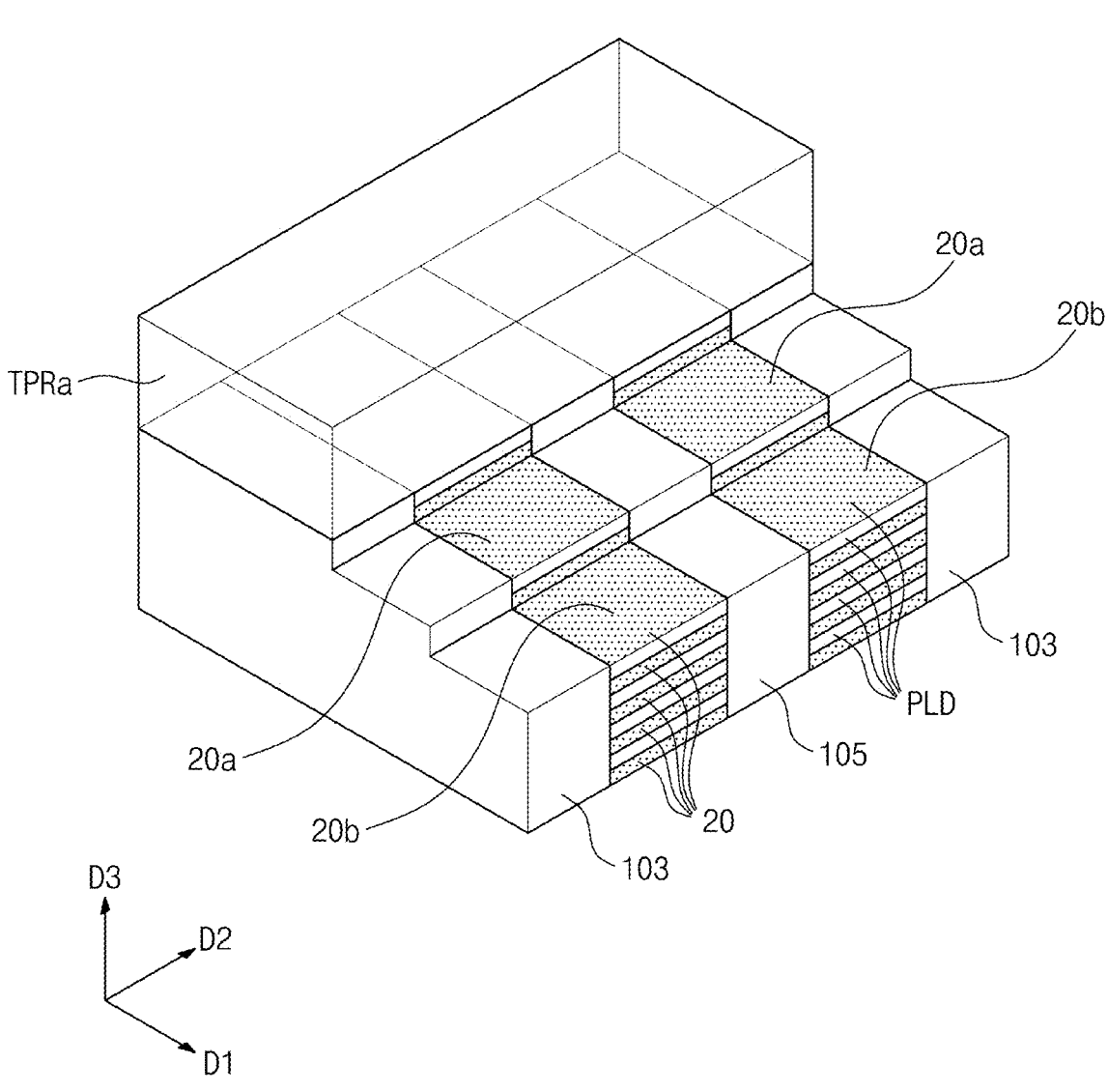

Referring to FIG. 22E, a first etching process may be performed to etch the pad insulating pattern PLD and the first and second preliminary line patterns 103 and 105 using the pad mask pattern TPRa, on which the first trimming process was performed, as an etch mask, as previously described with reference to FIG. 22B.

Figure 22F:
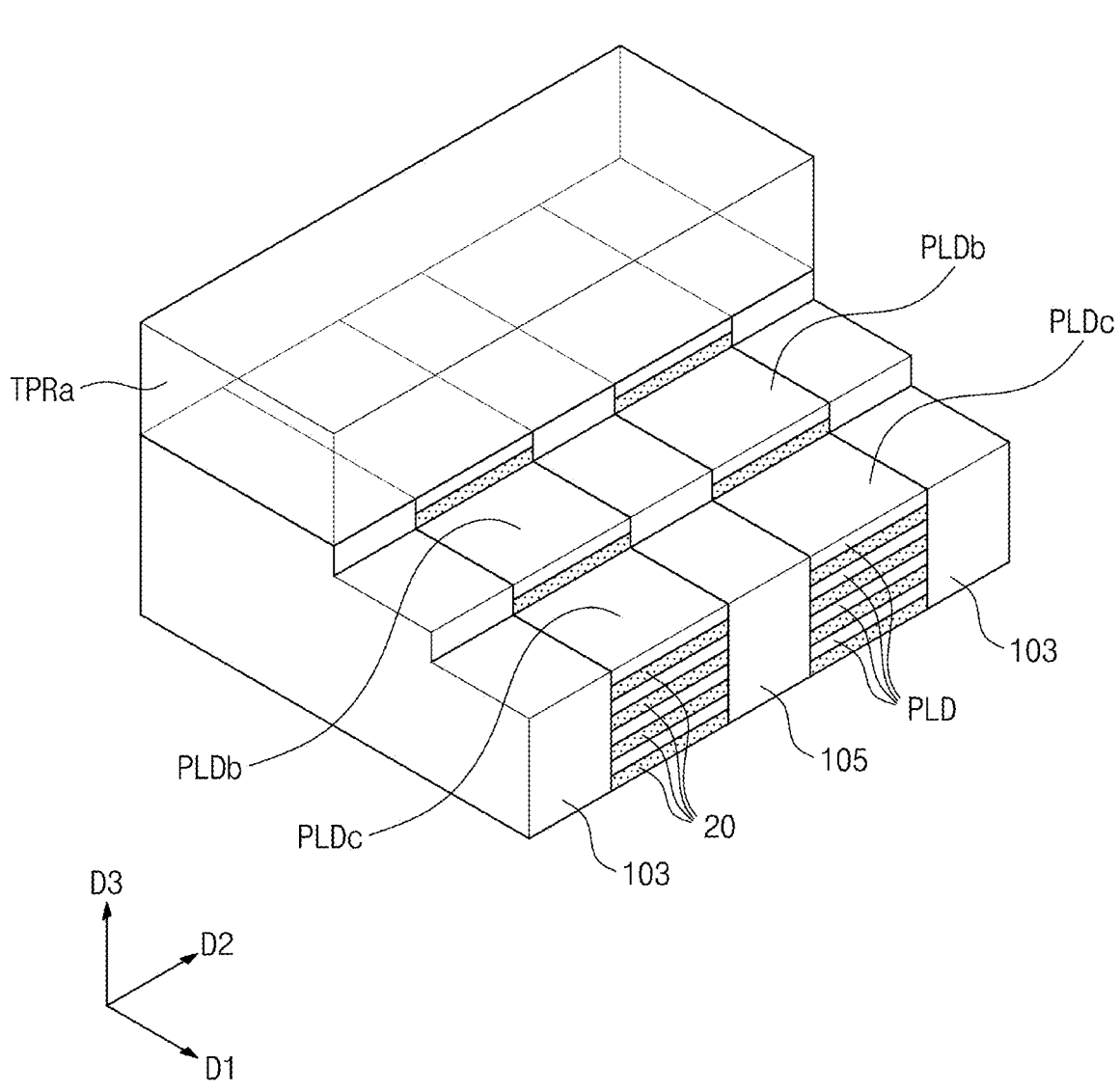

Referring to FIG. 22F, the second semiconductor layer 20 may be etched by a second etching process using the pad mask pattern TPRa, on which the first trimming process was performed, as an etch mask. A second stair may be formed by the first and second etching processes that are performed using the pad mask pattern TPRa formed by the first trimming process.

Figure 17A:
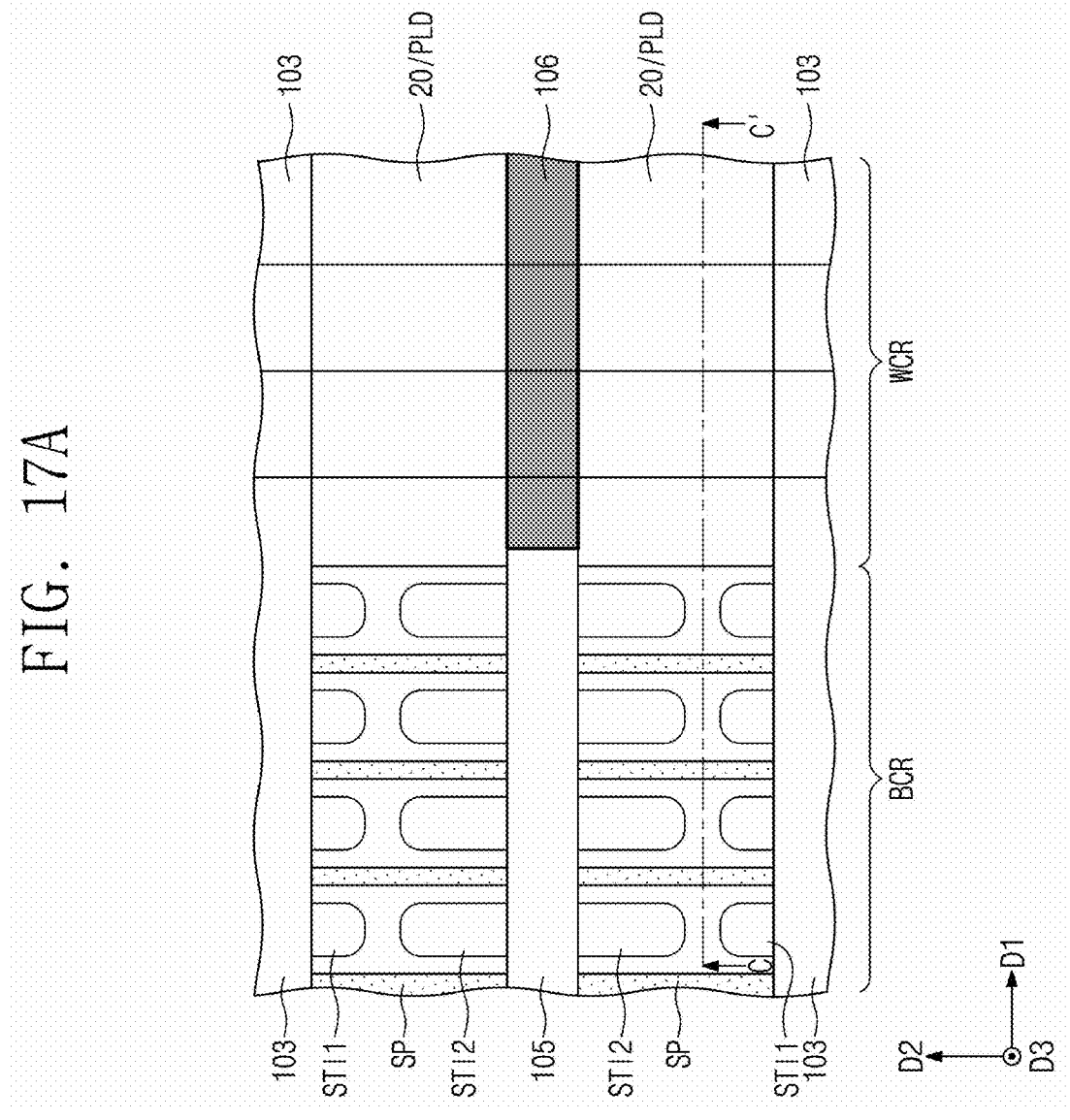
Figure 17B:
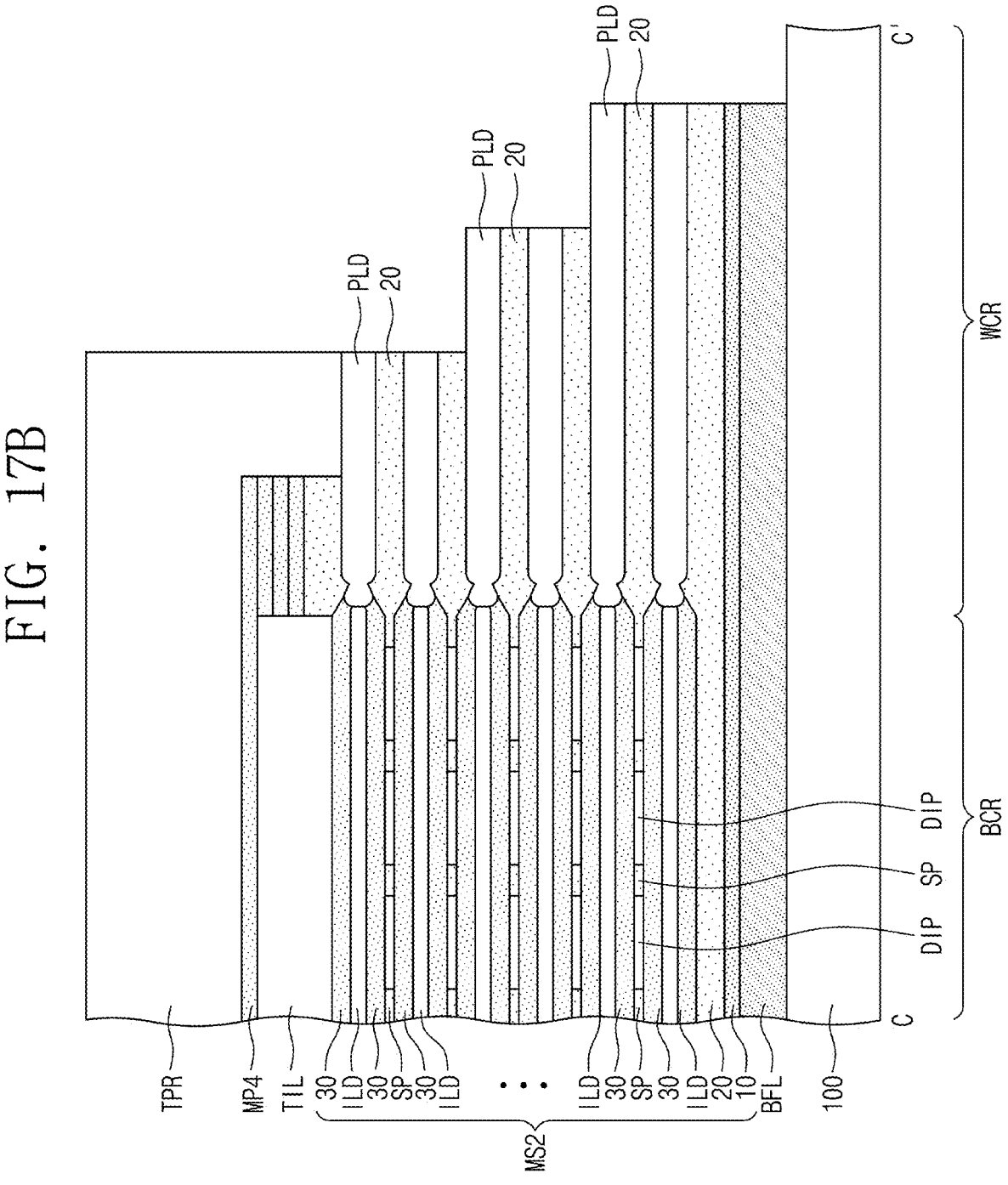

Thereafter, the mask trimming process, the first etching process, and the second etching process may be sequentially repeated, and thus, the third mold structure MS3 having a staircase structure may be formed in the second region WCR, as previously described with reference to FIGS. 17A, 17B, and 17C.

FIGS. 23A and 23B are perspective views illustrating a structure, which is formed by a pad trimming process according to an embodiment of the inventive concept.

Referring to FIG. 23A, after the first etching process of etching a pad insulating layer and first and second preliminary line patterns 103 and 105 using a pad mask pattern, a top surface of a second semiconductor layer 20, which is exposed in each stair, may be located at a level of top surfaces of the first and second preliminary line patterns 103 and 105. That is, as shown in FIG. 23A, the top surfaces of the first and second preliminary line patterns 103 and 105 may be located at a level higher than the top surface of the second semiconductor layer 20. After the first etching process in the pad trimming process, the first and second preliminary line patterns 103 and 105 may have rounded (e.g., upward convex) top surfaces.

In addition, referring to FIG. 23B, widths of the first and second preliminary line patterns 103 and 105 in each stair may decrease as a level of the stair decreases, after the mask trimming process, the first etching process, and the second etching process are sequentially repeated on the first and second preliminary line patterns 103 and 105.

As an example, a first portion of the first and second preliminary line patterns 103 and 105 in the first stair may have a first width W1, and a second portion of the first and second preliminary line patterns 103 and 105 in the second stair may have a second width W2 smaller than the first width W1.

Figure 24B:
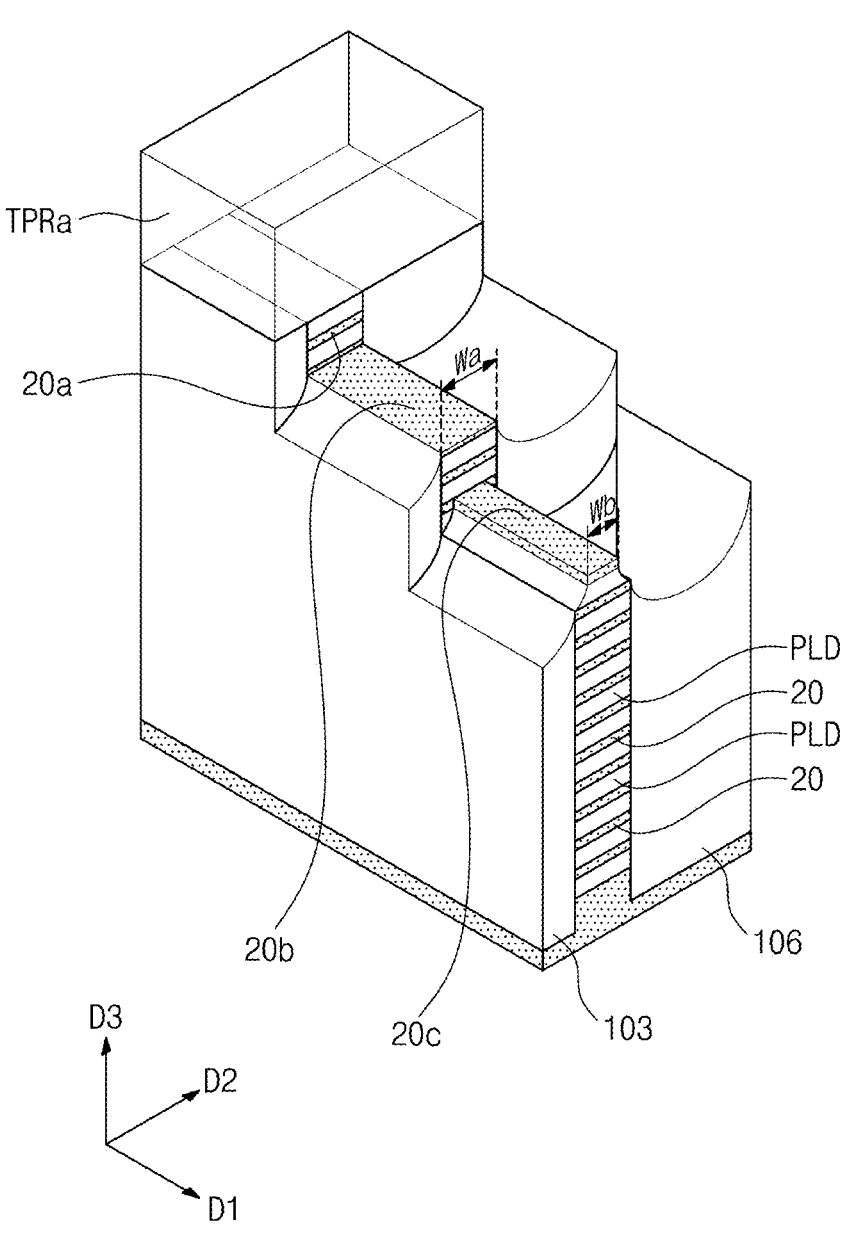

FIGS. 24A and 24B are perspective views illustrating a structure, which is formed by a pad trimming process according to an embodiment of the inventive concept.

Referring to FIG. 24A, after the first etching process of etching a pad insulating layer and first and second preliminary line patterns 103 and 105 using a mask pattern, top surfaces of the first and second preliminary line patterns 103 and 105 may be located at a level lower than a top surface of the second semiconductor layer 20. After the first etching process in the pad trimming process, each of the first and second preliminary line patterns may have a top surface, which has a downwardly-convex and rounded shape.

In addition, as shown in FIG. 24B, a width of the second semiconductor layer 20 in the first stair may have a first width Wa, and a width of the second semiconductor layer 20 in the second stair may have a second width Wb smaller than the first width Wa. That is, as a level of each stair is lowered, a width of the second semiconductor layer 20 therein may be decreased.

FIGS. 25A to 25G are perspective views illustrating various structures of word line pads, which are disposed in a cell array structure according to an embodiment of the inventive concept.

Figure 25A:
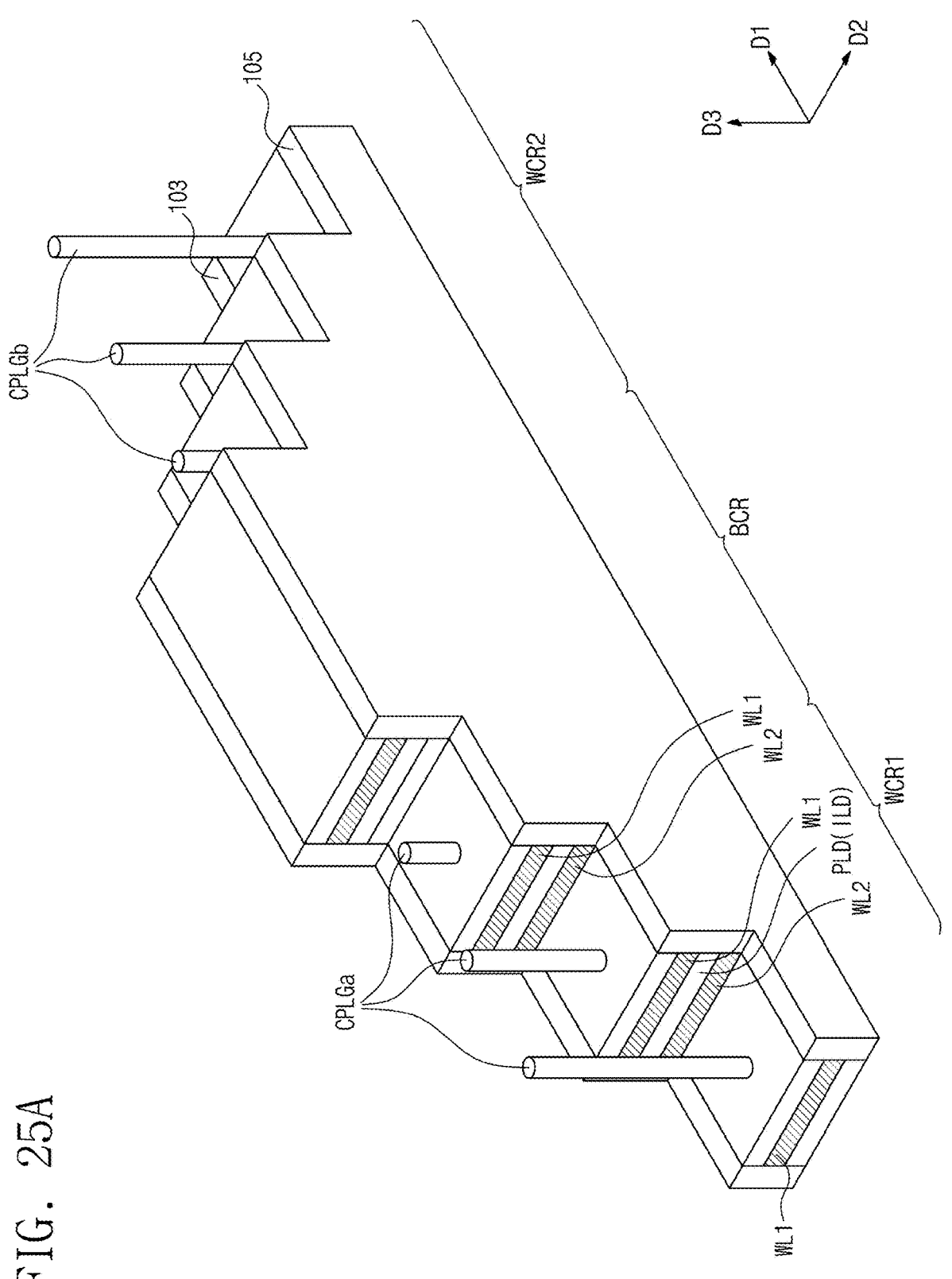
Figure 25B:
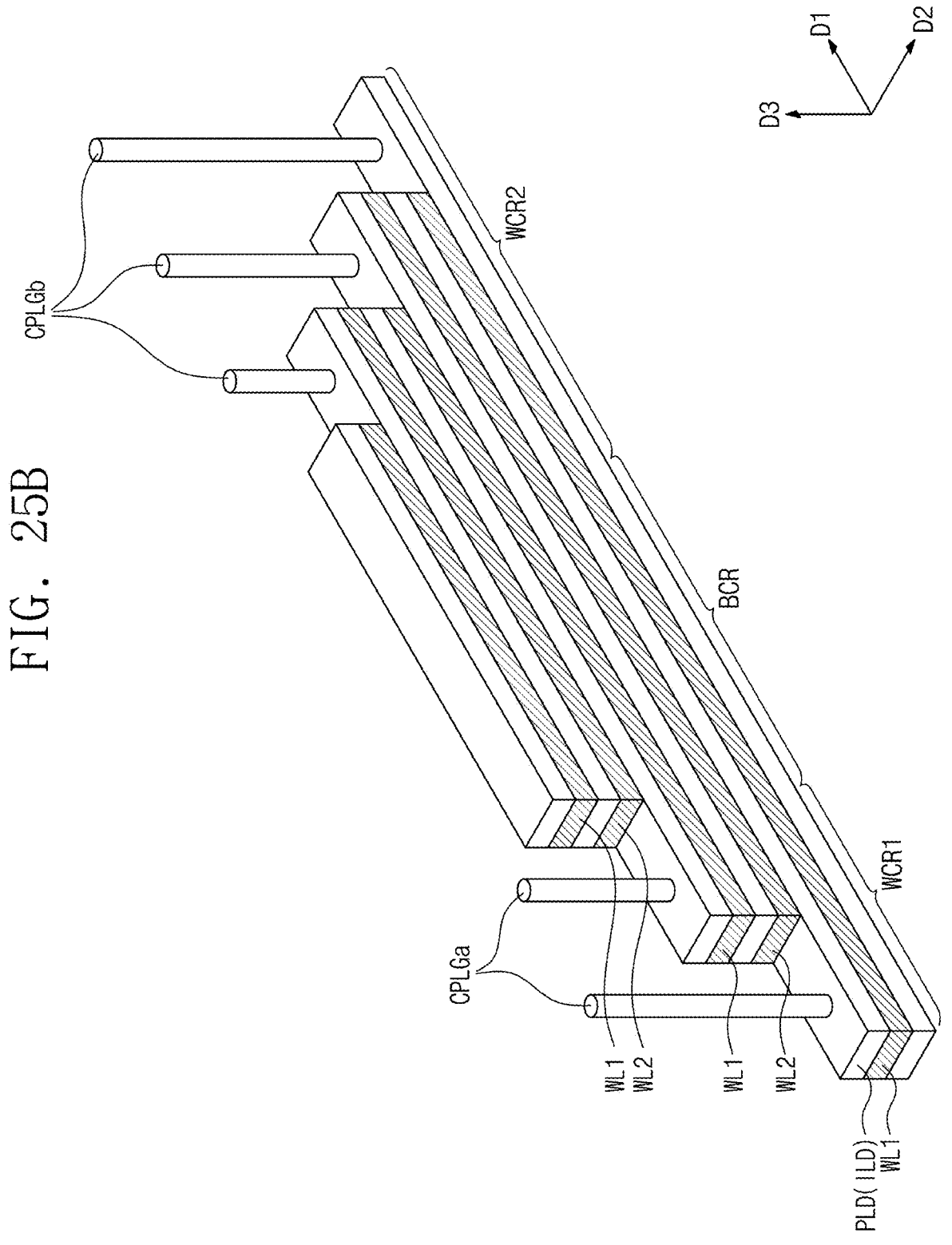

Referring to FIGS. 25A and 25B, the stack may be disposed on a substrate, which includes the first and second regions BCR and WCR. The second region WCR may include a first connection region WCR1 and a second connection region WCR2, which are respectively located at opposite sides of the first region BCR.

The stack may include the interlayer insulating patterns ILD and word lines WL1 and WL2, which are alternately stacked, as previously described with reference to FIGS. 4, 5A, and 5B. In addition, each of the word lines WL1 and WL2 may include the word line pad PAD, which is provided in the second region WCR and is connected to a cell contact plug CPLGa or CPLGb.

The word lines WL1 and WL2 may be formed to have a decreasing length as a distance from a substrate increases. Furthermore, when viewed in a plan view, one of the word lines WL1 and WL2 may be overlapped with another therebelow.

The word lines WL1 and WL2 may be stacked to form a staircase structure in the first and second connection regions WCR1 and WCR2. That is, the word line pads PAD may be provided to form a staircase structure in each of the first and second connection regions WCR1 and WCR2.

In an embodiment, the word lines WL1 and WL2 may include the first and second word lines WL1 and WL2, which are alternatingly stacked on a substrate. In other words, the first word lines WL1 may be odd-numbered word lines, and the second word lines WL2 may be even-numbered word lines.

A vertically-adjacent pair of the first and second word lines WL1 and WL2 may have side surfaces, which are vertically aligned to each other, in each of the first and second regions BCR and WCR. Referring to FIG. 25B, the word line pads PAD of the first word lines WL1 may be exposed to the outside in the first connection region WCR1, and the word line pads PAD of the second word lines WL2 may be exposed to the outside in the second connection region WCR2.

The first cell contact plugs CPLGa may be coupled to the word line pads PAD of the first word lines WL1, respectively, in the first connection region WCR1, and the second cell contact plugs CPLGb may be coupled to the word line pads PAD of the second word lines WL2, respectively, in the second connection region WCR2.

Figure 25C:
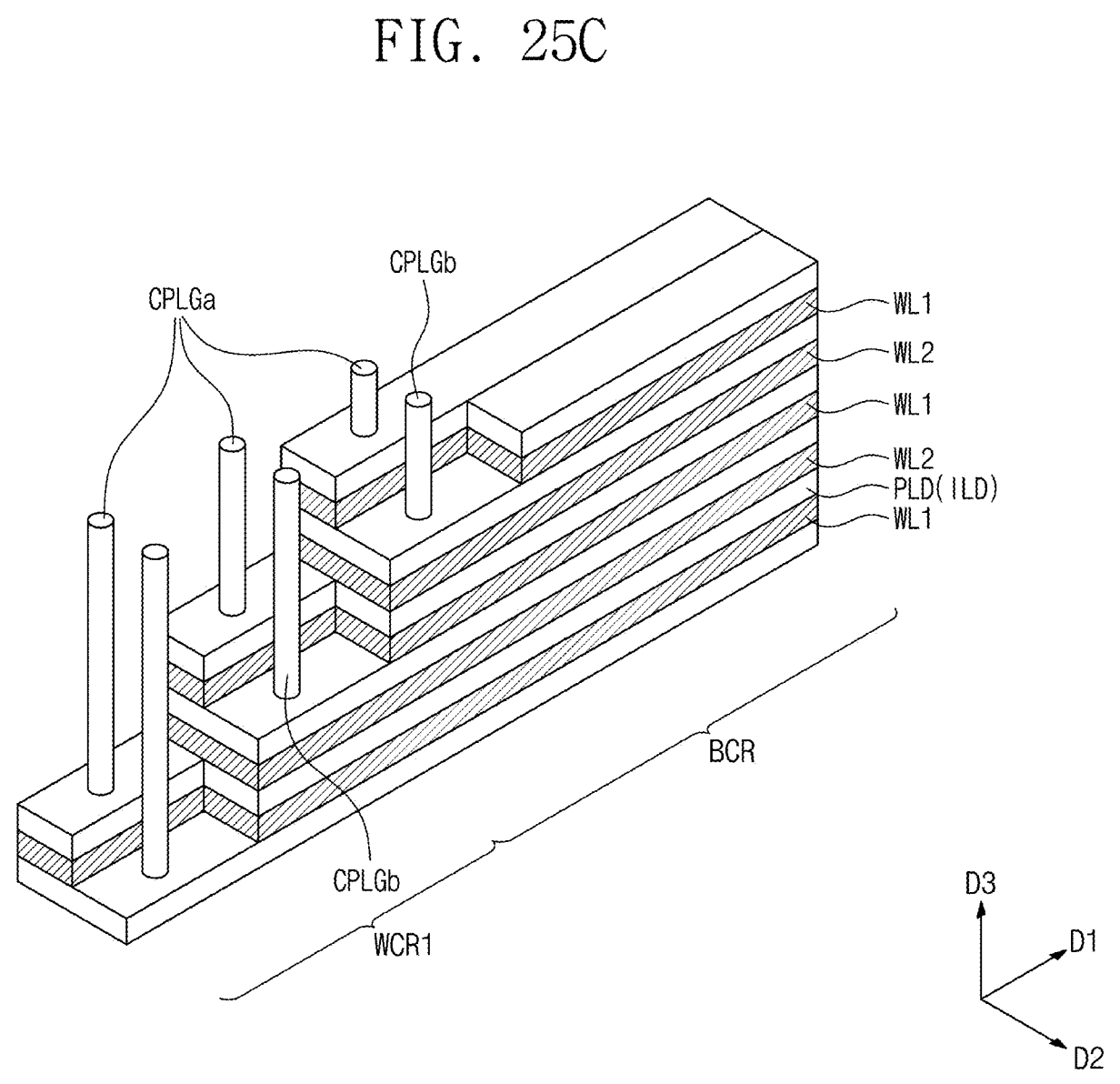

In the embodiment shown in FIG. 25C, a stack may be provided to include the first and second word lines WL1 and WL2 which are alternately stacked, as described above. The word line pads PAD of both of the first and second word lines WL1 and WL2 in the stack may be exposed in the first region BCR. Here, the word line pads PAD of the first word lines WL1 may be located at different levels from the word line pads PAD of the second word lines WL2. In addition, the word line pads PAD of the first word lines WL1 may be disposed in a first direction, and the word line pads PAD of the second word lines WL2 may be disposed to be adjacent to the word line pads PAD of the first word lines WL1 in a second direction. Accordingly, the first and second cell contact plugs may be provided on the second region WCR and may be coupled to the word line pads PAD of the first and second word lines WL1 and WL2.

Figure 25D:
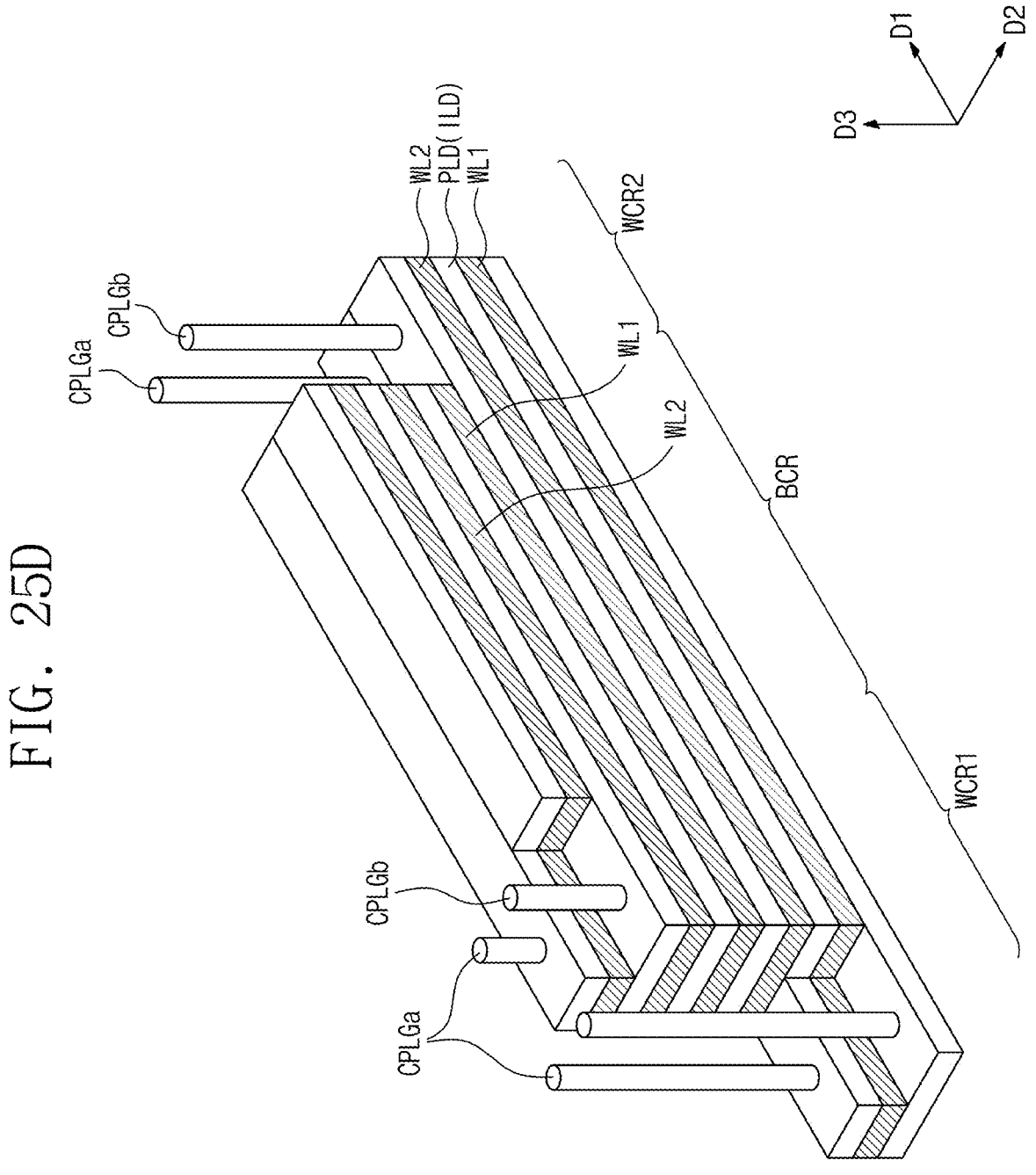

Referring to FIG. 25D, the word line pads PAD of the first and second word lines WL1 and WL2 may be dividedly disposed in two different connection regions (e.g., the first and second connection regions WCR1 and WCR2). In an embodiment, the word line pads PAD of some of the first word lines WL1 may be disposed in the first connection region WCR1, and the word line pads PAD of the remaining ones of the first word lines WL1 may be disposed in the second connection region WCR2.

The word line pads PAD of some of the second word lines WL2 may be disposed in the first connection region WCR1, and the word line pads PAD of the remaining ones of the second word lines WL2 may be disposed in the second connection region WCR2. Furthermore, in each of the first and second connection regions WCR1 and WCR2, the word line pads PAD of the first and second word lines WL1 and WL2 may be disposed to be adjacent to each other in the second direction D2.

Figure 25E:
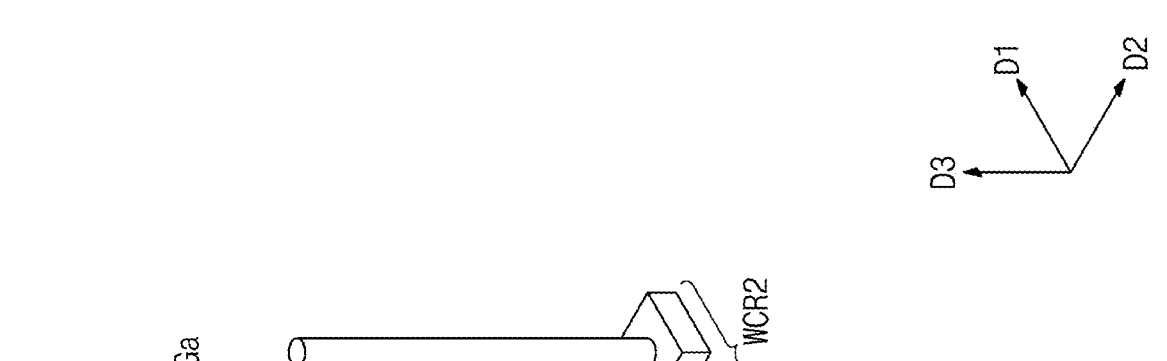

Referring to FIG. 25E, the stack may include a first portion, which is extended from the first region BCR in the first direction D1, and a second portion, which is extended from the first and second connection regions WCR1 and WCR2 in the second direction D2 and has a staircase structure.

In each of the first and second connection regions WCR1 and WCR2, the word line pads PAD of the first and second word lines WL1 and WL2 may be connected to first and second cell plugs, respectively.

Figure 25F:
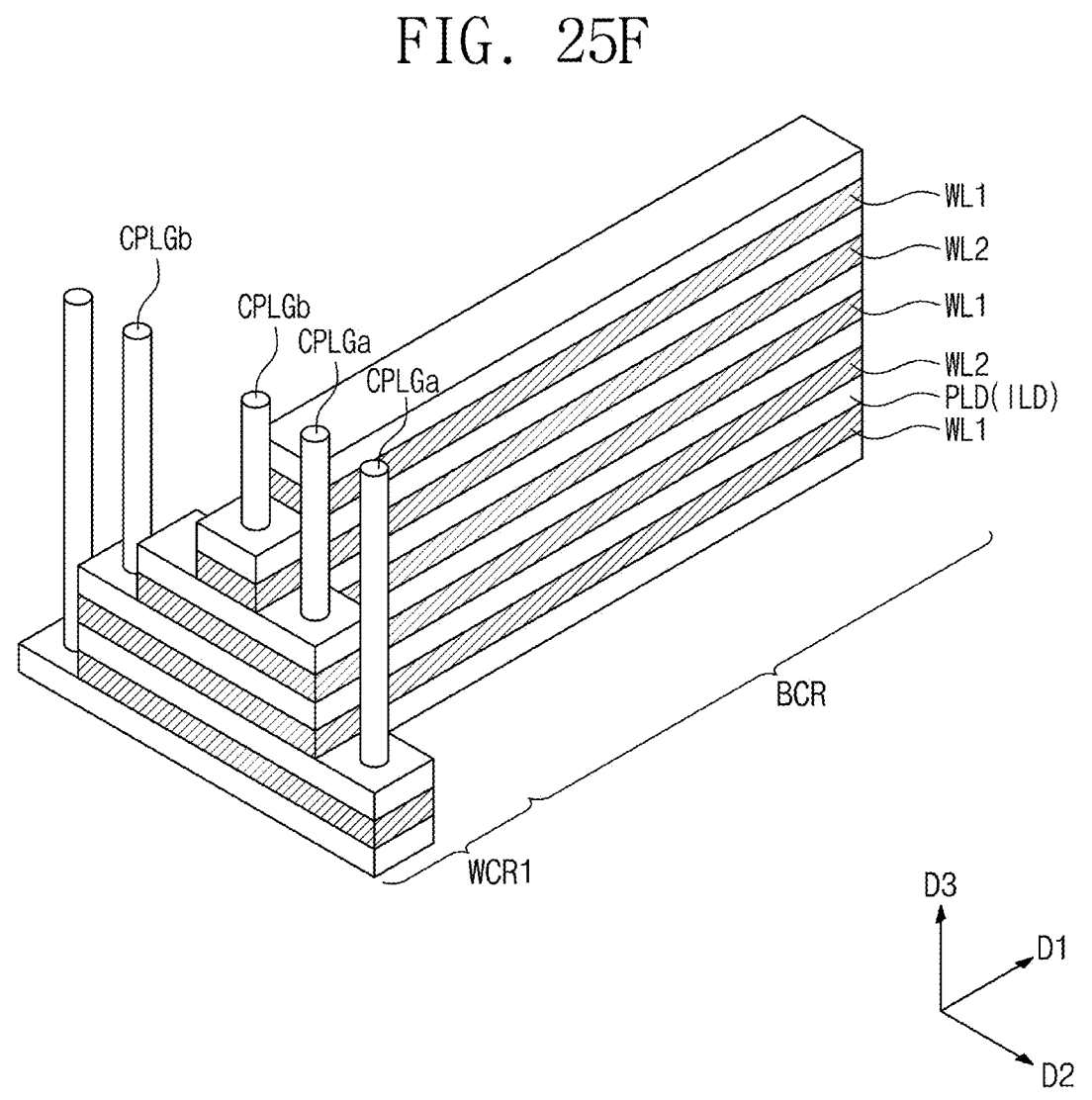

Referring to FIG. 25F, the stack may have the shape of letter 'T', when viewed in a plan view. In detail, the stack may include a first portion, which is extended from the first connection region WCR1 in the first direction D1, and a second portion, which is extended from the first and second connection regions WCR1 and WCR2 in the second direction D2 and has a staircase structure. Here, the second portion may be provided to have the staircase structure in the second direction D2 and an opposite direction thereof. In the second connection region WCR2, the word line pads PAD of the first and second word lines WL1 and WL2 may be dividedly arranged in the two opposite directions.

Figure 25G:
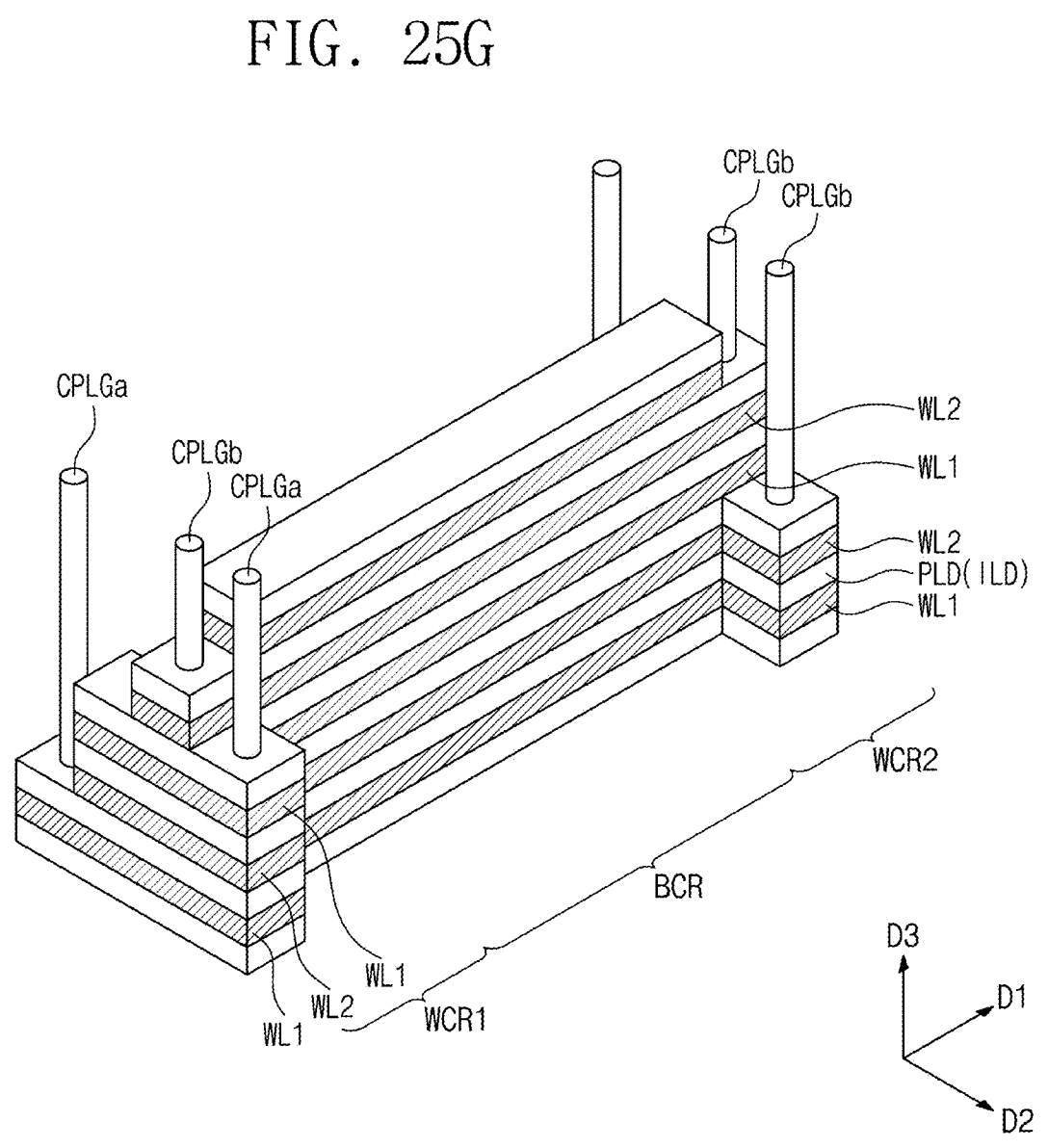

Referring to FIG. 25G, the stack may have the shape of capital letter 'I', when viewed in a plan view. The stack may include a first portion, which is extended from the first connection region WCR1 in the first direction D1, a second portion, which is extended from the first connection region WCR1 in the second direction D2, and a third portion, which is extended from the second connection region WCR2 in the second direction D2.

According to an embodiment of the inventive concept, bonding pads of a first substrate provided with memory cells may be bonded to bonding pads of a second substrate provided with peripheral circuits to connect a cell array structure to a peripheral circuit structure. Accordingly, an integration density of a semiconductor memory device may be increased. Furthermore, since pads of word lines in the cell array structure are stacked in a staircase shape, it may be possible to simplify an interconnection structure of connecting the word lines to the peripheral circuit structure.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
a lower layer including a first region and a second region, the lower layer extending in a first direction and a second direction perpendicular to the first direction, each of the first and second directions being parallel to a top surface of the lower layer; and
a stack including word lines and interlayer insulating patterns, which are alternatingly stacked in a third direction perpendicular to the top surface of the lower layer, the stack having a staircase structure on the second region,
wherein the word lines extend lengthwise from the first region to the second region in the first direction, and
wherein each of the word lines comprises sub-gate electrodes, which are stacked in the third direction and extend parallel to each other in the first region, and a word line pad, which is connected in common to the sub-gate electrodes in the second region.

2. The semiconductor memory device of claim 1, wherein, in each of the word lines, a thickness of the word line pad in the third direction is larger than a thickness of each of the sub-gate electrodes in the third direction.

3. The semiconductor memory device of claim 1, further comprising a gate insulating layer disposed between the interlayer insulating patterns and the sub-gate electrodes.

4. The semiconductor memory device of claim 1, further comprising:
line insulating patterns, which are disposed at both sides of the stack and extend lengthwise in the first direction to be parallel to the stack,
wherein each of the line insulating patterns has a staircase structure on the second region.

5. The semiconductor memory device of claim 4, wherein each of the line insulating patterns has a decreasing width in the second direction, as a distance from the first region increases.

6. The semiconductor memory device of claim 1, wherein the word line pads have widths in the second direction that decrease as a distance from the first region increases.

7. The semiconductor memory device of claim 1, further comprising:
channel patterns disposed between the sub-gate electrodes of each of the word lines and spaced apart from each other in the first direction;
bit lines, which extend in the third direction to cross the word lines in the first region and are connected to first end portions of the channel patterns; and
data storage elements connected to second end portions of the channel patterns.

8. The semiconductor memory device of claim 7, wherein, in each of the word lines, the word line pad comprises a protruding portion that protrudes into a region between the sub-gate electrodes.

9. A semiconductor memory device, comprising:
a lower layer including a first region and a second region, the lower layer extending in a first direction and a second direction perpendicular to the first direction, each of the first and second directions being parallel to a top surface of the lower layer;
a stack including word lines and interlayer insulating patterns, which are alternatingly stacked in a third direction perpendicular to the top surface of the lower layer, each of the word lines having a word line pad in the second region, and the stack having a staircase structure in the second region;
channel patterns provided to cross the word lines and stacked in the third direction;
a bit line extending lengthwise in the third direction to cross the word lines, in the first region, the bit line connected to first end portions of the channel patterns;
data storage elements provided in the first region and connected to second end portions of the channel patterns; and
cell contact plugs provided in the second region and respectively coupled to the word line pads,
wherein a thickness, in the third direction, of each of the word lines in the first region is different from a thickness of the each of the word lines in the second region.

10. The semiconductor memory device of claim 9, further comprising a gate insulating layer, which is disposed in the first region and between the interlayer insulating patterns and the word lines and between the channel patterns and the word lines.

11. The semiconductor memory device of claim 10, wherein, in the second region, each of the word line pads has a top surface and a bottom surface, which are in contact with the interlayer insulating patterns.

12. The semiconductor memory device of claim 9,
wherein the word lines comprise first and second word lines, which are alternately disposed in the third direction, and
wherein in the second region, the word line pads of the first word lines have side surfaces which are aligned to side surfaces of the second word lines therebelow.

13. The semiconductor memory device of claim 9, further comprising:
line insulating patterns, which are disposed at both sides of the stack and extend lengthwise in the first direction to be parallel to the stack,
wherein the line insulating patterns are provided to have the same staircase structure as the stack, in the second region.

14. A semiconductor memory device, comprising:
a cell array structure including a memory cell array and first bonding pads connected to the memory cell array, the memory cell array including memory cells, which are three-dimensionally arranged; and
a peripheral circuit structure including peripheral circuits and second bonding pads, which are connected to the peripheral circuits and are bonded to the first bonding pads,
wherein the cell array structure comprises:
a lower layer including a first region and a second region, the lower layer extending in a first direction and a second direction perpendicular to the first direction, each of the first and second directions being parallel to a top surface of the lower layer;

a stack including word lines and interlayer insulating layers, which are alternately stacked in a third direction perpendicular to the top surface of the lower layer, each of the word lines comprising sub-gate electrodes, which are stacked in the third direction and extend parallel to each other in the first region, and a word line pad, which is connected in common to the sub-gate electrodes in the second region, and the stack having a staircase structure in the second region;

bit lines extending lengthwise along the third direction to cross the word lines; and cell contact plugs provided on the second region and respectively coupled to the word line pads, the cell contact plugs connected to the first bonding pads.

15. The semiconductor memory device of claim 14, wherein the word lines extend lengthwise from the first region to the second region in the first direction, and wherein, in each of the word lines, a thickness of the word line pad in the third direction is larger than a thickness of each of the sub-gate electrodes in the third direction.

16. The semiconductor memory device of claim 14, further comprising:

channel patterns, which are provided in the first region and are stacked in the third direction; and data storage elements connected to first end portions of the channel patterns.

17. The semiconductor memory device of claim 16, further comprising a gate insulating layer disposed between the sub-gate electrodes and the channel patterns.

18. The semiconductor memory device of claim 14, wherein each of the word line pads comprises a protruding portion, which is disposed between the sub-gate electrodes.

19. The semiconductor memory device of claim 14, further comprising:

line insulating patterns, which are disposed at both sides of the stack and extend lengthwise in the first direction parallel to the stack, wherein the line insulating patterns have substantially the same staircase structure as the stack, in the second region.

* * * * *